United States Patent
Robinson et al.

(10) Patent No.: US 10,303,030 B2
(45) Date of Patent: *May 28, 2019

(54) REFLECTIVE OPTICAL STACK FOR PRIVACY DISPLAY

(71) Applicant: RealD Spark, LLC, Beverly Hills, CA (US)

(72) Inventors: Michael G. Robinson, Boulder, CO (US); Graham J. Woodgate, Henley-on-Thames (GB); Jonathan Harrold, Leamington Spa (GB); Robert A. Ramsey, Boulder, CO (US)

(73) Assignee: RealD Spark, LLC, Beverly Hills, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/038,698

(22) Filed: Jul. 18, 2018

(65) Prior Publication Data
US 2018/0329245 A1 Nov. 15, 2018

Related U.S. Application Data

(63) Continuation-in-part of application No. 15/971,969, filed on May 4, 2018.
(Continued)

(51) Int. Cl.
*F21V 8/00* (2006.01)
*G02F 1/13* (2006.01)
(Continued)

(52) U.S. Cl.
CPC ......... *G02F 1/1393* (2013.01); *G02B 6/0068* (2013.01); *G02F 1/1323* (2013.01);
(Continued)

(58) Field of Classification Search
CPC ............ G02F 1/1393; G02F 1/13306; G02F 1/134309; G02F 1/13363; G02F 1/133536;
(Continued)

(56) References Cited

U.S. PATENT DOCUMENTS 4,914,553 A 4/1990 Hamada et al.
5,528,720 A 6/1996 Winston et al.
(Continued)

FOREIGN PATENT DOCUMENTS

CN 1910399 A 2/2007
CN 2872404 2/2007
(Continued)

OTHER PUBLICATIONS

Weindorf et al., "Active Circular Polarizer OLED E-Mirror", Proceedings of the Society for Information Display 25th Annual Symposium on Vehicle Displays, Livonia, MI, pp. 225-237, Sep. 25-26, 2018.
(Continued)

*Primary Examiner* — Shan Liu
(74) *Attorney, Agent, or Firm* — Penny L. Lowry; Neil G. Mothew

(57) ABSTRACT

A privacy display comprises a polarized output spatial light modulator, reflective polarizer, switchable liquid crystal retarder and polarizer. In a privacy mode of operation, on-axis light from the spatial light modulator is directed without loss, whereas off-axis light has reduced luminance. Further, display reflectivity is reduced for on-axis reflections of ambient light, while reflectivity is increased for off-axis light. The visibility of the display to off-axis snoopers is reduced by means of luminance reduction and increased frontal reflectivity to ambient light. In a wide angle mode of
(Continued)

operation, the liquid crystal retardance is adjusted so that off-axis luminance and reflectivity are unmodified.

24 Claims, 65 Drawing Sheets

Related U.S. Application Data

(60) Provisional application No. 62/502,939, filed on May 8, 2017, provisional application No. 62/559,187, filed on Sep. 15, 2017, provisional application No. 62/565,836, filed on Sep. 29, 2017, provisional application No. 62/582,052, filed on Nov. 6, 2017, provisional application No. 62/592,085, filed on Nov. 29, 2017, provisional application No. 62/544,189, filed on Aug. 11, 2017, provisional application No. 62/582,030, filed on Nov. 6, 2017, provisional application No. 62/634,168, filed on Feb. 22, 2018, provisional application No. 62/641,657, filed on Mar. 12, 2018, provisional application No. 62/622,001, filed on Jan. 25, 2018, provisional application No. 62/646,550, filed on Mar. 22, 2018, provisional application No. 62/673,359, filed on May 18, 2018, provisional application No. 62/673,576, filed on May 18, 2018.

(51) Int. Cl.
  *G02F 1/133* (2006.01)
  *G02F 1/137* (2006.01)
  *G02F 1/139* (2006.01)
  *H01L 27/32* (2006.01)
  *G02F 1/1335* (2006.01)
  *G02F 1/1337* (2006.01)
  *G02F 1/1343* (2006.01)
  *G02F 1/13363* (2006.01)

(52) U.S. Cl.
  CPC ........ *G02F 1/1337* (2013.01); *G02F 1/13306* (2013.01); *G02F 1/13363* (2013.01); *G02F 1/133528* (2013.01); *G02F 1/133536* (2013.01); *G02F 1/134309* (2013.01); *G02F 2001/13706* (2013.01); *G02F 2001/133531* (2013.01); *G02F 2001/133738* (2013.01); *G02F 2203/05* (2013.01); *H01L 27/3232* (2013.01)

(58) Field of Classification Search
  CPC ............. G02F 1/1337; G02F 1/133528; G02F 2001/133531; G02F 2203/05; G02F 2001/13706; G02F 2001/133738; G02F 1/1323; G02F 1/133634; G02F 1/1343; G02F 1/133602; G02F 2001/133635; G02B 6/0068; G02B 6/122; G02B 27/30; G02B 6/0051; G02B 6/0055; G02B 6/0048; G02B 3/005; G02B 6/0076; G02B 6/005; G02B 6/0056; G02B 6/0036; H01L 27/3232; B60K 35/00; B60K 2350/921; B60K 2350/2039
  See application file for complete search history.

(56) References Cited

U.S. PATENT DOCUMENTS

| | | | |
|---|---|---|---|
| 5,727,107 A | 3/1998 | Umemoto et al. |
| 5,959,664 A | 9/1999 | Woodgate |
| 5,971,559 A | 10/1999 | Ishikawa et al. |
| 6,014,164 A | 1/2000 | Woodgate et al. |
| 6,061,489 A | 5/2000 | Ezra et al. |
| 6,075,557 A | 6/2000 | Holliman et al. |
| 6,108,059 A | 8/2000 | Yang |
| 6,199,995 B1 | 3/2001 | Umemoto et al. |
| 6,232,592 B1 | 5/2001 | Sugiyama |
| 6,305,813 B1 | 10/2001 | Lekson et al. |
| 6,335,999 B1 | 1/2002 | Winston et al. |
| 6,422,713 B1 | 7/2002 | Fohl et al. |
| 6,464,365 B1 | 10/2002 | Gunn et al. |
| 6,663,254 B2 | 12/2003 | Ohsumi |
| 6,731,355 B2 | 5/2004 | Miyashita |
| 6,847,488 B2 | 1/2005 | Travis |
| 6,870,671 B2 | 3/2005 | Travis |
| 6,883,919 B2 | 4/2005 | Travis |
| 7,052,168 B2 | 5/2006 | Epstein et al. |
| 7,058,252 B2 | 6/2006 | Woodgate et al. |
| 7,073,933 B2 | 7/2006 | Gotoh et al. |
| 7,101,048 B2 | 9/2006 | Travis |
| 7,215,415 B2 | 5/2007 | Maehara et al. |
| 7,410,286 B2 | 8/2008 | Travis |
| 7,430,358 B2 | 9/2008 | Qi et al. |
| 7,528,893 B2 | 5/2009 | Schultz et al. |
| 7,545,429 B2 | 6/2009 | Travis |
| 7,587,117 B2 | 9/2009 | Winston et al. |
| 7,614,777 B2 | 11/2009 | Koganezawa et al. |
| 7,660,047 B1 | 2/2010 | Travis et al. |
| 7,750,981 B2 | 7/2010 | Shestak et al. |
| 7,750,982 B2 | 7/2010 | Nelson et al. |
| 7,944,428 B2 | 5/2011 | Travis |
| 7,970,246 B2 | 6/2011 | Travis et al. |
| 7,976,208 B2 | 7/2011 | Travis |
| 8,016,475 B2 | 9/2011 | Travis |
| 8,216,405 B2 | 7/2012 | Emerton et al. |
| 8,325,295 B2 | 12/2012 | Sugita et al. |
| 8,354,806 B2 | 1/2013 | Travis et al. |
| 8,477,261 B2 | 7/2013 | Travis et al. |
| 8,534,901 B2 | 9/2013 | Panagotacos et al. |
| 8,714,804 B2 | 5/2014 | Kim et al. |
| 9,519,153 B2 | 12/2016 | Robinson et al. |
| 10,126,575 B1* | 11/2018 | Robinson .......... G02F 1/133634 |
| 2003/0137738 A1 | 7/2003 | Ozawa et al. |
| 2004/0042233 A1 | 3/2004 | Suzuki et al. |
| 2004/0100598 A1* | 5/2004 | Adachi ............ G02F 1/133536 349/113 |
| 2004/0109303 A1 | 6/2004 | Olczak |
| 2004/0170011 A1 | 9/2004 | Kim et al. |
| 2005/0135116 A1 | 6/2005 | Epstein et al. |
| 2005/0180167 A1 | 8/2005 | Hoelen et al. |
| 2005/0190345 A1 | 9/2005 | Dubin et al. |
| 2005/0237488 A1 | 10/2005 | Yamasaki et al. |
| 2005/0264717 A1 | 12/2005 | Chien et al. |
| 2005/0276071 A1 | 12/2005 | Sasagawa et al. |
| 2006/0139447 A1 | 6/2006 | Unkrich |
| 2006/0221642 A1 | 10/2006 | Daiku |
| 2006/0269213 A1 | 11/2006 | Hwang et al. |
| 2006/0285040 A1* | 12/2006 | Kobayashi ............ G02F 1/1323 349/117 |
| 2006/0291053 A1 | 12/2006 | Robinson et al. |
| 2006/0291243 A1 | 12/2006 | Niioka et al. |
| 2007/0025680 A1 | 2/2007 | Winston et al. |
| 2007/0035964 A1 | 2/2007 | Olczak |
| 2007/0115551 A1 | 5/2007 | Spilman et al. |
| 2007/0115552 A1 | 5/2007 | Robinson et al. |
| 2007/0188667 A1 | 8/2007 | Schwerdtner |
| 2007/0223252 A1 | 9/2007 | Lee et al. |
| 2008/0084519 A1 | 4/2008 | Brigham et al. |
| 2008/0086289 A1 | 4/2008 | Brott |
| 2008/0225205 A1 | 9/2008 | Travis |
| 2008/0297459 A1 | 12/2008 | Sugimoto et al. |
| 2008/0304282 A1 | 12/2008 | Mi et al. |
| 2008/0316198 A1* | 12/2008 | Fukushima ....... G02F 1/133536 345/214 |
| 2008/0316768 A1 | 12/2008 | Travis |
| 2009/0016057 A1 | 1/2009 | Rinko |
| 2009/0067156 A1 | 3/2009 | Bonnett et al. |
| 2009/0140656 A1 | 6/2009 | Kohashikawa et al. |
| 2009/0160757 A1 | 6/2009 | Robinson |
| 2009/0225380 A1 | 9/2009 | Schwerdtner et al. |

(56) References Cited

U.S. PATENT DOCUMENTS

| | | | |
|---|---|---|---|
| 2009/0244415 A1* | 10/2009 | Ide | G02F 1/1313 349/33 |
| 2009/0278936 A1 | 11/2009 | Pastoor et al. | |
| 2010/0053771 A1 | 3/2010 | Travis et al. | |
| 2010/0091254 A1 | 4/2010 | Travis et al. | |
| 2010/0177387 A1 | 7/2010 | Travis et al. | |
| 2010/0188438 A1 | 7/2010 | Kang | |
| 2010/0188602 A1 | 7/2010 | Feng | |
| 2010/0214135 A1 | 8/2010 | Bathiche et al. | |
| 2010/0220260 A1 | 9/2010 | Sugita et al. | |
| 2010/0231498 A1 | 9/2010 | Large et al. | |
| 2010/0277575 A1 | 11/2010 | Ismael et al. | |
| 2010/0278480 A1 | 11/2010 | Vasylyev | |
| 2010/0300608 A1 | 12/2010 | Emerton et al. | |
| 2011/0032483 A1 | 2/2011 | Hruska et al. | |
| 2011/0043142 A1 | 2/2011 | Travis et al. | |
| 2011/0044056 A1 | 2/2011 | Travis et al. | |
| 2011/0187293 A1 | 8/2011 | Travis | |
| 2011/0188120 A1 | 8/2011 | Tabirian et al. | |
| 2011/0216266 A1 | 9/2011 | Travis | |
| 2011/0242298 A1 | 10/2011 | Bathiche et al. | |
| 2011/0255303 A1 | 10/2011 | Nichol et al. | |
| 2011/0285927 A1 | 11/2011 | Schultz et al. | |
| 2011/0310232 A1 | 12/2011 | Wilson et al. | |
| 2012/0002295 A1 | 1/2012 | Dobschal et al. | |
| 2012/0127573 A1 | 5/2012 | Robinson et al. | |
| 2012/0243204 A1 | 9/2012 | Robinson | |
| 2014/0286043 A1* | 9/2014 | Sykora | G02B 3/0062 362/607 |
| 2014/0340728 A1 | 11/2014 | Taheri | |
| 2016/0238869 A1 | 8/2016 | Osterman et al. | |
| 2016/0357046 A1 | 12/2016 | Choi et al. | |
| 2018/0052346 A1* | 2/2018 | Sakai | G02F 1/1347 |
| 2018/0113334 A1* | 4/2018 | Fang | G02F 1/13363 |

FOREIGN PATENT DOCUMENTS

| | | |
|---|---|---|
| CN | 101364004 A | 2/2009 |
| EP | 0830984 A2 | 3/1998 |
| EP | 0860729 A2 | 8/1998 |
| EP | 0939273 A1 | 9/1999 |
| EP | 2003394 A2 | 12/2008 |
| JP | H08211334 | 8/1996 |
| JP | H08254617 | 10/1996 |
| JP | H08340556 | 12/1996 |
| JP | 2000200049 A | 7/2000 |
| JP | 2001093321 A | 4/2001 |
| JP | 2002049004 A | 2/2002 |
| JP | 2003215349 A | 7/2003 |
| JP | 2003215705 A | 7/2003 |
| JP | 2004319364 A | 11/2004 |
| JP | 2005135844 A | 5/2005 |
| JP | 2005183030 A | 7/2005 |
| JP | 2005259361 A | 9/2005 |
| JP | 2006004877 A | 1/2006 |
| JP | 2006031941 A | 2/2006 |
| JP | 3968742 B2 | 8/2007 |
| JP | 2007273288 A | 10/2007 |
| JP | 2008204874 A | 9/2008 |
| JP | 2013540083 | 10/2013 |
| KR | 20030064258 | 7/2003 |
| KR | 20090932304 | 12/2009 |
| KR | 20110006773 A | 1/2011 |
| KR | 20110017918 A | 2/2011 |
| KR | 20110067534 A | 6/2011 |
| KR | 20120048301 A | 5/2012 |
| TW | M537663 U | 3/2017 |
| WO | 1999011074 A1 | 3/1999 |
| WO | 2001061241 A1 | 8/2001 |
| WO | 2011022342 A2 | 2/2011 |

OTHER PUBLICATIONS

AU-2011329639 Australia Patent Examination Report No. 1 dated Mar. 6, 2014.
AU-2015258258 Australian Office Action of Australian Patent Office dated Jun. 9, 2016.
CA-2817044 Canadian office action dated Jul. 14, 2016.
CN-201180065590.0 Office first action dated Dec. 31, 2014.
CN-201180065590.0 Office fourth action dated Jan. 4, 2017.
CN-201180065590.0 Office second action dated Oct. 21, 2015.
CN-201180065590.0 Office Third action dated Jun. 6, 2016.
CN-201480023023.2 Office first action dated Aug. 12, 2016.
EP-11842021.5 Office Action dated Dec. 17, 2014.
EP-11842021.5 Office Action dated Oct. 2, 2015.
EP-11842021.5 Office Action dated Sep. 2, 2016.
JP-2013540083 Notice of reasons for rejection dated Jun. 30, 2015.
JP-2013540083 Notice of reasons for rejection with translation dated Jun. 21, 2016.
Kalantar, et al. "Backlight Unit With Double Surface Light Emission," J. Soc. Inf. Display, vol. 12, Issue 4, pp. 379-387 (Dec. 2004).
PCT/US2011/061511 International Preliminary Report on Patentability dated May 21, 2013.
PCT/US2011/061511 International search report and written opinion of international searching authority dated Jun. 29, 2012.
PCT/US2012/037677 International search report and written opinion of international searching authority dated Jun. 29, 2012.
PCT/US2012/042279 International search report and written opinion of international searching authority dated Feb. 26, 2013.
PCT/US2012/052189 International search report and written opinion of the international searching authority dated Jan. 29, 2013.
PCT/US2013/041192 International search report and written opinion of international searching authority dated Aug. 28, 2013.
PCT/US2013/041228 International search report and written opinion of international searching authority dated Aug. 23, 2013.
PCT/US2013/041235 International search report and written opinion of international searching authority dated Aug. 23, 2013.
PCT/US2013/041548 International search report and written opinion of international searching authority dated Aug. 27, 2013.
PCT/US2013/041619 International search report and written opinion of international searching authority dated Aug. 27, 2013.
PCT/US2013/041655 International search report and written opinion of international searching authority dated Aug. 27, 2013.
PCT/US2013/041683 International search report and written opinion of international searching authority dated Aug. 27, 2013.
PCT/US2013/041697 International search report and written opinion of international searching authority dated Aug. 23, 2013.
PCT/US2013/041703 International search report and written opinion of international searching authority dated Aug. 27, 2013.
PCT/US2013/063125 International search report and written opinion of international searching authority dated Jan. 20, 2014.
PCT/US2013/063133 International search report and written opinion of international searching authority dated Jan. 20, 2014.
PCT/US2013/077288 International search report and written opinion of international searching authority dated Apr. 18, 2014.
PCT/US2014/017779 International search report and written opinion of international searching authority dated May 28, 2014.
RU-2013122560 First office action dated Jan. 22, 2014.
RU-2013122560 Second office action dated Apr. 10, 2015.
Tabiryan et al., "The Promise of Diffractive Waveplates," Optics and Photonics News, vol. 21, Issue 3, pp. 40-45 (Mar. 2010).
Travis, et al. "Backlight for view-sequential autostereo 3D", Microsoft E&DD Applied Sciences, (date unknown), 25 pages.
Gass, et al. "Privacy LCD Technology for Cellular Phones", Sharp Laboratories of Europe Ltd, Mobile LCD Group, Feb. 2007, pp. 45-49.

* cited by examiner

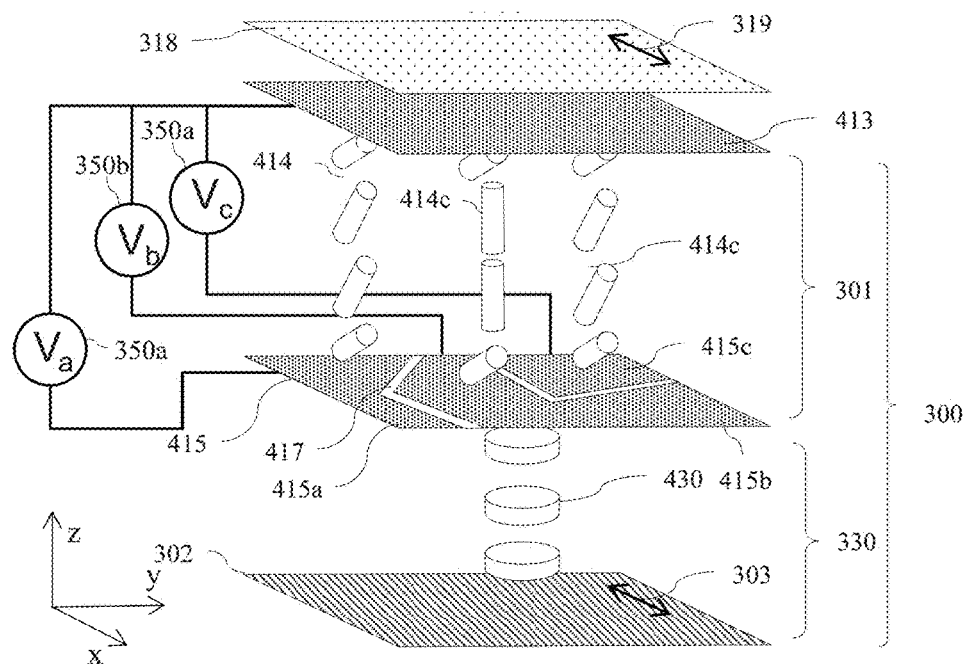
FIG. 26A
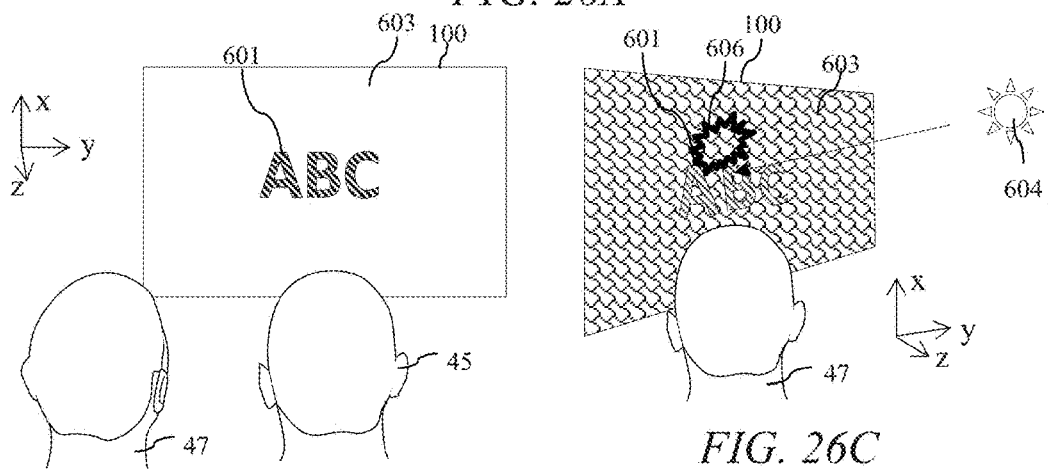
FIG. 26B
FIG. 26C
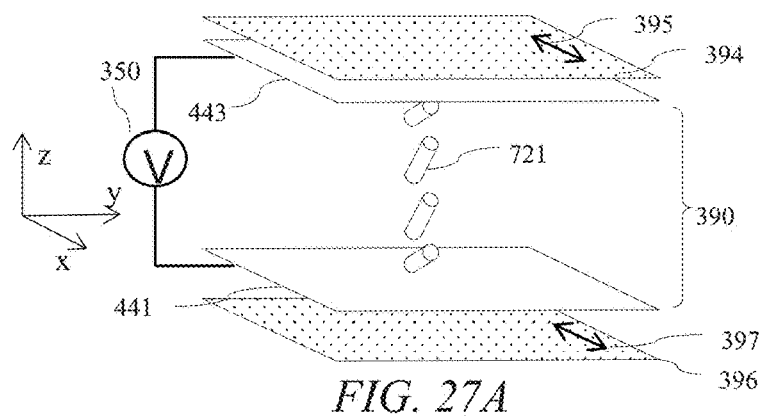
FIG. 27A

REFLECTIVE OPTICAL STACK FOR PRIVACY DISPLAY

TECHNICAL FIELD

This disclosure generally relates to illumination from light modulation devices, and more specifically relates to reflective optical stacks for use in a display including a privacy display.

BACKGROUND

Privacy displays provide image visibility to a primary user that is typically in an on-axis position and reduced visibility of image content to a snooper, that is typically in an off-axis position. A privacy function may be provided by micro-louvre optical films that transmit a high luminance from a display in an on-axis direction with low luminance in off-axis positions, however such films are not switchable, and thus the display is limited to privacy only function.

Switchable privacy displays may be provided by control of the off-axis optical output.

Control may be provided by means of luminance reduction, for example by means of switchable backlights for a liquid crystal display (LCD) spatial light modulator. Display backlights in general employ waveguides and light sources arranged along at least one input edge of the waveguide. Certain imaging directional backlights have the additional capability of directing the illumination through a display panel into viewing windows. An imaging system may be formed between multiple sources and the respective window images. One example of an imaging directional backlight is an optical valve that may employ a folded optical system and hence may also be an example of a folded imaging directional backlight. Light may propagate substantially without loss in one direction through the optical valve while counter-propagating light may be extracted by reflection off tilted facets as described in U.S. Pat. No. 9,519,153, which is herein incorporated by reference in its entirety.

Control of off-axis privacy may further be provided by means of contrast reduction, for example by adjusting the liquid crystal bias tilt in an In-Plane-Switching LCD.

BRIEF SUMMARY

According to a first aspect of the present disclosure there is provided a switchable display device for use in ambient illumination comprising: a spatial light modulator arranged to output light; wherein the spatial light modulator comprises a display polariser arranged on the output side of the spatial light modulator; an additional polariser arranged on the output side of the display polariser; a reflective polariser arranged between the display polariser and the additional polariser; and at least one retarder arranged between the additional polariser and the reflective polariser, wherein the at least one retarder comprises: a switchable liquid crystal retarder comprising: a layer of liquid crystal material having a positive dielectric anisotropy and having a retardance for light of a wavelength of 550 nm in a range from 500 nm to 1000 nm; and two surface alignment layers disposed adjacent to the layer of liquid crystal material and on opposite sides thereof, each of the surface alignment layers being arranged to provide homogeneous alignment in the adjacent liquid crystal material and each of the surface alignment layers having a pretilt having a pretilt direction with a component in the plane of the layer of liquid crystal material that is parallel or anti-parallel or orthogonal to an electric vector transmission direction of the reflective polariser.

Embodiments of the present disclosure may be used in a variety of optical systems. The embodiment may include or work with a variety of projectors, projection systems, optical components, displays, microdisplays, computer systems, processors, self-contained projector systems, visual and/or audio-visual systems and electrical and/or optical devices. Aspects of the present disclosure may be used with practically any apparatus related to optical and electrical devices, optical systems, presentation systems or any apparatus that may contain any type of optical system. Accordingly, embodiments of the present disclosure may be employed in optical systems, devices used in visual and/or optical presentations, visual peripherals and so on and in a number of computing environments.

Before proceeding to the disclosed embodiments in detail, it should be understood that the disclosure is not limited in its application or creation to the details of the particular arrangements shown, because the disclosure is capable of other embodiments. Moreover, aspects of the disclosure may be set forth in different combinations and arrangements to define embodiments unique in their own right. Also, the terminology used herein is for the purpose of description and not of limitation.

These and other advantages and features of the present disclosure will become apparent to those of ordinary skill in the art upon reading this disclosure in its entirety.

BRIEF DESCRIPTION OF THE DRAWINGS

Embodiments are illustrated by way of example in the accompanying FIGURES, in which like reference numbers indicate similar parts, and in which:

FIG. 26A is a schematic diagram illustrating in perspective side view an arrangement of a switchable retarder in a privacy mode of operation comprising a negative C-plate passive retarder and homogeneously aligned switchable liquid crystal retarder further comprising a patterned electrode layer;

FIG. 26B is a schematic diagram illustrating in perspective front view illumination of a primary viewer and a snooper by a camouflaged luminance controlled privacy display;

FIG. 26C is a schematic diagram illustrating in perspective side view illumination of a snooper by a camouflaged luminance controlled privacy display;

FIG. 27A is a schematic diagram illustrating in perspective side view an arrangement of a homogeneously aligned switchable liquid crystal retarder;

DETAILED DESCRIPTION

Figure 1A:
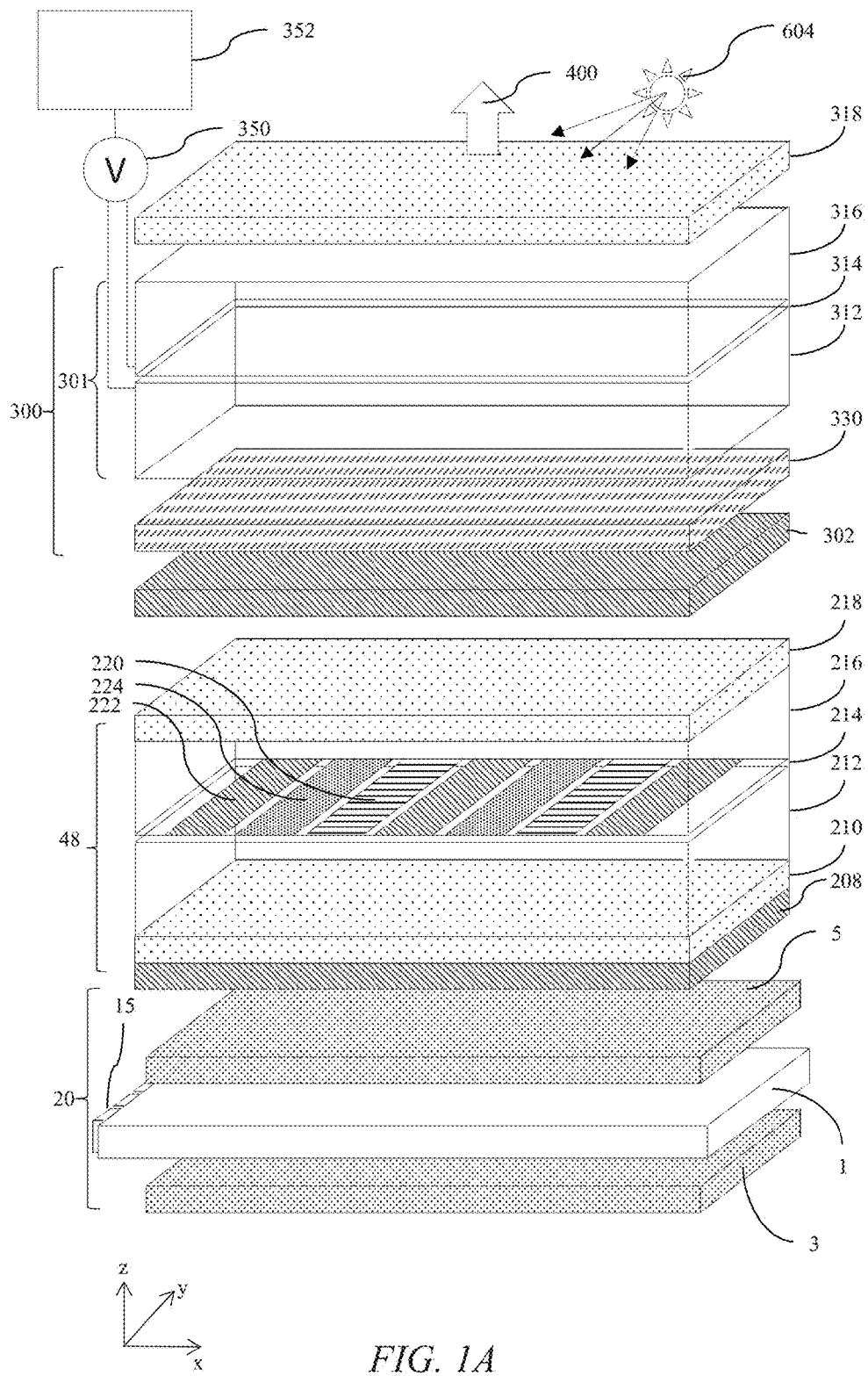
FIG. 1A is a schematic diagram illustrating in side perspective view a switchable privacy display for use in ambient illumination comprising a transmissive spatial light modulator, reflective polariser and compensated switchable retarder.

Terms related to optical retarders for the purposes of the present disclosure will now be described.

In a layer comprising a uniaxial birefringent material there is a direction governing the optical anisotropy whereas all directions perpendicular to it (or at a given angle to it) are optically equivalent.

Optical axis refers to the direction of propagation of an unpolarised light ray in the uniaxial birefringent material in which no birefringence is experienced by the ray. For light propagating in a direction orthogonal to the optical axis, the optical axis is the slow axis when linearly polarized light with an electric vector direction parallel to the optical axis travels at the slowest speed. The slow axis direction is the direction with the highest refractive index at the design wavelength. Similarly the fast axis direction is the direction with the lowest refractive index at the design wavelength.

For positive dielectric anisotropy uniaxial birefringent materials the slow axis direction is the extraordinary axis of the birefringent material. For negative dielectric anisotropy uniaxial birefringent materials the fast axis direction is the extraordinary axis of the birefringent material.

The terms half a wavelength and quarter a wavelength refer to the operation of a retarder for a design wavelength $\lambda_0$ that may typically be between 450 nm and 570 nm. In the present illustrative embodiments exemplary retardance values are provided for a wavelength of 550 nm unless otherwise specified.

The retarder provides a phase shift between two perpendicular polarization components of the light wave incident thereon and is characterized by the amount of relative phase, $\Gamma$, that it imparts on the two polarization components; which is related to the birefringence $\Delta n$ and the thickness d of the retarder by:

$$\Gamma = 2\cdot\pi\cdot\Delta n\cdot d/\lambda_0 \qquad \text{eqn. 1}$$

where $\Delta n$ is defined as the difference between the extraordinary and the ordinary index of refraction, i.e.

$$\Delta n = n_e - n_o \qquad \text{eqn. 2}$$

For a half wave retarder, the relationship between d, $\Delta n$, and $\lambda_0$ is chosen so that the phase shift between polarization components is $\Gamma = \pi$. For a quarter wave retarder, the relationship between d, $\Delta n$, and $\lambda_0$ is chosen so that the phase shift between polarization components is $\Gamma = \pi/2$.

The term half wave retarder herein typically refers to light propagating normal to the retarder and normal to the spatial light modulator.

In the present disclosure an 'A-plate' refers to an optical retarder utilizing a layer of birefringent material with its optical axis parallel to the plane of the layer. The plane of the retarders refers to the slow axis of the retarders extend in a plane, that is the x-y plane.

A 'positive A-plate' refers to positively birefringent A-plates, i.e. A-plates with a positive $\Delta n$.

In the present disclosure a 'C-plate' refers to an optical retarder utilizing a layer of birefringent material with its optical axis perpendicular to the plane of the layer. A 'positive C-plate' refers to positively birefringent C-plate, i.e. a C-plate with a positive $\Delta n$. A 'negative C-plate' refers to a negatively birefringent C-plate, i.e. a C-plate with a negative $\Delta n$.

In the present disclosure an 'O-plate' refers to an optical retarder utilizing a layer of birefringent material with its optical axis having a component parallel to the plane of the layer and a component perpendicular to the plane of the layer. A 'positive O-plate' refers to positively birefringent O-plates, i.e. O-plates with a positive $\Delta n$.

Achromatic retarders may be provided wherein the material of the retarder is provided with a retardance $\Delta n\cdot d$ that varies with wavelength $\lambda$ as:

$$\Delta n\cdot d/\lambda = \kappa \qquad \text{eqn. 3}$$

where $\kappa$ is substantially a constant.

Examples of suitable materials include modified polycarbonates from Teijin Films. Achromatic retarders may be provided in the present embodiments to advantageously minimise colour changes between polar angular viewing directions which have low luminance reduction and polar angular viewing directions which have increased luminance reductions as will be described below.

Various other terms used in the present disclosure related to retarders and to liquid crystals will now be described.

Homogeneous alignment refers to the alignment of liquid crystals in switchable liquid crystal displays where molecules align substantially parallel to a substrate. Homogeneous alignment is sometimes referred to as planar alignment. Homogeneous alignment may typically be provided with a small pre-tilt such as 2 degrees, so that the molecules at the surfaces of the alignment layers of the liquid crystal cell are slightly inclined as will be described below. Pretilt is arranged to minimise degeneracies in switching of cells.

In the present disclosure, homeotropic alignment is the state in which rod-like liquid crystalline molecules align substantially perpendicularly to the substrate. In discotic liquid crystals homeotropic alignment is defined as the state in which an axis of the column structure, which is formed by disc-like liquid crystalline molecules, aligns perpendicularly to a surface. In homeotropic alignment, pretilt is the tilt angle of the molecules that are close to the alignment layer and is typically close to 90 degrees and for example may be 88 degrees.

Liquid crystal molecules with positive dielectric anisotropy are switched from a homogeneous alignment (such as an A-plate retarder orientation) to a homeotropic alignment (such as a C-plate or O-plate retarder orientation) by means of an applied electric field.

Liquid crystal molecules with negative dielectric anisotropy are switched from a homeotropic alignment (such as a C-plate or O-plate retarder orientation) to a homogeneous alignment (such as an A-plate retarder orientation) by means of an applied electric field.

Rod-like molecules have a positive birefringence so that $n_e > n_o$ as described in equation 2. Discotic molecules have negative birefringence so that $n_e < n_o$.

Positive retarders such as A-plates, positive O-plates and positive C-plates may typically be provided by stretched films or rod-like liquid crystal molecules. Negative retarders such as negative C-plates may be provided by stretched films or discotic like liquid crystal molecules.

Parallel liquid crystal cell alignment refers to the alignment direction of homogeneous alignment layers being parallel or more typically antiparallel. In the case of pretilted homeotropic alignment, the alignment layers may have components that are substantially parallel or antiparallel. Hybrid aligned liquid crystal cells may have one homogeneous alignment layer and one homeotropic alignment layer. Twisted liquid crystal cells may be provided by alignment layers that do not have parallel alignment, for example oriented at 90 degrees to each other.

Transmissive spatial light modulators may further comprise retarders between the input display polariser and the output display polariser for example as disclosed in U.S. Pat. No. 8,237,876, which is herein incorporated by reference in its entirety. Such retarders (not shown) are in a different place to the passive retarders of the present embodiments. Such retarders compensate for contrast degradations for off-axis viewing locations, which is a different effect to the luminance reduction for off-axis viewing positions of the present embodiments.

Optical isolation retarders provided between the display polariser and an OLED display emission layer are described further in U.S. Pat. No. 7,067,985. Optical isolation retarders are in a different place to the passive retarders of the present embodiments. Isolation retarder reduces frontal reflections from the OLED display emission layer which is a different effect to the luminance reduction for off-axis viewing positions of the present embodiments.

Reflective polarisers are polarisers that reflect one polarisation component of incident light and transmit a second orthogonal polarisation component. Examples of reflective polarisers are multilayer polymeric film stacks such as DBEF™ or APF™ from 3M Corporation, or wire grid polarisers such as ProFlux™ from Moxtek.

The structure and operation of various switchable display devices will now be described. In this description, common elements have common reference numerals. It is noted that the disclosure relating to any element applies to each device in which the same or corresponding element is provided. Accordingly, for brevity such disclosure is not repeated.

Figure 1B:
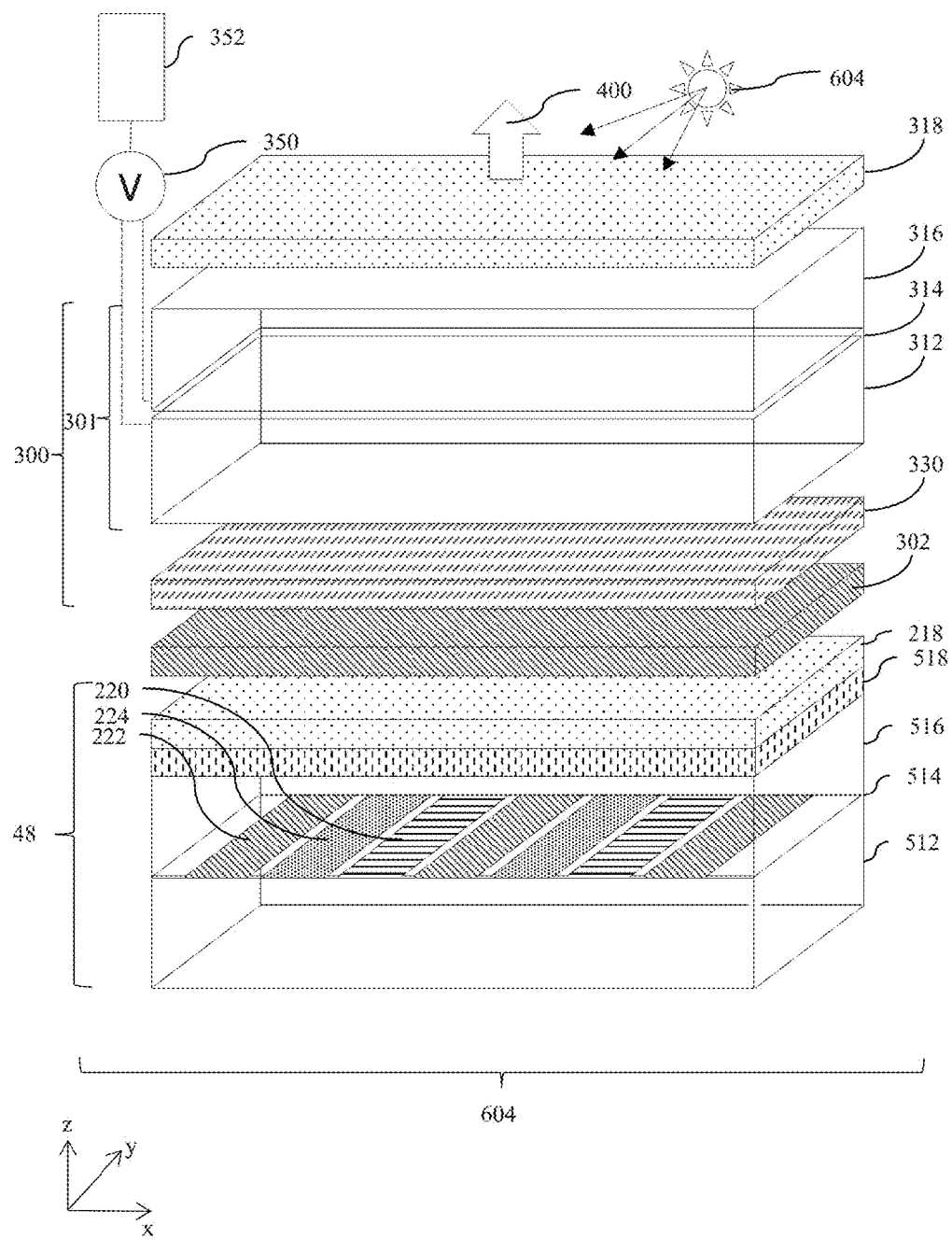
FIG. 1B is a schematic diagram illustrating in side perspective view a switchable privacy display for use in ambient illumination comprising an emissive spatial light modulator and compensated switchable retarder.
Figure 2A:
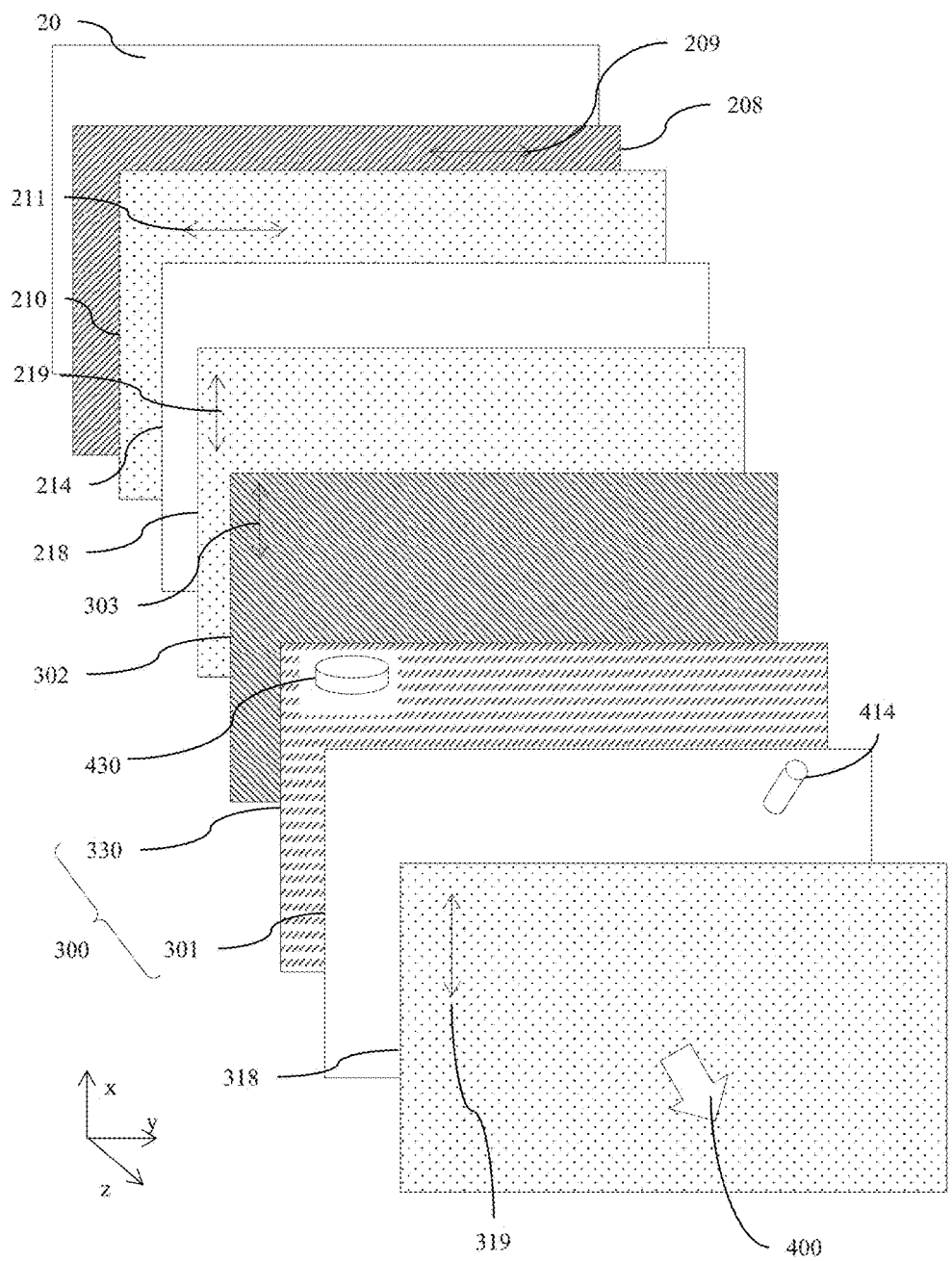
FIG. 2A is a schematic diagram illustrating in front view alignment of optical layers in the optical stack of FIG. 1A.

FIG. 1A is a schematic diagram illustrating in side perspective view an optical stack of a display device for use in ambient illumination; FIG. 1B is a schematic diagram illustrating in side perspective view a switchable privacy display for use in ambient illumination comprising an emissive spatial light modulator and compensated switchable retarder; and FIG. 2A is a schematic diagram illustrating in front view alignment of optical layers in the optical stack of FIG. 1.

A display device 100 for use in ambient illumination 604 comprises: a spatial light modulator 48 arranged to output light 400; wherein the spatial light modulator 48 comprises an output polariser 218 arranged on the output side of the spatial light modulator 48; an additional polariser 318 arranged on the output side of the output polariser 218; a reflective polariser 302 arranged between the output polariser 218 and the additional polariser 318; and plural retarders 300 arranged between the reflective polariser 302 and the additional polariser 318. The electric vector transmission direction 303 of the reflective polariser 302 is parallel to the electric vector transmission direction 319 of the additional polariser 318. The electric vector transmission direction 303 of the reflective polariser 302 is parallel to the electric vector transmission direction 219 of the output polariser 218.

Thus a display device for use in ambient illumination 604 comprises a spatial light modulator 48 arranged to output light 400. In the present disclosure, spatial light modulator 48 may comprise a liquid crystal display comprising input polariser 210, output polariser 218 with substrates 212, 216, liquid crystal layer 214 and red, green and blue pixels 220, 222, 224. Backlight 20 may be arranged to illuminate the spatial light modulator 48 and may comprise input light sources 15, waveguide 1, rear reflector 3 and optical stack 5 comprising diffusers, light turning films and other known optical backlight structures. Asymmetric diffusers, that may comprise asymmetric surface relief features for example, may be provided in the optical stack 5 with increased diffusion in the elevation direction in comparison to the lateral direction may be provided. Advantageously image uniformity may be increased.

In the present embodiments, the backlight 20 may be arranged to provide an angular light distribution that has reduced luminance for off-axis viewing positions in comparison to head-on luminance. A typical wide angle backlight has a roll-off at higher angles such that the full width half maximum of relative luminance may be preferably greater than 40°, more preferably greater than 60° and most preferably greater than 80°.

The backlight 20 may be a directional backlight that provides a luminance at polar angles to the normal to the spatial light modulator greater than 45 degrees that is at most 30% of the luminance along the normal to the spatial light modulator, preferably at most 20% of the luminance along the normal to the spatial light modulator, and more preferably at most 10% of the luminance along the normal to the spatial light modulator. In an illustrative embodiment of FIG. 1A, the luminance at polar angles to the normal to the spatial light modulator greater than 45 degrees may be at most 18%.

Backlight 20 may further comprise a switchable backlight arranged to switch the output angular luminance profile in order to provide reduced off-axis luminance in a privacy mode of operation and higher off-axis luminance in a wide angle mode of operation. Such a directional backlight provides some off-axis luminance reduction, advantageously increasing head-on efficiency and reducing display visibility and stray light for off-axis locations.

The display may further comprise a reflective recirculation polariser 208 arranged between the backlight 20 and spatial light modulator 48. The reflective recirculation polariser 208 is different to the reflective polariser 302 of the present embodiments. Reflective recirculation polariser 208 provides reflection of polarised light from the backlight that has a polarisation that is orthogonal to the electric vector transmission direction of the dichroic input polariser 210. Reflective recirculation polariser 208 does not reflect ambient light 604 to a snooper.

As illustrated in FIG. 1B, the spatial light modulator 48 may alternatively be provided by other display types that provide output light 400 by emission, such as organic LED displays (OLED), with output polariser 218. Output polariser 218 may provide reduction of luminance for light reflected from the OLED pixel plane by means of one or more retarders 518 inserted between the output display polariser 218 and OLED pixel plane. The one or more retarders 518 may be a quarter waveplate and is different to the retarder 330 of the present disclosure.

Thus the spatial light modulator 48 comprises an output polariser 218 arranged on the output side of the spatial light modulator 48. The output polariser 218 may be arranged to provide high extinction ratio for light from the pixels 220, 222, 224 of the spatial light modulator 48 and to prevent back reflections from the reflective polariser 302 towards the pixels 220, 222, 224.

An additional polariser 318 is arranged on the output side of the output polariser 218. Typical polarisers 210, 218, 318 may be polarisers such as dichroic polarisers.

Reflective polariser 302 is arranged between the output polariser 218 and the additional polariser 318.

Plural retarders 300 is arranged between the reflective polariser 302 and the additional polariser 318. In the embodiment of FIGS. 1A-1B, the plural retarders 300 comprise passive retarder 330 and switchable liquid crystal retarder 301, but in general may be replaced by other configurations of at least one retarder, some examples of which are present in the devices described below. The retarders 300 do not affect the luminance of light passing through the reflective polariser 302, the retarders 300 and the additional polariser 318 along an axis along a normal to the plane of the retarders 300 but the retarders 300 do reduce the luminance of light passing therethrough along an axis inclined to a normal to the plane of the retarders 300, at least in one of the switchable states of the switchable retarder 301. The principles leading to this effect are described in greater detail below with reference to FIGS. 33A-35E and arises from the presence or absence of a phase shift introduced by the retarders 300 to light along axes that are angled differently with respect to the liquid crystal material of the retarders 300. A similar effect is achieved in all the devices described below.

The substrates 312, 316 of the switchable liquid crystal retarder 301 comprise electrodes arranged to provide a voltage across the layer 314 of liquid crystal material. Control system 352 is arranged to control the voltage applied by voltage driver 350 across the electrodes of the switchable liquid crystal retarder 301.

As illustrated in FIG. 2A in the case when the spatial light modulator 48 is a liquid crystal display, the input electric vector transmission direction 211 at the input polariser 210 provides an input polarisation component that may be transformed by the liquid crystal layer 214 to provide output polarisation component determined by the electric vector transmission direction 219 of the output polariser 218. The electric vector transmission direction of the reflective polariser 302 is parallel to the electric vector transmission direction of the output polariser 218. Further the electric vector transmission direction 303 of the reflective polariser 302 is parallel to the electric vector transmission direction 319 of the additional polariser 318. Passive retarder 330 may comprise retardation layer with material 430, while switchable liquid crystal retarder 301 may comprise a layer 314 of liquid crystal material 414, as will be described below.

Retarder 300 comprises a switchable liquid crystal retarder 301 comprising a layer 314 of liquid crystal material, and substrates 312, 316 arranged between the reflective polariser 302 and the additional polariser 318. Retarder 300 further comprises a passive retarder 330 as will be described further below.

Figure 2B:
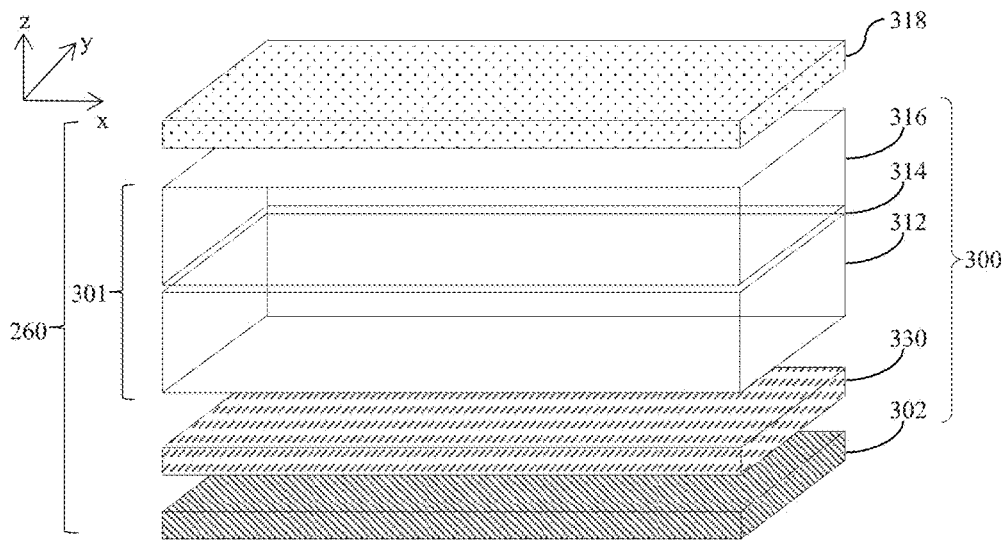
FIG. 2B is a schematic diagram illustrating in side perspective view a view angle control element comprising a reflective polariser, a passive compensation retarder, a switchable liquid crystal retarder and an additional polariser.

FIG. 2B is a schematic diagram illustrating in side perspective view a view angle control element 260 comprising a reflective polariser 302; a retarder 300 comprising passive compensation retarder 330, a switchable liquid crystal retarder 301; and an additional polariser.

The view angle control optical element 260 is for application to the output side of a display device for use in ambient illumination 604 comprising a spatial light modulator 48 arranged to output light; wherein the spatial light modulator 48 comprises an output polariser 218 arranged on the output side of the spatial light modulator 48; the view angle control optical element 260 comprising an additional polariser 318; a reflective polariser 302 arranged between the output polariser 218 and the additional polariser 318 on application of the view angle control optical element 260 to the display device; and the retarders 300 arranged between the reflective polariser 302 and the additional polariser 318.

In use, view angle control optical element 260 may be attached by a user or may be factory fitted to a polarised output spatial light modulator 48. View angle control optical element 260 may be provided as a flexible film for curved and bent displays. Alternatively the view angle control optical element 260 may be provided on a rigid substrate such as a glass substrate.

Advantageously, an after-market privacy control element and/or stray light control element may be provided that does not require matching to the panel pixel resolution to avoid Moiré artefacts. View angle control optical element 260 may be further provided for factory fitting to spatial light modulator 48.

By attaching the view angle control optical element 260 of FIG. 2B to an existing display device, it is possible to form a display device as shown in any of FIGS. 1A-2A.

The arrangement and operation of the plural retarders 300 comprising a switchable liquid crystal retarder 301 will now be discussed.

Figure 3:
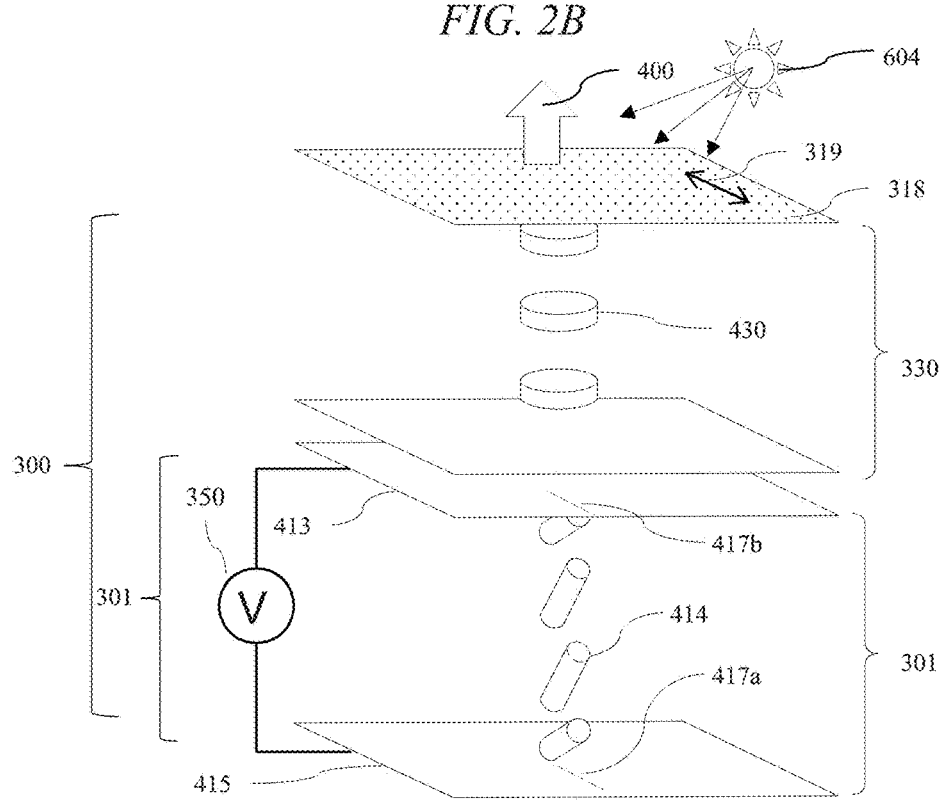
FIG. 3 is a schematic diagram illustrating in perspective side view an arrangement of a switchable liquid crystal retarder with homogeneous alignment and further comprising a passive negative C-plate compensation retarder in a privacy mode of operation.
Figure 3:
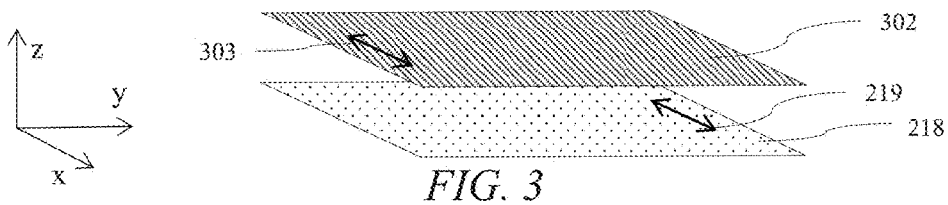

FIG. 3 is a schematic diagram illustrating in perspective side view an arrangement of the plural retarders 300 in a privacy mode of operation comprising a negative C-plate passive retarder 330 and homogenously aligned switchable liquid crystal retarder 301 in a privacy mode of operation. In FIG. 3 and other schematic diagrams below, some layers of the optical stack are omitted for clarity. For example the switchable liquid crystal retarder 301 is shown omitting the substrates 312, 316.

The switchable liquid crystal retarder 301 comprises a layer 314 of liquid crystal material 414 with a positive dielectric anisotropy. The passive retarder 330 comprises a negative C-plate having an optical axis perpendicular to the plane of the retarder 330, illustrated schematically by the orientation of the discotic material 430.

The liquid crystal retarder 301 further comprises transmissive electrodes 413, 415 arranged to control the liquid crystal material 414, the layer of liquid crystal material 414 being switchable by means of adjusting the voltage being applied to the electrodes. The electrodes 413, 415 may be across the layer 314 and are arranged to apply a voltage for controlling the layer 314 of liquid crystal material 414. The transmissive electrodes are on opposite sides of the layer of liquid crystal material 414 and may for example be ITO electrodes.

Alignment layers may be formed between electrodes 413, 415 and the liquid crystal material 414 of the layer 314. The orientation of the liquid crystal molecules in the x-y plane is determined by the pretilt direction of the alignment layers so that each alignment layer has a pretilt wherein the pretilt of each alignment layer has a pretilt direction with a component in the plane of the layer 314 that is parallel or anti-parallel or orthogonal to the electric vector transmission direction 303 of the reflective polariser 302.

Driver 350 provides a voltage V to electrodes 413, 415 across the layer 314 of switchable liquid crystal material 414 such that liquid crystal molecules are inclined at a tilt angle to the vertical. The plane of the tilt is determined by the pretilt direction of alignment layers formed on the inner surfaces of substrates 312, 316.

In typical use for switching between a wide angle mode and a privacy mode, the layer of liquid crystal material is switchable between two states, the first state being a wide angle mode so that the display may be used by multiple users, the second state being a privacy mode for use by a primary user with minimal visibility by snoopers. The switching may be by means of a voltage being applied across the electrodes.

In general such a display may be considered having a first wide angle state and a second reduced off-axis luminance state. Such a display may provide a privacy display. In another use or to provide controlled luminance to off-axis observers for example in an automotive environment when a passenger or driver may wish some visibility of the displayed image, without full obscuration, by means of intermediate voltage levels. Stray light may be reduced for night time operation in automotive or non-automotive use.

The propagation of polarised light from the output polariser 218 will now be considered for on-axis and off-axis directions.

Figure 4A:
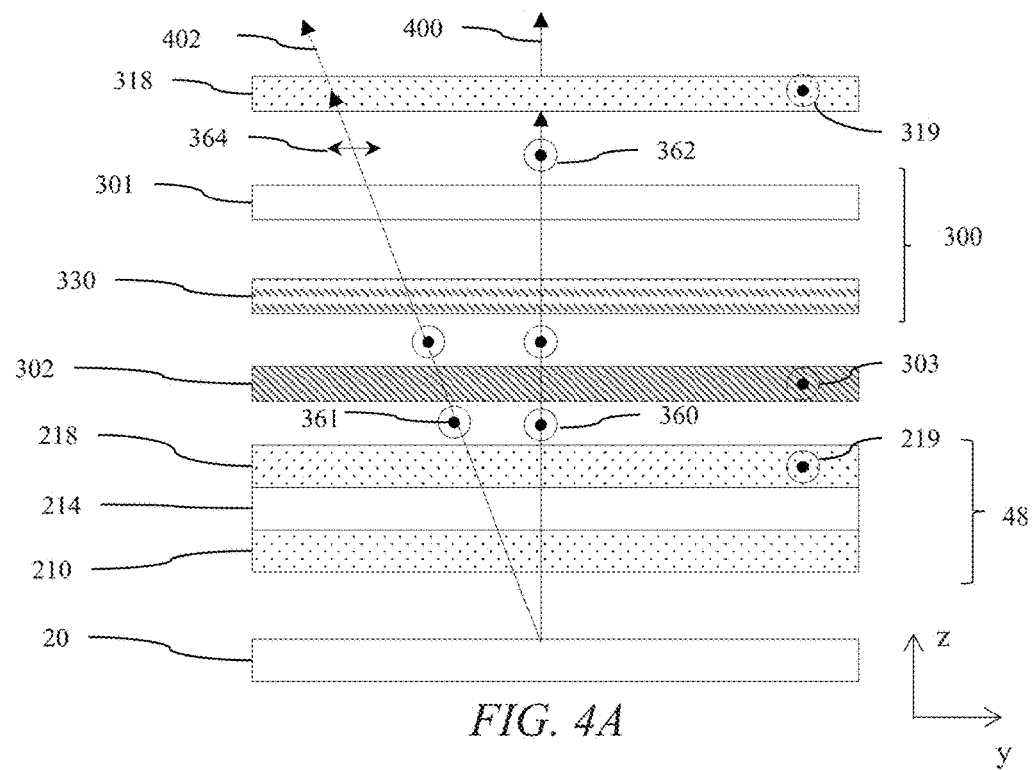
FIG. 4A is a schematic diagram illustrating in side view propagation of output light from a spatial light modulator through the optical stack of FIG. 1A in a privacy mode of operation.

FIG. 4A is a schematic diagram illustrating in side view propagation of output light from a spatial light modulator through the optical stack of FIG. 1A in a privacy mode of operation. When the liquid crystal retarder 301 is in a second state of said two states, the retarders 300 provide no overall transformation of polarisation component 360 to output light rays 400 passing therethrough along an axis perpendicular to the plane of the switchable retarder, but provide an overall transformation of polarisation component 361 to light rays 402 passing therethrough for some polar angles which are at an acute angle to the perpendicular to the plane of the retarders.

Polarisation component 360 from the output polariser 218 is transmitted by reflective polariser 302 and incident on retarders 300. On-axis light has a polarisation component 362 that is unmodified from component 360 while off-axis light has a polarisation component 364 that is transformed by the retarders 300. At a minimum, the polarisation component 361 is transformed to a linear polarisation component 364 and absorbed by additional polariser 318. More generally, the polarisation component 361 is transformed to an elliptical polarisation component, that is partially absorbed by additional polariser 318.

The field of view for luminance output will now be described.

Figure 4B:
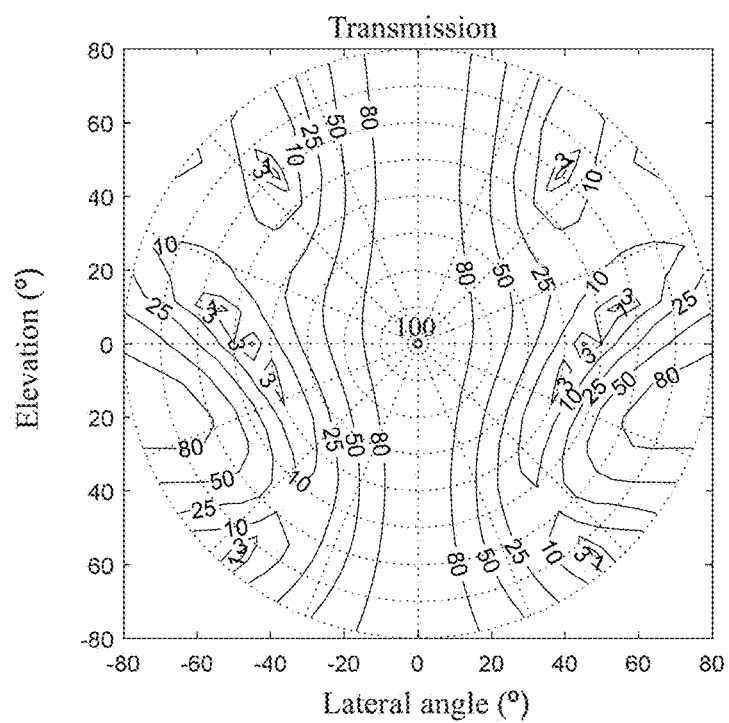
FIG. 4B is a schematic graph illustrating the variation of output luminance with polar direction for the transmitted light rays in FIG. 4A.

FIG. 4B is a schematic graph illustrating the variation of output luminance with polar direction for the transmitted light rays in FIG. 4A in an illustrative embodiment comprising the arrangement illustrated in TABLE 1. Thus in a polar representation of transmission by the retarders 300 and additional polariser 318 in a privacy mode, regions of high transmission and regions of low transmission are provided.

TABLE 1

| | | Passive retarder(s) | | Active LC retarder | | | | |
|---|---|---|---|---|---|---|---|---|
| FIG. | Mode | Type | Δn.d/nm | Alignment layers | Pretilt/deg | Δn.d/nm | Δε | Voltage/V |
| 8C, 9B | Wide | Negative C | −500 | Homogeneous | 2 | 750 | +13.2 | 10.0 |
| 4B, 5B | Privacy | | | Homogeneous | 2 | | | 3.8 |

In the present embodiments, desirable ranges for retardations and voltages have been established by means of simulation of retarder stacks and experiment with display optical stacks. Ranges for retardances will now be described that provide design configurations for various optical layers.

The switchable liquid crystal retarder 301 comprises two surface alignment layers disposed adjacent to the layer of liquid crystal material and on opposite sides thereof and each arranged to provide homogeneous alignment in the adjacent liquid crystal material 414. The layer 314 of liquid crystal material 414 of the switchable liquid crystal retarder 301 comprises a liquid crystal material 414 with a positive dielectric anisotropy. The layer of liquid crystal material 414 has a retardance for light of a wavelength of 550 nm in a range from 500 nm to 900 nm, preferably in a range from 600 nm to 850 nm and most preferably in a range from 700 nm to 800 nm. The retarder 330 further comprises a passive retarder having an optical axis perpendicular to the plane of the retarder, the passive retarder having a retardance for light of a wavelength of 550 nm in a range from −300 nm to −700 nm, preferably in a range from −350 nm to −600 nm and most preferably −400 nm to −500 nm.

The polar distribution of light transmission illustrated in FIG. 4B modifies the polar distribution of luminance output of the underlying spatial light modulator 48. In the case that the spatial light modulator 48 comprises a directional backlight 20 then off-axis luminance may be further be reduced.

Advantageously, a privacy display is provided that has low luminance to an off-axis snooper while maintaining high luminance for an on-axis observer.

The operation of the reflective polariser 302 for light from ambient light source 604 will now be described.

Figure 5A:
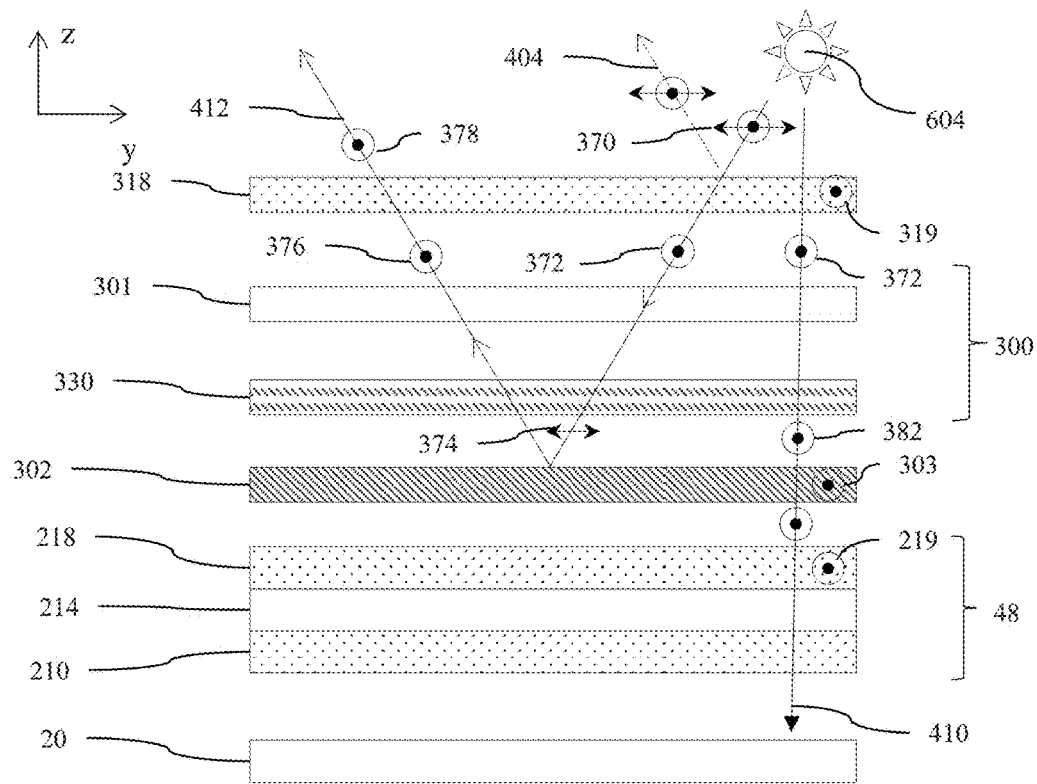
FIG. 5A is a schematic diagram illustrating in top view propagation of ambient illumination light through the optical stack of FIG. 1A in a privacy mode of operation.
Figure 5B:
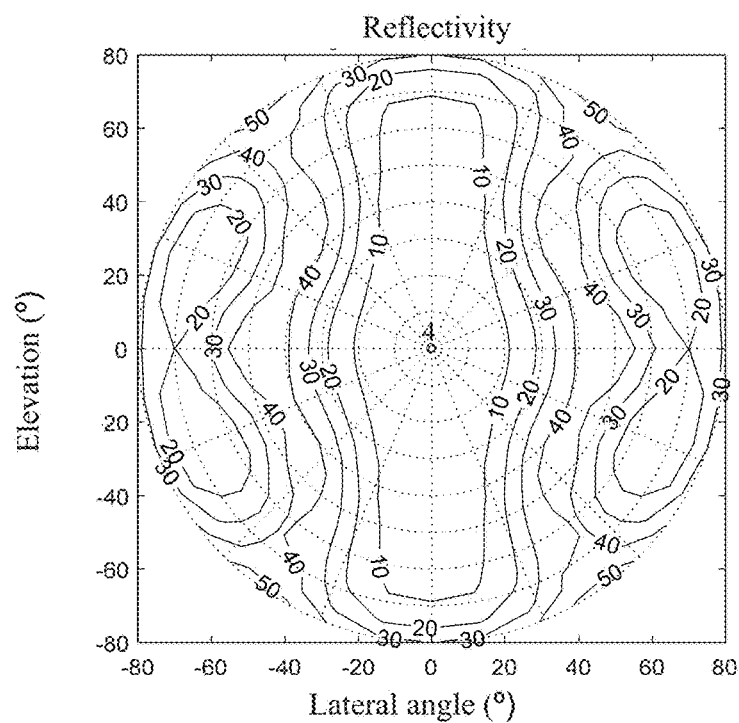
FIG. 5B is a schematic graph illustrating the variation of reflectivity with polar direction for the reflected light rays in FIG. 5A.

FIG. 5A is a schematic diagram illustrating in top view propagation of ambient illumination light through the optical stack of FIG. 1A in a privacy mode of operation; and FIG. 5B is a schematic graph illustrating the variation of reflectivity with polar direction for the reflected light rays in FIG. 5A for the illustrative embodiment of TABLE 1.

Ambient light source 604 illuminates the display 100 with unpolarised light. Additional polariser 318 transmits light ray 410 normal to the display surface with a first polarisation component 372 that is a linear polarisation component parallel to the electric vector transmission direction 319 of the additional polariser 318.

In both states of operation, the polarisation component 372 remains unmodified by the retarders 300 and so transmitted polarisation component 382 is parallel to the transmission axis of the reflective polariser 302 and the output polariser 218, so ambient light is directed through the spatial light modulator 48 and lost.

By comparison, for ray 412, off-axis light is directed through the retarders 300 such that polarisation component 374 incident on the reflective polariser 302 may be reflected. Such polarisation component is re-converted into component 376 after passing through retarders 300 and is transmitted through the additional polariser 318.

Thus when the liquid crystal retarder 301 is in the second state of said two states, the reflective polariser 302 provides no reflected light for ambient light rays 410 passing through the additional polariser 318 and then the retarders 300 along an axis perpendicular to the plane of the retarders 300, but provides reflected light rays 412 for ambient light passing through the additional polariser 318 and then the retarders 300 at some polar angles which are at an acute angle to the perpendicular to the plane of the retarders 300; wherein the reflected light 412 passes back through the retarders 300 and is then transmitted by the additional polariser 318.

The retarders 300 thus provide no overall transformation of polarisation component 380 to ambient light rays 410 passing through the additional polariser 318 and then the retarder 300 along an axis perpendicular to the plane of the switchable retarder, but provides an overall transformation of polarisation component 372 to ambient light rays 412 passing through the absorptive polariser 318 and then the retarders 300 at some polar angles which are at an acute angle to the perpendicular to the plane of the retarders 300.

The polar distribution of light reflection illustrated in FIG. 5B thus illustrates that high reflectivity can be provided at typical snooper locations by means of the privacy state of the retarders 300. Thus, in the privacy mode of operation, the reflectivity for off-axis viewing positions is increased, and the luminance for off-axis light from the display 100 is reduced as illustrated in FIG. 4B.

The reflectivity schematic diagrams of the present disclosure further comprise Fresnel reflections from a single external interface to air, such that the head-on reflectivity is 4%.

Advantageously, a privacy display is provided that has high reflectivity to an off-axis snooper while maintaining low reflectivity for an on-axis observer. As will be described below, such increased reflectivity provides enhanced privacy performance for the display in an ambiently illuminated environment.

In another application such a display may provide a switchable mirror appearance. Such a display may improve the aesthetic appearance of displays that are not in operation. For example in applications to a television in a domestic environment, the display may be provided as a mirror for off-axis viewing, so hiding the 'black hole' that is typical of large area TVs, by reflecting ambient light, advantageously providing perceived expansion of the living space.

Measurements of reflectivity of an embodiment with similar performance to the arrangement of FIG. 5A will now be described.

Figure 5C:
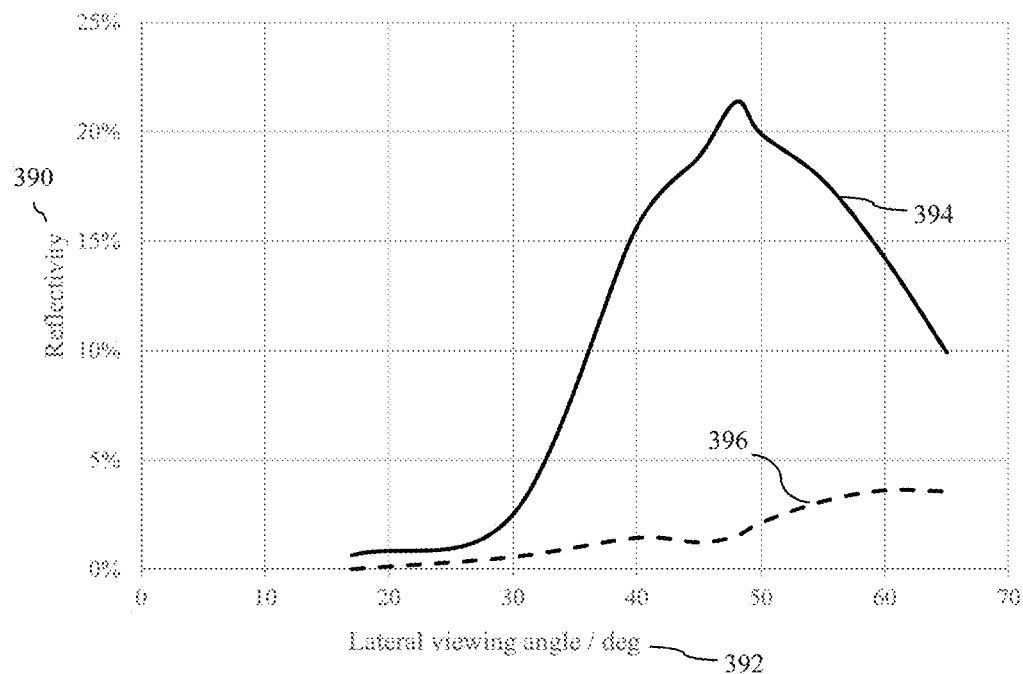
FIG. 5C is a schematic graph illustrating a measurement of the variation of reflectivity with lateral direction for the reflected light rays in FIG. 5A.

FIG. 5C is a schematic graph illustrating a measurement of the variation of reflectivity 390 with lateral viewing angle 392 for some reflected light rays 412. Profile 394 illustrates variation in reflectivity for a display in privacy mode, while profile 396 illustrates variation of reflectivity for a display in wide angle mode.

In comparison to FIG. 5B, the peak reflectivity is approximately 20%, where 50% represents the reflectivity of a perfect reflective polariser 302. Such reduced of reflectivity is due to transmission losses from the additional polariser 318, reflective polariser polarisation reflection efficiency, chromatic variation of the retarders 300 and other reflection and scatter losses within the optical stack.

The operation of the privacy mode of the display of FIG. 1A will now be described further.

Figure 6A:
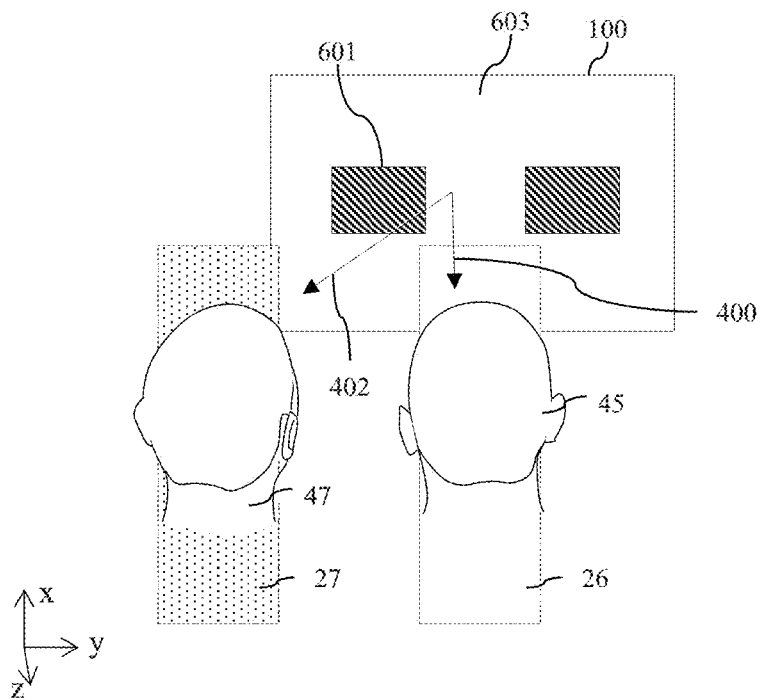
FIG. 6A is a schematic diagram illustrating in front perspective view observation of transmitted output light for a display operating in privacy mode.

FIG. 6A is a schematic diagram illustrating in front perspective view observation of transmitted output light for a display operating in privacy mode. Display 100 may be provided with white regions 603 and black regions 601. A snooper may observe an image on the display if luminance difference between the observed regions 601, 603 can be perceived. In operation, primary user 45 observes a full luminance images by rays 400 to viewing locations 26 that may be optical windows of a directional display. Snooper 47 observes reduced luminance rays 402 in viewing locations 27 that may for example be optical windows of a directional display comprising an imaging waveguide. Regions 26, 27 further represent on-axis and off-axis regions of polar graphs 4B and 5B.

Figure 6B:
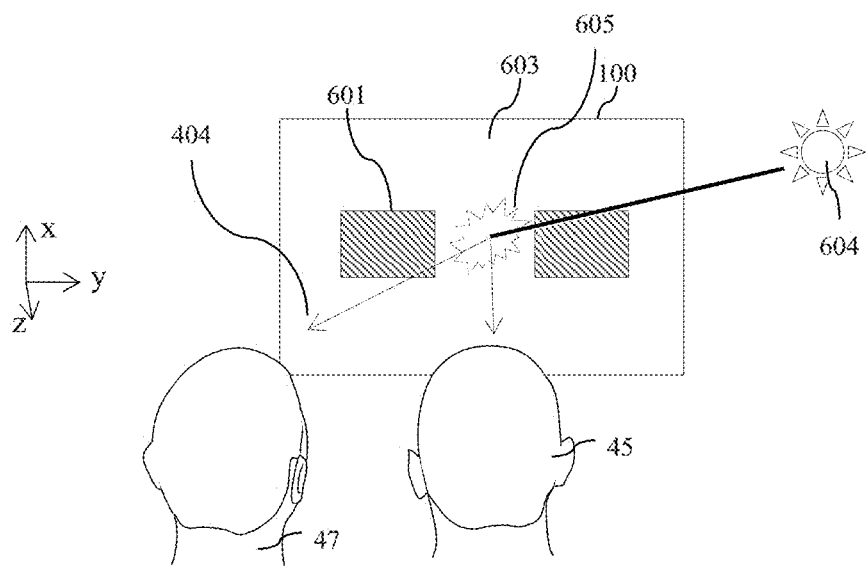
FIG. 6B is a schematic diagram illustrating in front perspective view observation of reflected ambient light from interface surfaces of a display.

FIG. 6B is a schematic diagram illustrating in front perspective view observation of reflected ambient light from interface surfaces of a display. Thus some light rays 404 illustrated in FIG. 5A may be reflected by the front surface of the additional polariser 318 and other surfaces of the display. Typically, such reflectivity may be 4% for a bonded optical stack at normal incidence and approximately 5% for a bonded optical stack for 45 degrees incidence, due to Fresnel reflections at the air-polariser interface. Thus a low luminance reflected image 605 of source 604 may be observed by the snooper on the front of the display 100.

Figure 6C:
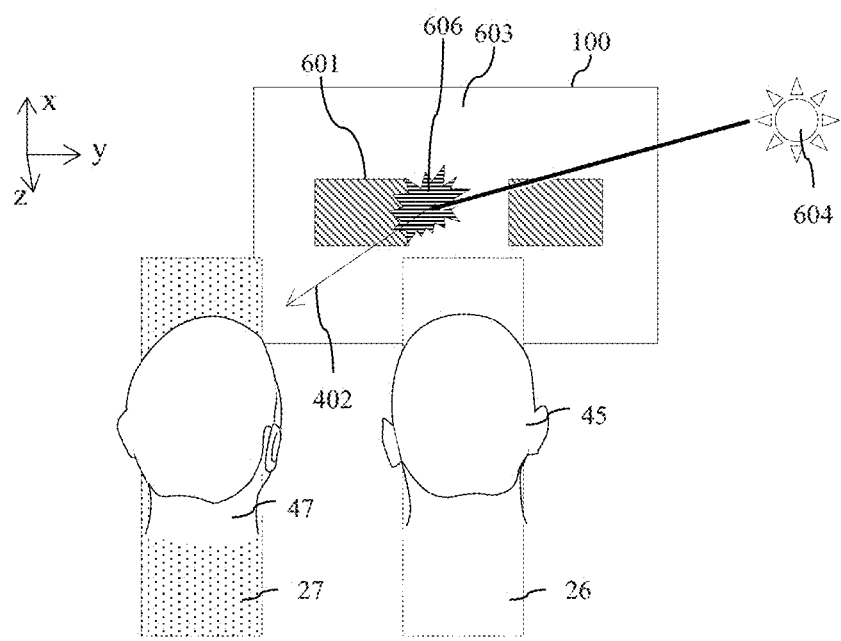
FIG. 6C is a schematic diagram illustrating in front perspective view observation of reflected ambient light for the display of FIG. 1A and FIG. 1B operating in privacy mode.

FIG. 6C is a schematic diagram illustrating in front perspective view observation of reflected ambient light for the display of FIG. 1A operating in privacy mode. By way of comparison with FIG. 6B, substantially higher reflected luminance is observable from reflection 606 of source 604.

The shape and distribution of the reflected image 606 is determined by the ambient light source 604 spatial distribution but may be further determined by diffusion layers, particularly at the output surface of the additional polariser 318.

Figure 7A:
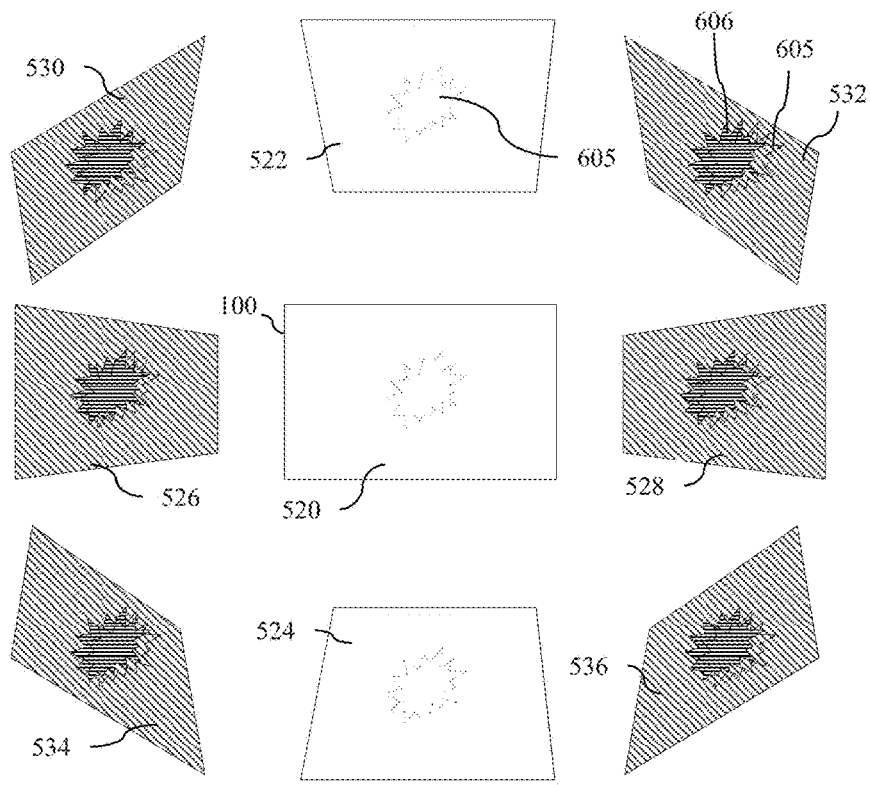
FIG. 7A is a schematic diagram illustrating in front perspective views the appearance of the display of FIG. 1A and FIG. 1B operating in privacy mode.

FIG. 7A is a schematic diagram illustrating in front perspective views the appearance of the display of FIG. 1A operating in privacy mode 1 with luminance and reflectivity variations as illustrated in FIG. 4B and FIG. 5B.

Thus upper viewing quadrants 530, 532, lower viewing quadrants 534, 536 and lateral viewing positions 526, 528 provide both reduced luminance and increased reflections 606, 605 of ambient light source 604, whereas up/down central viewing regions 522, 520 and head-on viewing provides much higher luminance and low reflectivity region 605, with substantially no visibility of reflection from reflective polariser 302.

Figure 7B:
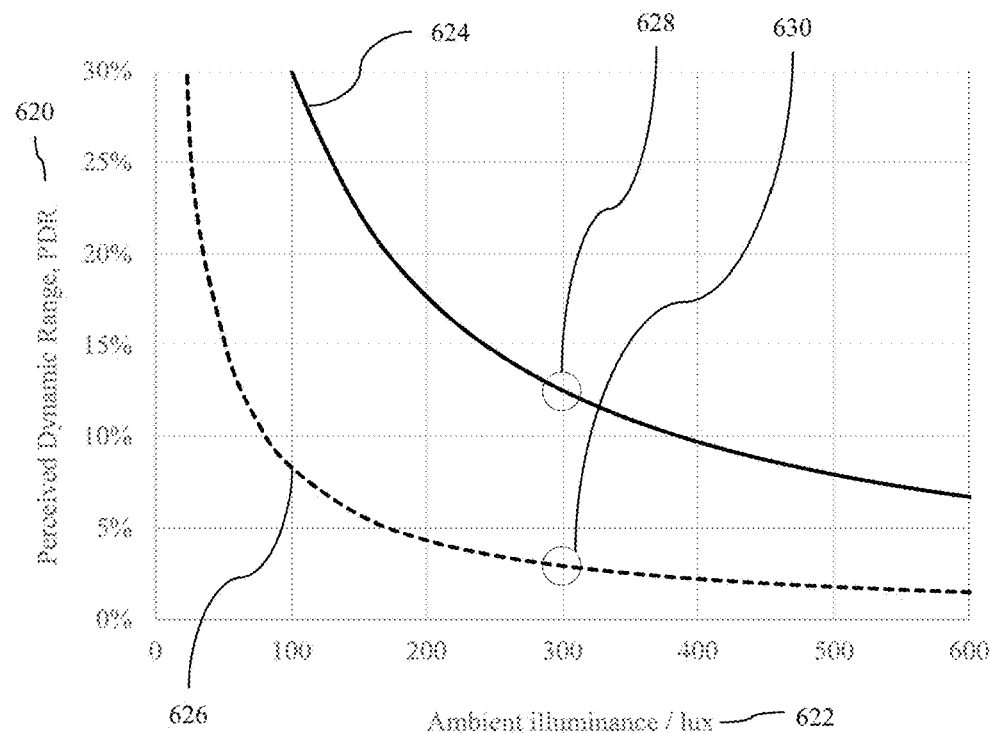
FIG. 7B is a schematic graph illustrating the variation of perceived dynamic range against ambient illuminance for an off-axis snooper of the switchable privacy display of FIG. 1A and FIG. 1B in a privacy mode of operation for arrangements with and without the reflective polariser.

FIG. 7B is a schematic graph illustrating the variation of Perceived Dynamic Range 620 against ambient illuminance 622 for an off-axis snooper of the switchable privacy display of FIG. 1A in a privacy mode of operation for arrangements with and without the reflective polariser 302.

In the present disclosure the term Perceived Dynamic Range, (PDR) is a measure of the visibility of a privacy image and represents a mapping of the image input grey level to a perceived grey level in the visual system of a snooper whether by human visual system or photographic snooping.

The PDR of a luminance and contrast controlled privacy display with ambient illumination is defined in Equation 4 for a given polar location (θ, φ);

$$PDR(\theta,\phi)=\zeta(v)\cdot(Y_D(\theta,\phi)-K_D(\theta,\phi))/R_A(\theta,\phi) \qquad \text{eqn. 4}$$

where $Y_D$, $K_D$ are the respective white and black state display luminance measured in a dark environment. For a Lambertian front diffuser with minimum reflectivity of 4% of ambient illuminance $I_A$, the minimum total ambient white state $R_A$ including frontal reflections is given by Equation 5:

$$R_A(\theta,\phi)=Y_D(\theta,\phi)+0.04 I_A/\pi \qquad \text{eqn. 5}$$

and ζ is a contrast visibility factor, dependent on the perceived contrast of an image spatial frequency v at the snooper angle compared to the perceived contrast at the spatial frequency $v_p$ of peak contrast visibility. In the limit of threshold image contrast, the contrast visibility factor ζ is given by Equation 6:

$$\zeta(v,\theta,\phi)=C(v(\theta,\phi),R_A(\theta,\phi))/C(v_p,R_A(\theta,\phi)) \qquad \text{eqn. 6}$$

The PDR is thus the ratio to the snooper of the range of the perceived grey levels in the privacy image to the total available grey levels that are observable for a given viewing arrangement.

FIG. 7B illustrates the variation of PDR 620 against ambient illuminance 622 for a snooper at 45 degrees offset from a display of FIG. 1A and for the data of TABLE 2. For illustrative purposes the reflective polariser 302 is omitted for variation 624 and included for variation 626, representing embodiments of the present disclosure.

TABLE 2

|  | Variation 624 | Variation 626 |
|---|---|---|
| Snooper luminance/Head-on luminance | 0.5% | |
| Image Contrast | 500:1 | |
| Head-on luminance/nits | 150 | |
| Reflective polariser 302 & retarders 300 | No | Yes |
| Total display reflectivity | 5.0% | 24% |

FIG. 7B thus illustrates that advantageously privacy performance is improved by the reflective polariser 302.

A typical office may have a Lambertian ambient illuminance 622 of 300 lux onto a display 100 surface. The PDR 628 of the image to a snooper observing a 150 nit display with 0.5% off-axis luminance level is thus approximately 12% when no reflective polariser 302 is provided. By way of comparison, the present embodiments incorporate a reflective polariser 302 and a PDR 630 of 3% is achieved. Thus, the visibility of the displayed image to the snooper is 25% of that achieved without the reflective polariser 302. Advantageously display privacy is improved in comparison to displays with no reflective polariser 302.

It may be desirable to provide controllable display illumination in an automotive vehicle.

Figure 7C:
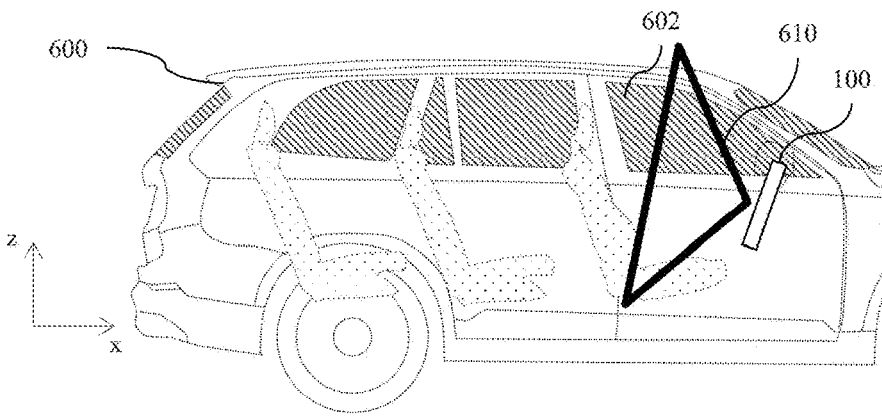
FIG. 7C is a schematic diagram illustrating in side view an automotive vehicle with a switchable directional display arranged within the vehicle cabin for both entertainment and sharing modes of operation.

FIG. 7C is a schematic diagram illustrating in side view an automotive vehicle with a switchable directional display 100 arranged within the vehicle cabin 602 of an automotive vehicle 600 for both entertainment and sharing modes of operation. Light cone 610 (for example representing the cone of light within which the luminance is greater than 50% of the peak luminance) may be provided by the luminance distribution of the display 100 in the elevation direction and is not switchable. Further display reflectivity may be increased compared to head-on reflectivity outside this light cone 610.

Figure 7D:
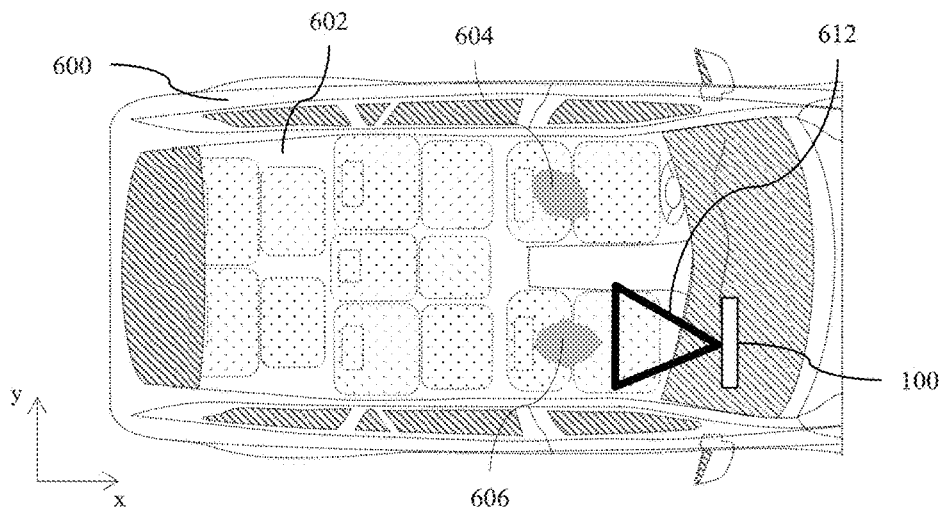
FIG. 7D is a schematic diagram illustrating in top view an automotive vehicle with a switchable directional display arranged within the vehicle cabin in an entertainment mode of operation.

FIG. 7D is a schematic diagram illustrating in top view an automotive vehicle with a switchable directional display 100 arranged within the vehicle cabin 602 in an entertainment mode of operation and operates in a similar manner to a privacy display. Light cone 612 is provided with a narrow angular range such that passenger 606 may see the display 100 whereas driver 604 may not see an image on the display 100 as a consequence of reduced luminance and increased reflectivity. Advantageously entertainment images may be displayed to the passenger 606 without distraction to the driver 604.

Figure 7E:
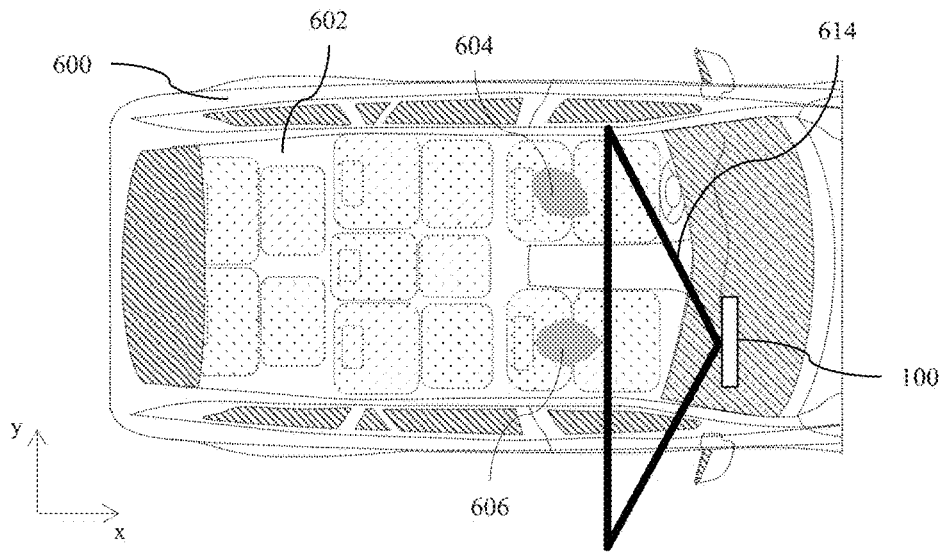
FIG. 7E is a schematic diagram illustrating in top view an automotive vehicle with a switchable directional display arranged within the vehicle cabin in a sharing mode of operation.

FIG. 7E is a schematic diagram illustrating in top view an automotive vehicle with a switchable directional display 100 arranged within the vehicle cabin 602 in a sharing mode of operation. Light cone 614 is provided with a wide angular range such that all occupants may perceive an image on the display 100, for example when the display is not in motion or when non-distracting images are provided.

Figure 7F:
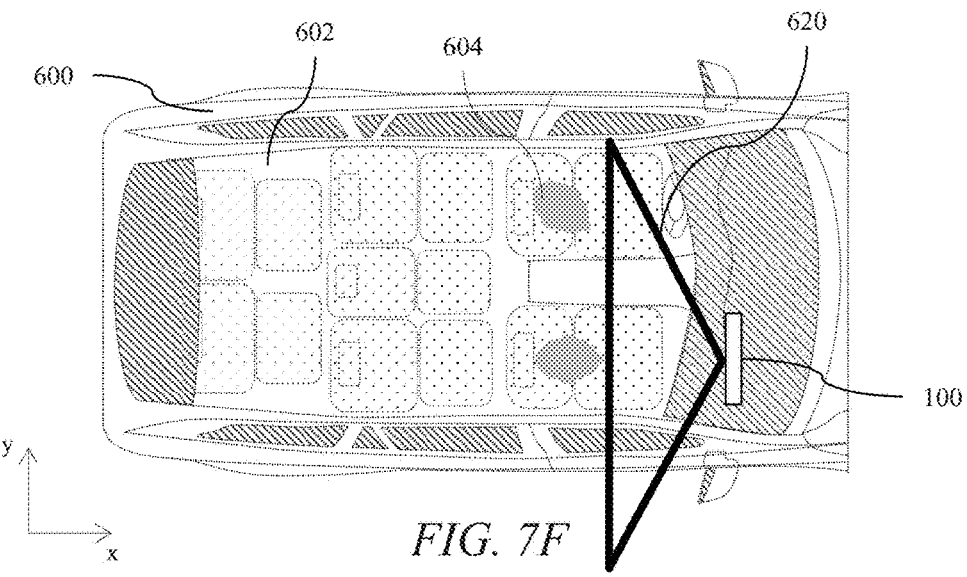
FIG. 7F is a schematic diagram illustrating in top view an automotive vehicle with a switchable directional display arranged within the vehicle cabin for both night-time and day-time modes of operation.

FIG. 7F is a schematic diagram illustrating in top view an automotive vehicle with a switchable directional display 100 arranged within the vehicle cabin 602 for both night-time and day-time modes of operation. In comparison to the arrangements of FIGS. 7C-E, the optical output is rotated so that the display elevation direction is along an axis between the driver 604 and passenger 606 locations. Light cone 620 illuminates both driver 604 and passenger 606 and with low display reflectivity.

Figure 7G:
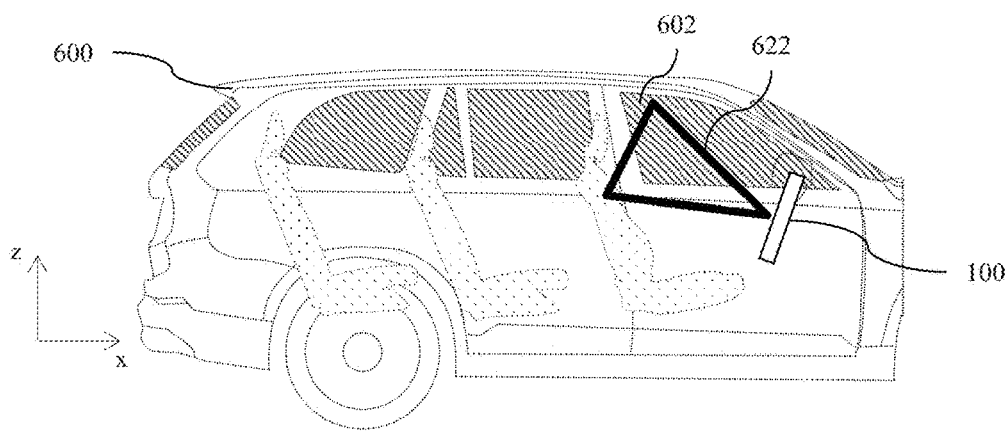
FIG. 7G is a schematic diagram illustrating in side view an automotive vehicle with a switchable directional display arranged within the vehicle cabin in a night-time mode of operation.

FIG. 7G is a schematic diagram illustrating in side view an automotive vehicle with a switchable directional display 100 arranged within the vehicle cabin 602 in a night-time mode of operation. Thus the display may provide a narrow angular output light cone 622. Stray light that illuminates internal surfaces and occupants of the vehicle cabin 602 and cause distraction to driver 604 may advantageously be substantially reduced. Both driver 604 and passenger 606 may advantageously be able to observe the displayed images.

Figure 7H:
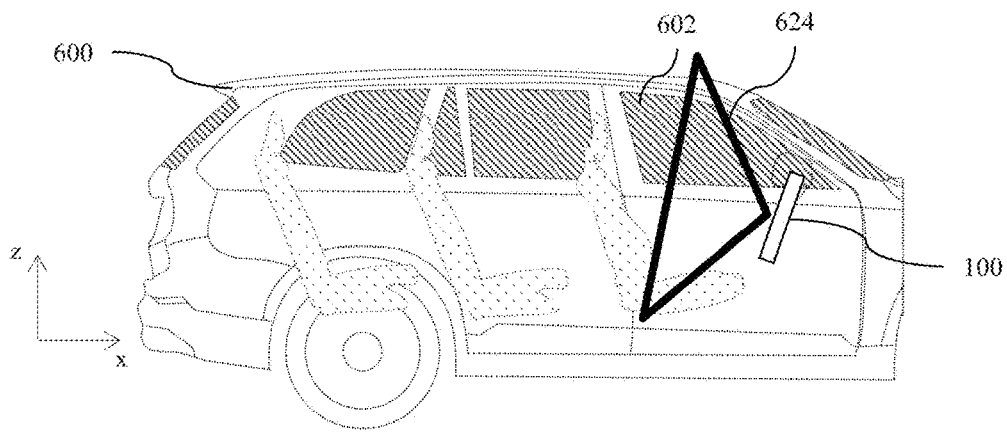
FIG. 7H is a schematic diagram illustrating in side view an automotive vehicle with a switchable directional display arranged within the vehicle cabin in a day-time mode of operation.

FIG. 7H is a schematic diagram illustrating in side view an automotive vehicle with a switchable directional display 100 arranged within the vehicle cabin 602 in a day-time mode of operation. Thus the display may provide a narrow angular output light cone 624. Advantageously the display may be conveniently observed by all cabin 602 occupants.

The displays 100 of FIGS. 7C-H may be arranged at other vehicle cabin locations such as driver instrument displays, centre console displays and seat-back displays.

The operation of the display device 100 in wide angle mode representing a first state will now be described and further details of the retarders 300 illustrated.

Figure 8A:
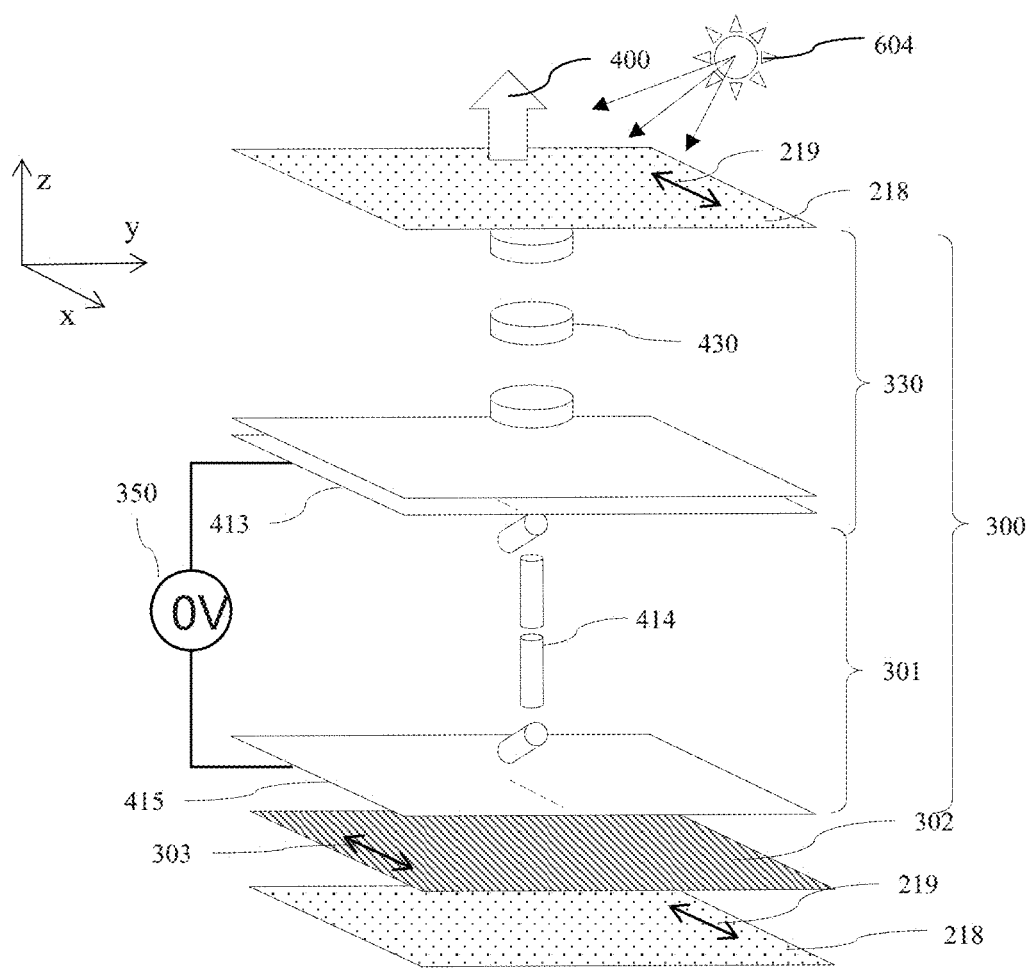
FIG. 8A is a schematic diagram illustrating in perspective side view an arrangement of a switchable retarder in a wide angle mode of operation wherein the switchable retarder comprises a switchable liquid crystal layer with homogeneous alignment and a passive C-plate compensation retarder.

FIG. 8A is a schematic diagram illustrating in perspective side view an arrangement of the retarders 300 in a wide angle mode of operation. In comparison to the arrangement of FIG. 3, the drive voltage is adjusted to provide increased tilt for the molecules of the liquid crystal material 414 in the centre of the layer 314 of the liquid crystal retarder. Such increased tilt changes the retardation of the switchable liquid crystal retarder 301.

Figure 8B:
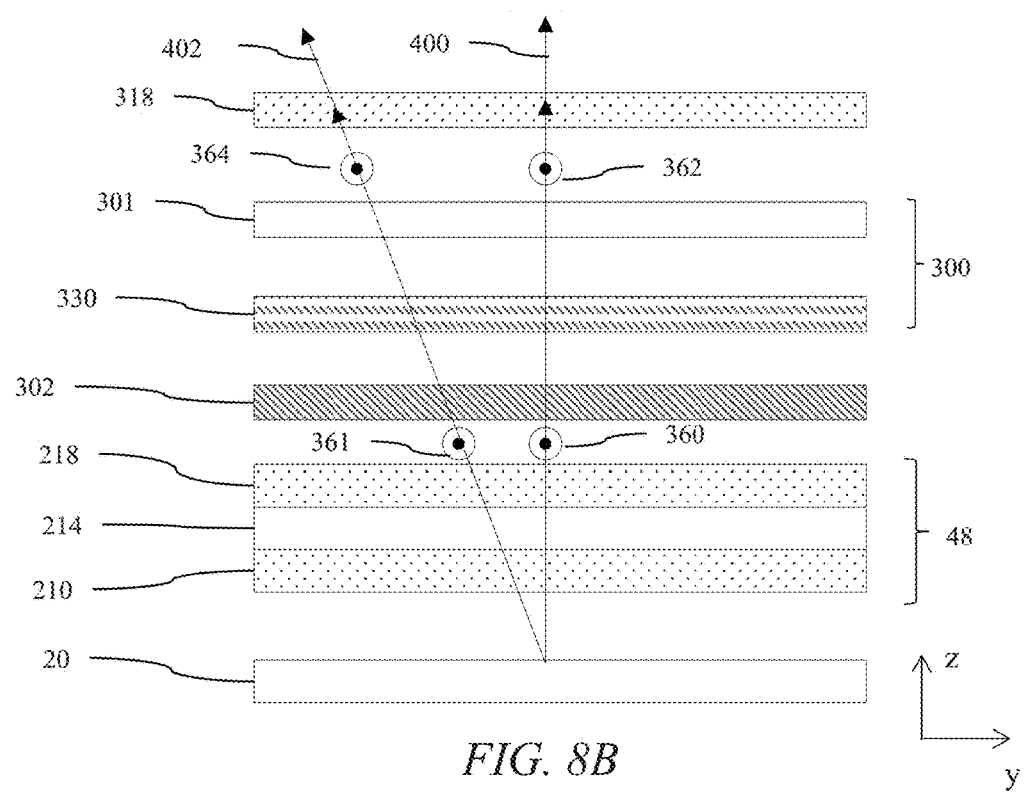
FIG. 8B is a schematic diagram illustrating in side view propagation of output light from a spatial light modulator through the optical stack of FIG. 1A in a wide angle mode of operation.
Figure 8C:
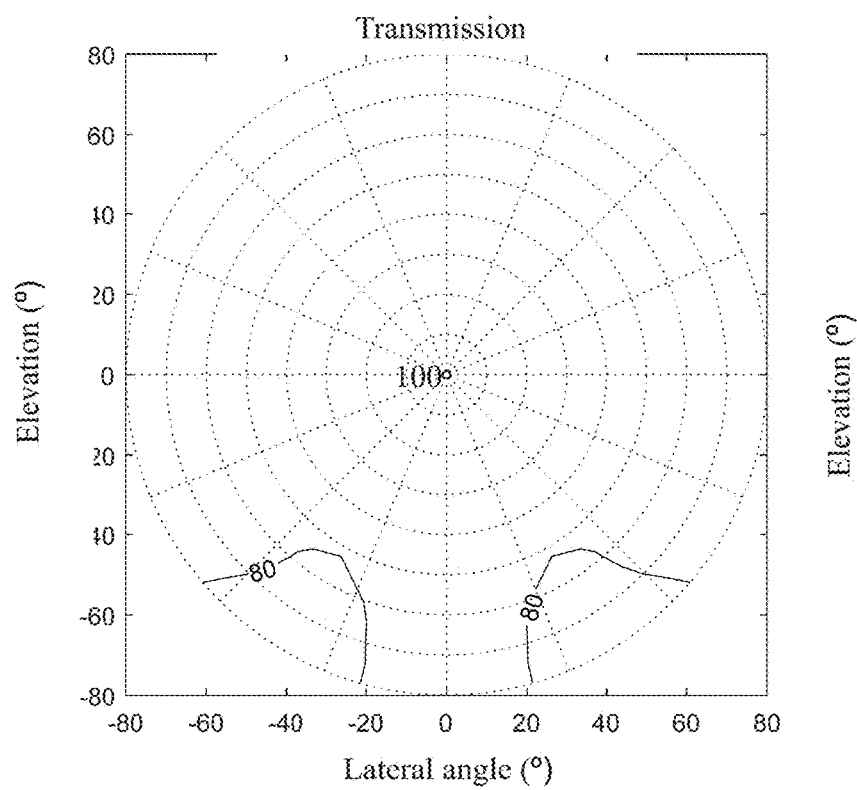
FIG. 8C is a schematic graph illustrating the variation of output luminance with polar direction for the transmitted light rays in FIG. 8B.

FIG. 8B is a schematic diagram illustrating in side view propagation of output light from a spatial light modulator 48 through the optical stack of FIG. 1A in a wide angle mode of operation; and FIG. 8C is a schematic graph illustrating the variation of output luminance with polar direction for the transmitted light rays in FIG. 8B for an illustrative embodiment with the parameters as described in TABLE 1.

Thus when the layer 314 of liquid crystal material is in a first state of said two states, the retarders 300 provide no overall transformation of polarisation component 360, 361 to output light passing therethrough perpendicular to the plane of the switchable retarder or at an acute angle to the perpendicular to the plane of the switchable retarder. That is polarisation component 362 is substantially the same as polarisation component 360 and polarisation component 364 is substantially the same as polarisation component 361. Thus the angular transmission profile of FIG. 8C is substantially uniformly transmitting across a wide polar region. Advantageously a display may be switched to a wide field of view.

Figure 9A:
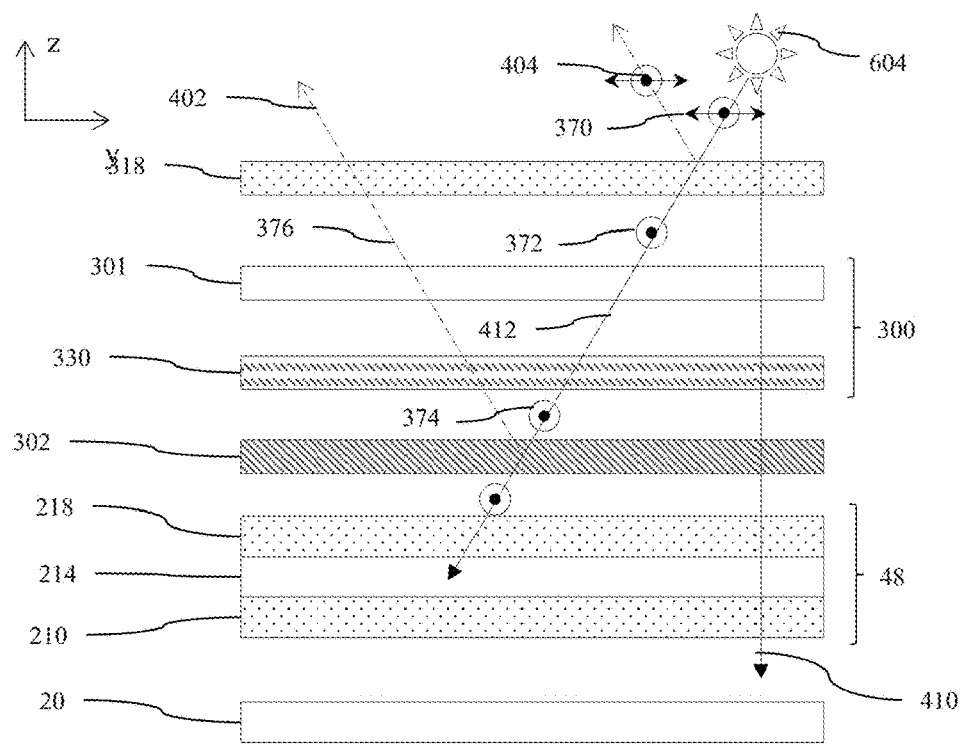
FIG. 9A is a schematic diagram illustrating in top view propagation of ambient illumination light through the optical stack of FIG. 1A in a wide angle mode of operation.
Figure 9B:
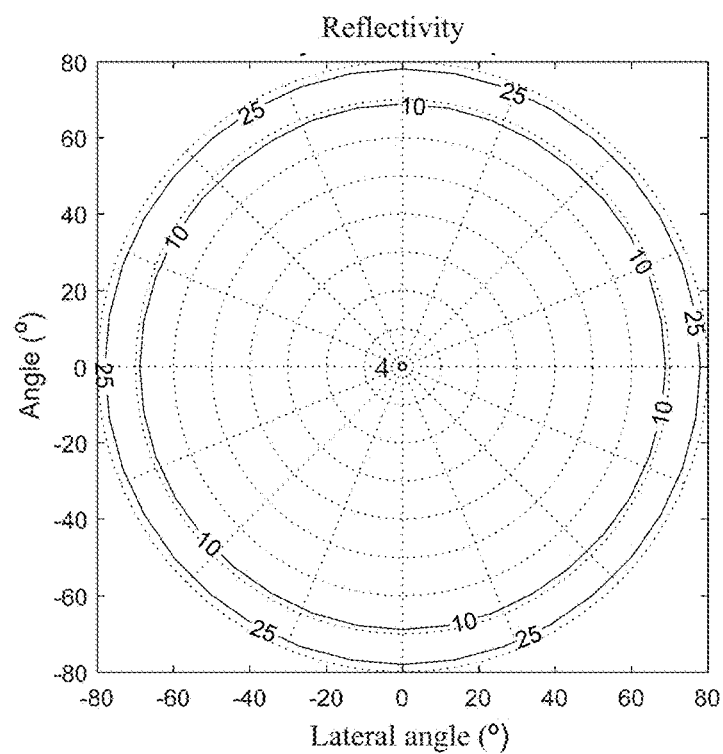
FIG. 9B is a schematic graph illustrating the variation of reflectivity with polar direction for the reflected light rays in FIG. 9A.

FIG. 9A is a schematic diagram illustrating in top view propagation of ambient illumination light through the optical stack of FIG. 1A in a wide angle mode of operation; and FIG. 9B is a schematic graph illustrating the variation of reflectivity with polar direction for the reflected light rays in FIG. 9A and for the illustrative embodiment of TABLE 1.

Thus when the layer 314 of liquid crystal material 414 is in the first state of said two states, the retarders 300 provide no overall transformation of polarisation component 372 to ambient light rays 412 passing through the additional polariser 318 and then the retarders 300, that is perpendicular to the plane of the retarders 300 or at an acute angle to the perpendicular to the plane of the retarders 300.

In operation in the wide angle mode, input light ray 412 has polarisation state 372 after transmission through the additional polariser 318. For both head-on and off-axis directions no polarisation transformation occurs and thus the reflectivity for light rays 402 from the reflective polariser 302 is low. Light ray 412 is transmitted by reflective polariser 302 and lost in the display polarisers 218, 210 or the backlight of FIG. 1A or optical isolator 218, 518 in an emissive spatial light modulator 38 of FIG. 1B.

Advantageously in a wide angle mode of operation, high luminance and low reflectivity is provided across a wide field of view. Such a display can be conveniently viewed with high contrast by multiple observers.

The appearance of the display of FIG. 1A in wide angle mode for the first state will now be described.

Figure 10A:
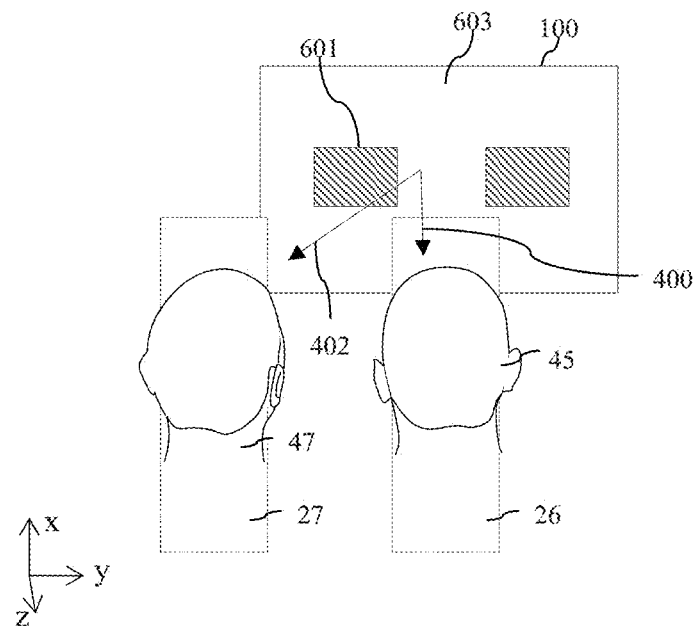
FIG. 10A is a schematic diagram illustrating in front perspective view observation of transmitted output light for a display operating in wide angle mode.
Figure 10B:
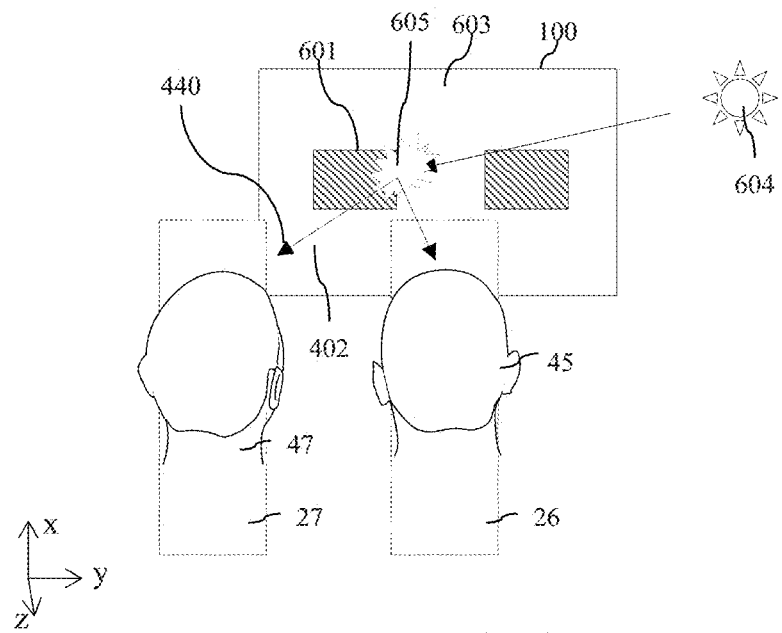
FIG. 10B is a schematic diagram illustrating in front perspective view observation of reflected ambient light from the switchable display of FIG. 1A in wide angle mode.
Figure 10C:
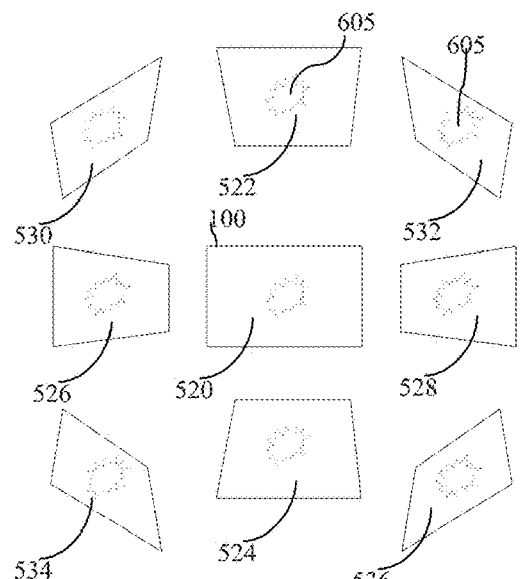
FIG. 10C is a schematic diagram illustrating in front perspective views the appearance of the display of FIG. 1A operating in wide angle mode.

FIG. 10A is a schematic diagram illustrating in front perspective view observation of transmitted output light for a display operating in wide angle mode; FIG. 10B is a schematic diagram illustrating in front perspective view observation of reflected ambient light from the switchable display of FIG. 1A in wide angle mode; and FIG. 10C is a schematic diagram illustrating in front perspective views the appearance of the display of FIG. 1A operating in wide angle mode.

Thus the desirable off-axis viewing position for user 49 has high display luminance and substantially without reflections from the reflective polariser 302. A high PDR value can be achieved and display information conveniently resolved by multiple users. Fresnel reflection 605 are still present as in conventional displays, and are at a customary low level. A high performance wide angle mode is provided.

Further arrangements of retarders will now be described.

Figure 11A:
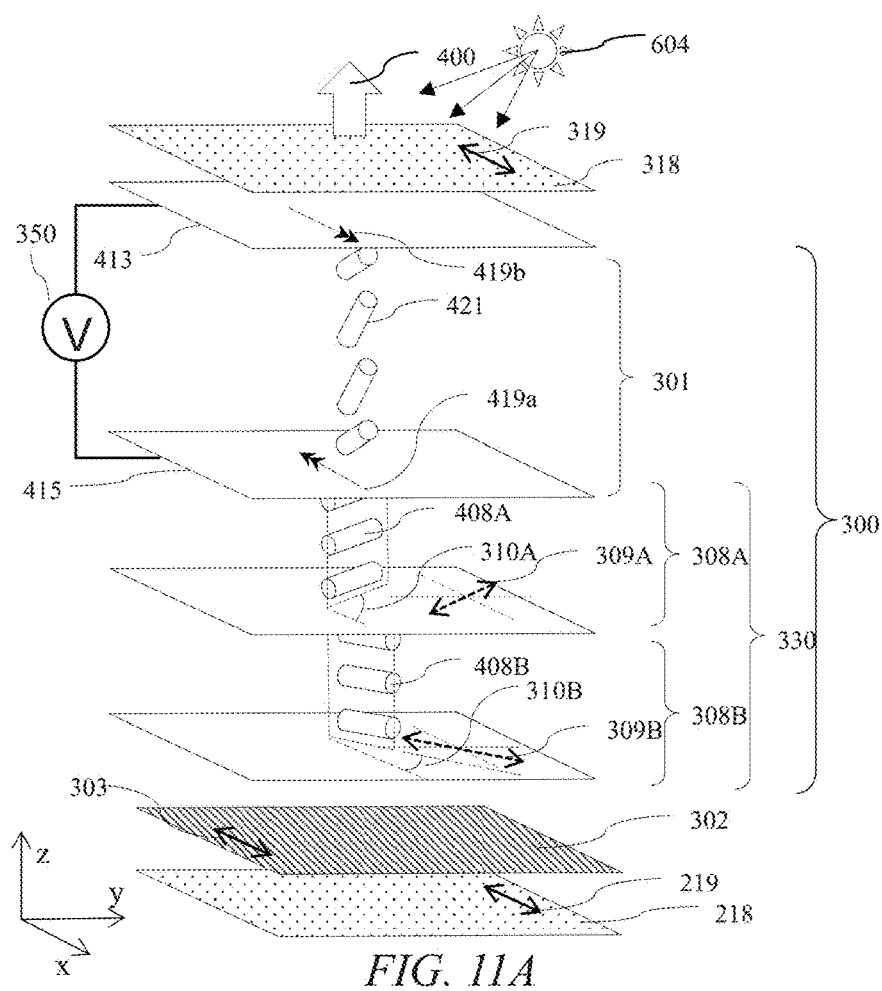
FIG. 11A is a schematic diagram illustrating in perspective side view an arrangement of a switchable retarder in a wide angle mode of operation wherein the switchable retarder comprises a switchable liquid crystal layer with homogeneous alignment and crossed A-plate compensation retarders.
Figure 11B:
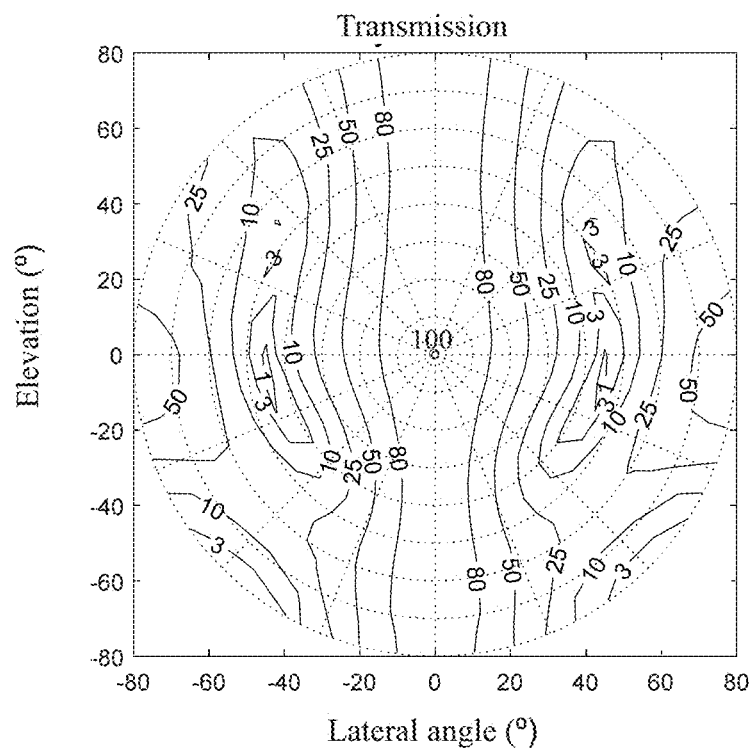
FIG. 11B is a schematic graph illustrating the variation of output luminance with polar direction for transmitted light rays in FIG. 11A in a privacy mode of operation.
Figure 11C:
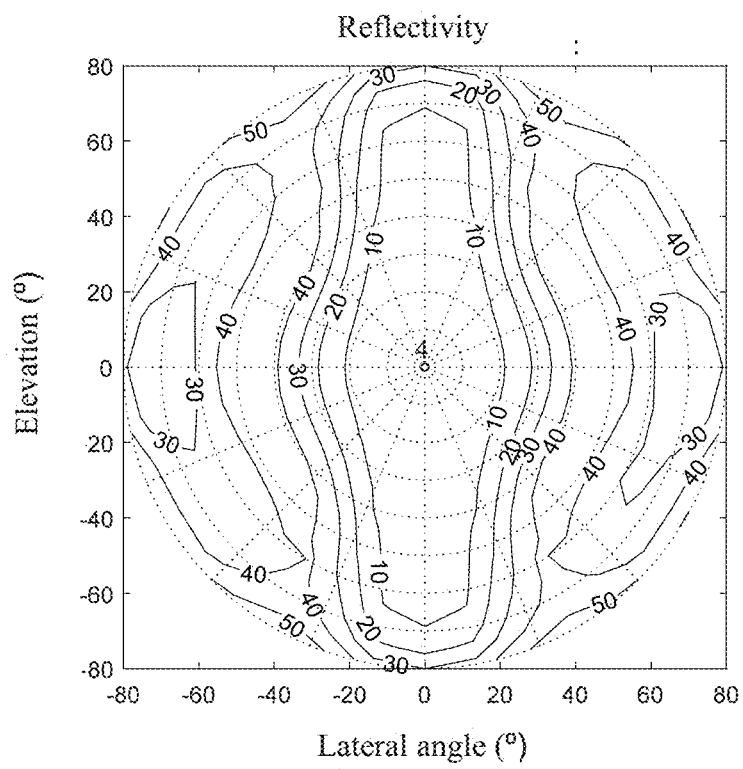
FIG. 11C is a schematic graph illustrating the variation in reflectivity with polar direction for reflected light rays in FIG. 11A in a privacy mode of operation.
Figure 11D:
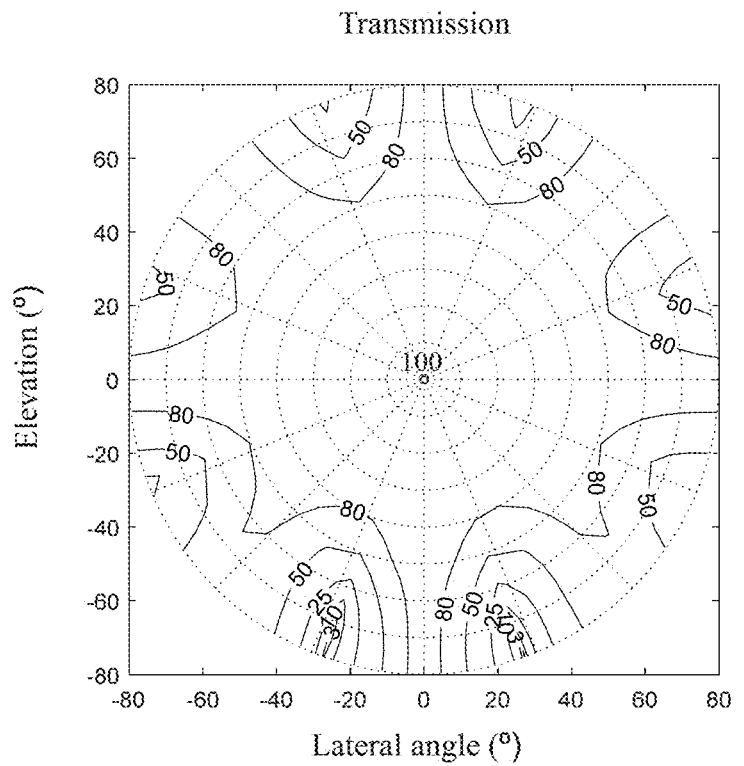
FIG. 11D is a schematic graph illustrating the variation of output luminance with polar direction for transmitted light rays in FIG. 11A in a wide angle mode of operation.
Figure 11E:
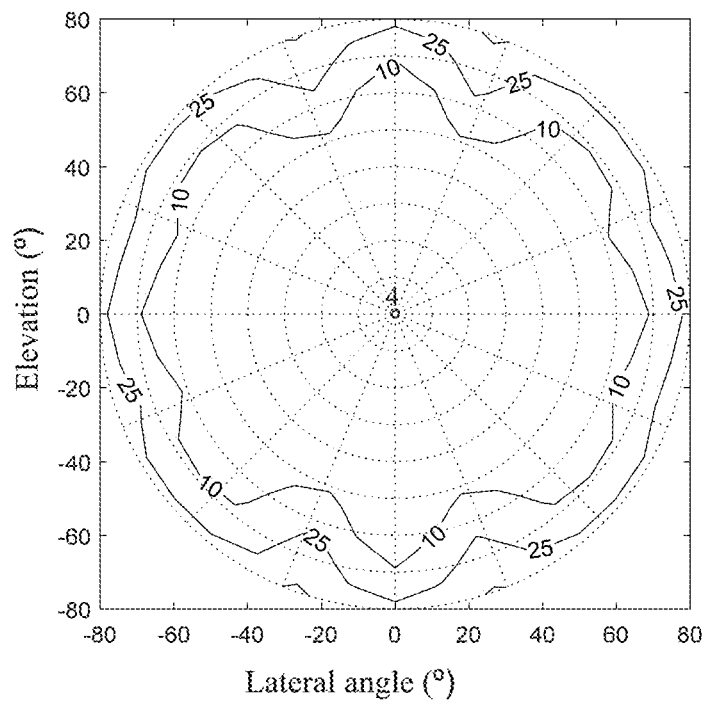
FIG. 11E is a schematic graph illustrating the variation in reflectivity with polar direction for reflected light rays in FIG. 11A in a wide angle mode of operation.

FIG. 11A is a schematic diagram illustrating in perspective side view an arrangement of a switchable retarder in a wide angle mode of operation wherein the switchable retarder comprises a switchable liquid crystal layer with homogeneous alignment and crossed A-plate compensation retarders; FIG. 11B is a schematic graph illustrating the variation of output luminance with polar direction for transmitted light rays in FIG. 11A in a privacy mode of operation; FIG. 11C is a schematic graph illustrating the variation in reflectivity with polar direction for reflected light rays in FIG. 11A in a privacy mode of operation; FIG. 11D is a schematic graph illustrating the variation of output luminance with polar direction for transmitted light rays in FIG. 11A in a wide angle mode of operation; and FIG. 11E is a schematic graph illustrating the variation in reflectivity with polar direction for reflected light rays in FIG. 11A in a wide angle mode of operation comprising the embodiments illustrated in TABLE 3.

TABLE 3

| | | Passive retarder(s) | | Active LC retarder | | | |
|---|---|---|---|---|---|---|---|
| FIG. | Mode | Type | Δn.d/ nm | Alignment layers | Pretilt/ deg | Δn.d/ nm | Δε | Voltage/V |
| 11D, 11E | Wide | Crossed A | +500 @ 45° | Homogeneous | 2 | 750 | 13.2 | 10 |
| 11A, 11B, 11C | Privacy | | +500 @ 135° | Homogeneous | 2 | | | 2.3 |

The switchable liquid crystal retarder 301 comprises two surface alignment layers 419a, 419b disposed adjacent to the layer of liquid crystal material 421 and on opposite sides thereof and each arranged to provide homogeneous alignment in the adjacent liquid crystal material 421. The layer 314 of liquid crystal material 421 of the switchable liquid crystal retarder 301 comprises a liquid crystal material 421 with a positive dielectric anisotropy. The layer of liquid crystal material 421 has a retardance for light of a wavelength of 550 nm in a range from 500 nm to 900 nm, preferably in a range from 600 nm to 850 nm and most preferably in a range from 700 nm to 800 nm. The retarder 330 further comprises a pair of passive retarders 308A, 308B which have optical axes in the plane of the retarders that are crossed, each passive retarder of the pair of passive retarders having a retardance for light of a wavelength of 550 nm in a range from 300 nm to 800 nm, preferably in a range from 350 nm to 650 nm and most preferably in a range from 450 nm to 550 nm.

In comparison to the embodiments of TABLE 1, the passive retarder 330 is provided by a pair of A-plates 308A, 308B that have crossed axes. In the present embodiments, 'crossed' refers to an angle of substantially 90° between the optical axes of the two retarders in the plane of the retarders.

To reduce cost of retarder materials, it is desirable to provide materials with some variation of retarder orientation due to stretching errors during film manufacture for example. Variations in retarder orientation away from preferable directions can reduce the head-on luminance and increase the minimum transmission. Preferably the angle 310A is at least 35° and at most 55°, more preferably at least 40° and at most 50° and most preferably at least 42.5° and at most 47.5°. Preferably the angle 310B is at least 125° and at most 145°, more preferably at least 130° and at most 135° and most preferably at least 132.5° and at most 137.5°.

In comparison to the embodiments of TABLE 1, the liquid crystal retarder alignment is provided by a homogeneous rather than homeotropic alignment. Homogeneous alignment advantageously provides reduced recovery time during mechanical distortion, such as when touching the display.

The passive retarders may be provided using stretched films to advantageously achieve low cost and high uniformity. Further field of view for liquid crystal retarders with homogeneous alignment is increased while providing resilience to the visibility of flow of liquid crystal material during applied pressure.

It may be desirable to provide the additional polariser 318 with a different electric vector transmission direction to the electric vector transmission direction of the output polariser 218 and reflective polariser 302.

Figure 12:
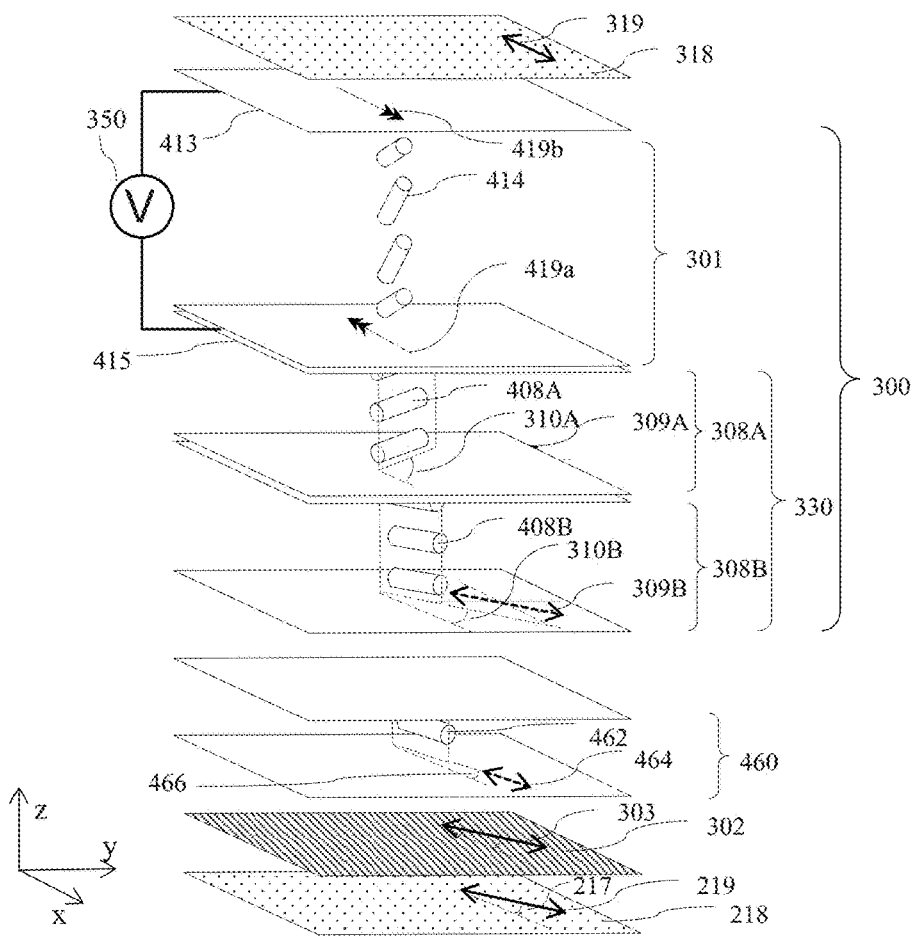
FIG. 12 is a schematic diagram illustrating in perspective side view an arrangement of a switchable compensated retarder in a privacy mode of operation comprising the crossed A-plate passive compensation retarders and homogeneously aligned switchable liquid crystal retarder, further comprising a passive rotation retarder.

FIG. 12 is a schematic diagram illustrating in perspective side view an arrangement of retarders 300 in a privacy mode of operation comprising the crossed A-plate passive compensation retarders 308A, 308B and homogeneously aligned switchable liquid crystal retarder 301, further comprising a passive rotation retarder 460.

The output polariser 218 and reflective polariser 302 may be provided with electric vector transmission directions 219, that may be for example at an angle 317 of 45 degrees in the case of a twisted nematic LCD display. The additional polariser 318 may be arranged to provide vertically polarised light to a user who may be wearing polarising sunglasses that typically transmit vertically polarised light.

The passive rotation retarder 460 is different to the compensation retarder 330 of the present embodiments and its operation will now be described.

Passive rotation retarder 460 may comprise a birefringent material 462 and be a half waveplate, with retardance at a wavelength of 550 nm of 275 nm for example.

Passive rotation retarder 460 has a fast axis orientation 464 that is inclined at an angle 466 that may be 22.5 degrees to the electric vector transmission direction 319 of the additional polariser 318. The passive rotation retarder 460 thus rotates the polarisation from the output polariser 218 such that the polarisation direction of the light that is incident onto the compensation retarder 308B is parallel to the direction 319.

The passive rotation retarder 460 modifies the on-axis polarisation state, by providing an angular rotation of the polarisation component from the output polariser 218. In comparison to the compensation retarders 308A, 308B together do not modify the on-axis polarisation state.

Further, the passive rotation retarder 460 provides a rotation of polarisation that may be substantially independent of viewing angle. In comparison the compensation retarders 308A, 308B provide substantial modifications of output luminance with viewing angle.

Advantageously a display may be provided with an output polarisation direction 319 that is different from the display polariser polarisation direction 219, for example to provide viewing with polarising sunglasses.

In other embodiments, the passive rotation retarder 460 may be provided between the display output polariser 218 and the reflective polariser 302 such that the electric vector transmission directions 303, 319 of the reflective polariser 302 and additional polariser 318 are parallel.

It would be desirable to further reduce the thickness of the retarder 330.

Figure 13A:
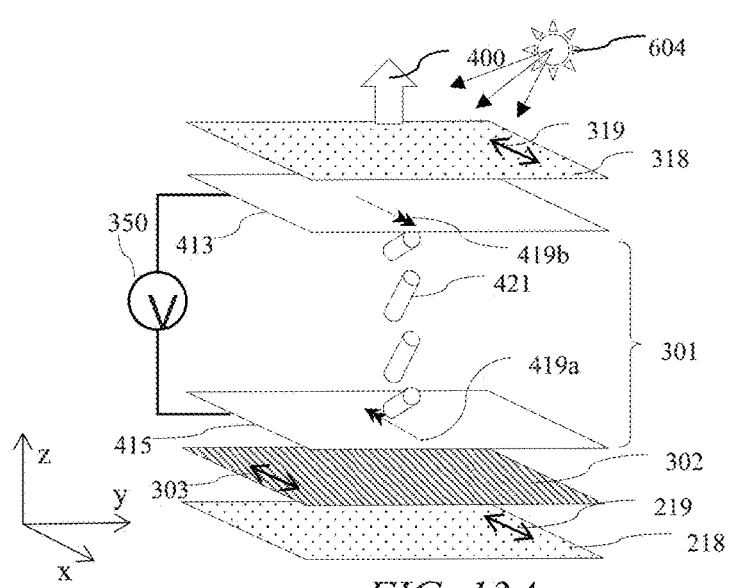
FIG. 13A is a schematic diagram illustrating in perspective side view an arrangement of a switchable retarder in a privacy mode of operation comprising a homogeneously aligned switchable liquid crystal retarder.
Figure 13B:
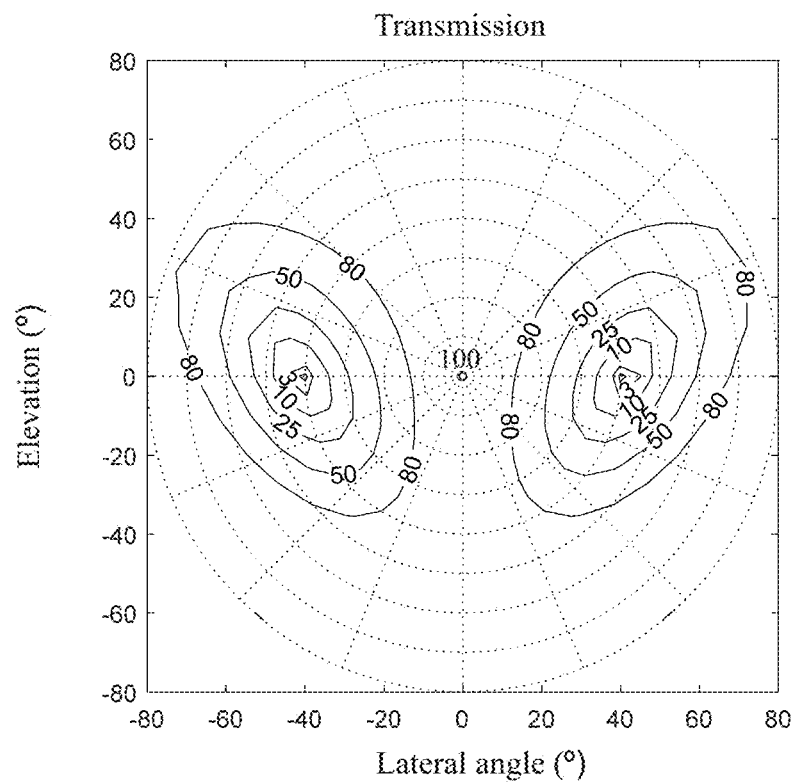
FIG. 13B is a schematic graph illustrating the variation of output luminance with polar direction for transmitted light rays in FIG. 13A in a privacy mode of operation.
Figure 13C:
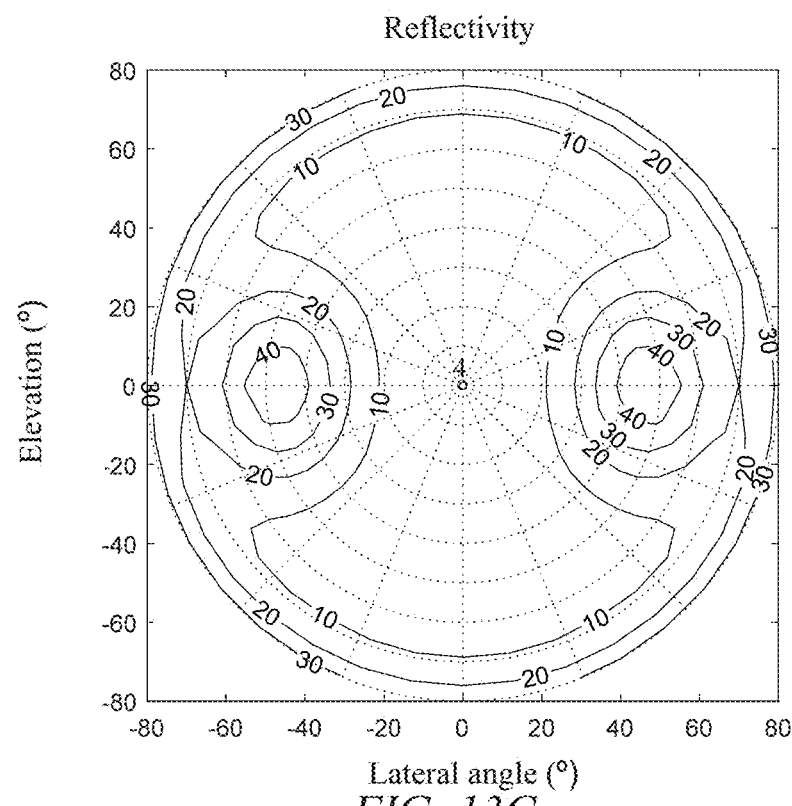
FIG. 13C is a schematic graph illustrating the variation in reflectivity with polar direction for reflected light rays in FIG. 13A in a privacy mode of operation.
Figure 13D:
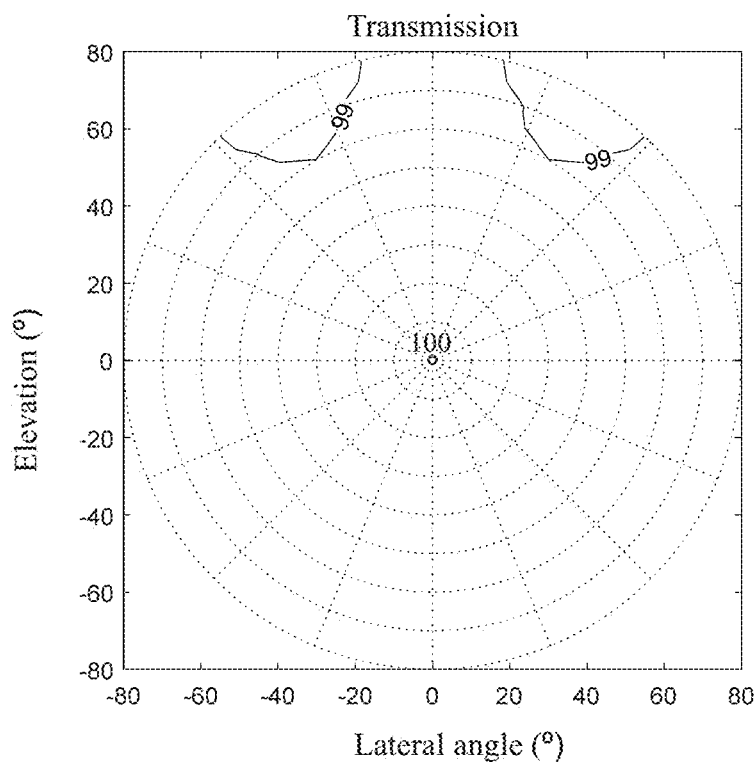
FIG. 13D is a schematic graph illustrating the variation of output luminance with polar direction for transmitted light rays in FIG. 13A in a wide angle mode of operation.
Figure 13E:
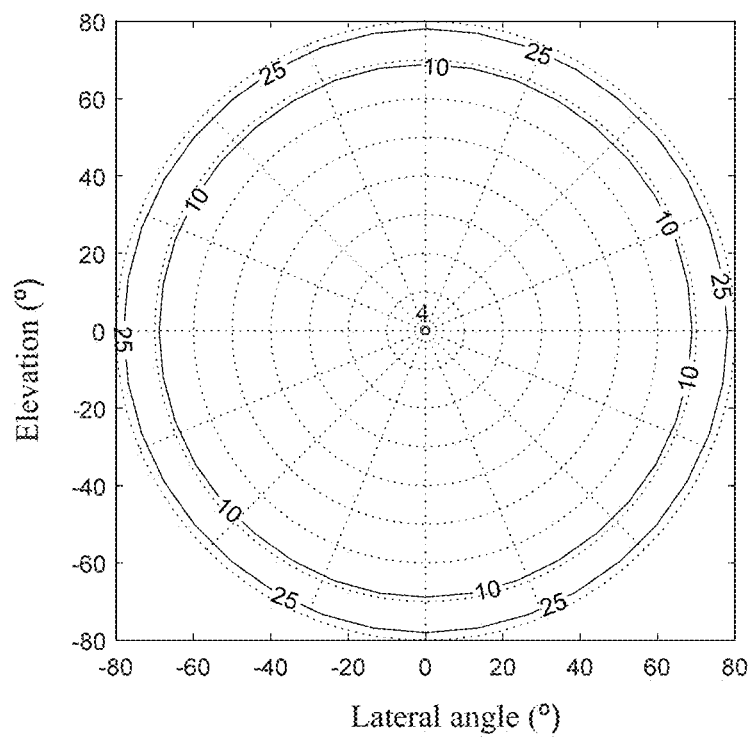
FIG. 13E is a schematic graph illustrating the variation in reflectivity with polar direction for reflected light rays in FIG. 13A in a wide angle mode of operation.

FIG. 13A is a schematic diagram illustrating in perspective side view an arrangement of a switchable retarder in a privacy mode of operation comprising a homogeneously aligned switchable liquid crystal retarder 301 in a privacy mode of operation. The switchable liquid crystal retarder 301 comprises surface alignment layers 419a, 419b disposed adjacent to the layer of liquid crystal material 421 and arranged to provide homogeneous alignment at the adjacent liquid crystal material 421. FIG. 13B is a schematic graph illustrating the variation of output luminance with polar direction for transmitted light rays in FIG. 13A in a privacy mode of operation; FIG. 13C is a schematic graph illustrating the variation in reflectivity with polar direction for reflected light rays in FIG. 13A in a privacy mode of operation; FIG. 13D is a schematic graph illustrating the variation of output luminance with polar direction for transmitted light rays in FIG. 13A in a wide angle mode of operation; and FIG. 13E is a schematic graph illustrating the variation in reflectivity with polar direction for reflected light rays in FIG. 13A in a wide angle mode of operation.

An illustrative embodiment of the arrangement of FIG. 13A is given in TABLE 4.

TABLE 4

| | | Active LC retarder | | | | |
|---|---|---|---|---|---|---|
| FIG. | Mode | Alignment layers | Pretilt/ deg | Δn.d/ nm | Δε | Voltage/V |
| 13D, 13E | Wide | Homogeneous | 1 | 900 | +15 | 0 |
| 13A, 13B, 13C | Privacy | Homogeneous | 1 | | | 2.4 |

The switchable liquid crystal retarder 301 comprises two surface alignment layers disposed adjacent to the layer of liquid crystal material and on opposite sides thereof and each arranged to provide homogeneous alignment in the adjacent liquid crystal material 414. The layer of liquid crystal material of the switchable liquid crystal retarder comprises a liquid crystal material with a positive dielectric anisotropy. The layer 314 of liquid crystal material 414 may have a retardance for light of a wavelength of 550 nm in a range from 500 nm to 1500 nm, preferably in a range from 700 nm to 1200 nm and most preferably in a range from 800 nm to 1000 nm.

The embodiments of FIGS. 13A-E advantageously achieve reduced cost and complexity as no passive retarder is provided. Further the wide angle mode may be an undriven state of the liquid crystal material of the layer 314 and a relatively low voltage is used in the privacy mode. Further, in comparison to homeotropic alignment, homogeneous alignment layers may advantageously provide reduced visibility of liquid crystal material flow that arises from handling of the display surface, for example when a touch panel is used.

Further display structures will now be described, comprising multiple optical stacks to achieve control of field of view of a privacy or low stray light display apparatus.

Figure 14:
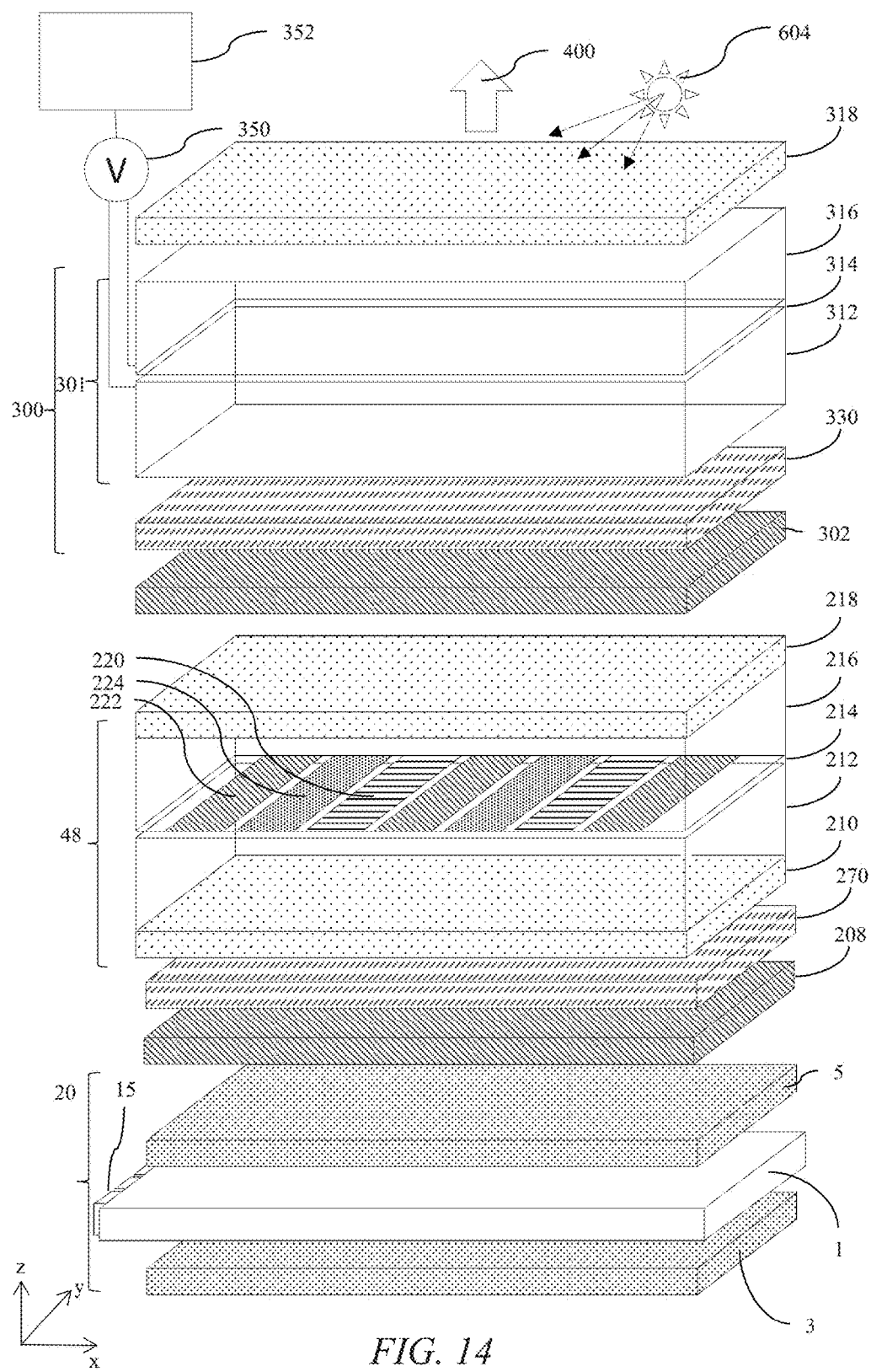
FIG. 14 is a schematic diagram illustrating in side perspective view a switchable privacy display for use in ambient illumination comprising a non-collimating backlight, a passive retarder arranged between a reflective recirculation polariser and a transmissive spatial light modulator, a reflective polariser, a compensated switchable retarder and additional polariser.

FIG. 14 is a schematic diagram illustrating in side perspective view a switchable privacy display for use in ambient illumination comprising a non-collimating backlight, a passive retarder arranged between a reflective recirculation polariser and a transmissive spatial light modulator, a reflective polariser, a compensated switchable retarder and additional polariser.

In comparison to the display of FIG. 1A, FIG. 14 further comprises a further retarder 270 and a further additional polariser 208, wherein the further retarder 270 is arranged between the input polariser 210 of the transmissive spatial light modulator 48 and the further additional polariser 318. The further retarder 270 may comprise a further passive retarder.

Advantageously the field of view of the display is modified to reduce off-axis transmission. The off-axis reflectivity to a snooper is unmodified. Stray light is reduced and privacy performance to a snooper is increased. The additional polariser 208 may be a reflective polariser. This is different to reflective polariser 302. Additional reflective polariser 208 provides light recirculation in the backlight 20, and does not increase front reflection in privacy mode. Advantageously efficiency is increased.

Figure 15:
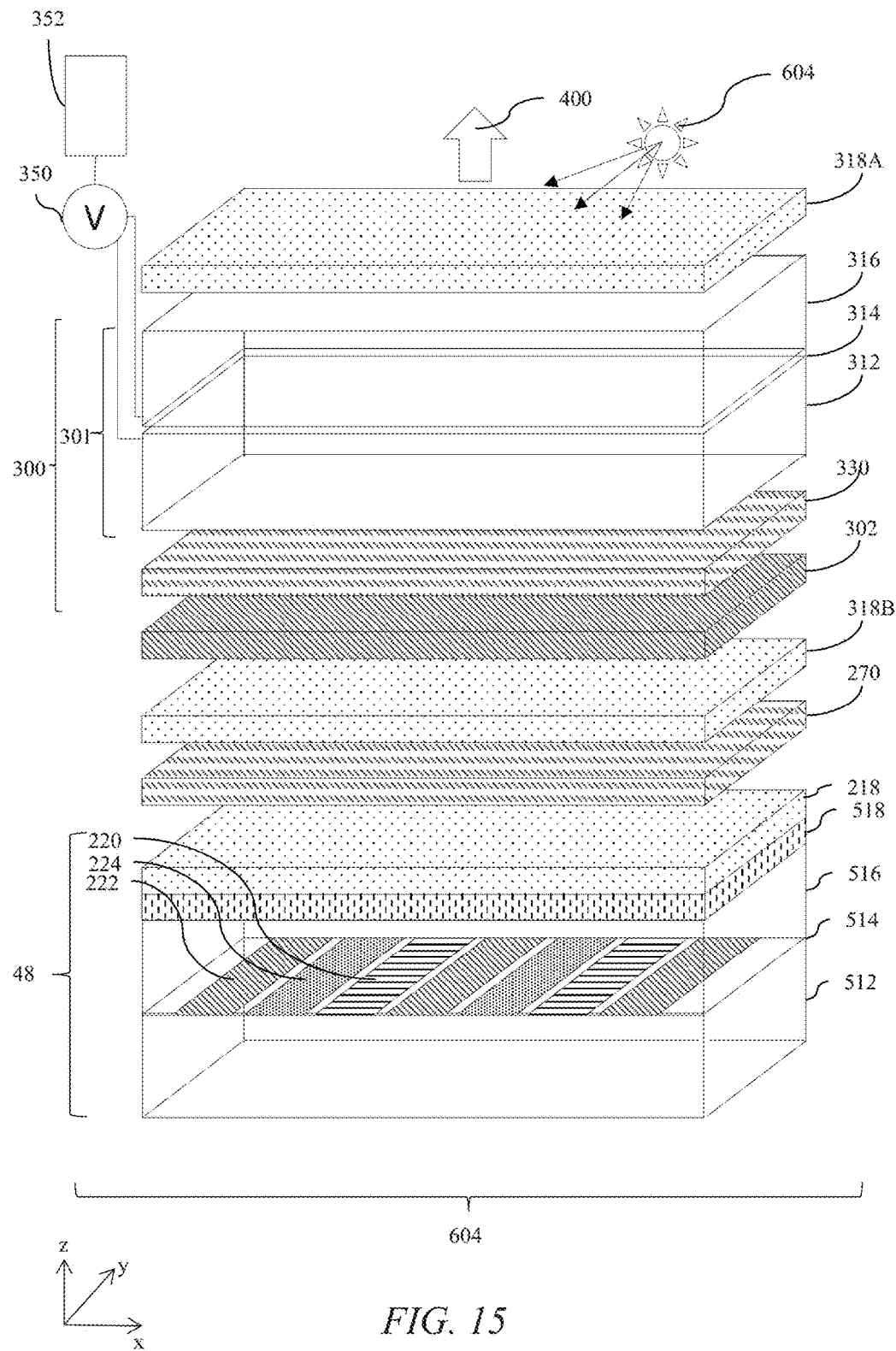
FIG. 15 is a schematic diagram illustrating in side perspective view a switchable privacy display for use in ambient illumination comprising an emissive spatial light modulator, a passive control retarder, a further additional polariser, a reflective polariser, a compensated switchable retarder and an additional polariser.

FIG. 15 is a schematic diagram illustrating in side perspective view a switchable privacy display for use in ambient illumination comprising an emissive spatial light modulator 48, a passive control retarder 270, a further additional polariser 318B, a reflective polariser 302, plural retarders 300 and an additional polariser 318A. A further retarder 270 is arranged between the output polariser 218 and the reflective polariser 302. A further additional polariser 318A is arranged between the further retarder 270 and the reflective polariser 302.

Figure 16:
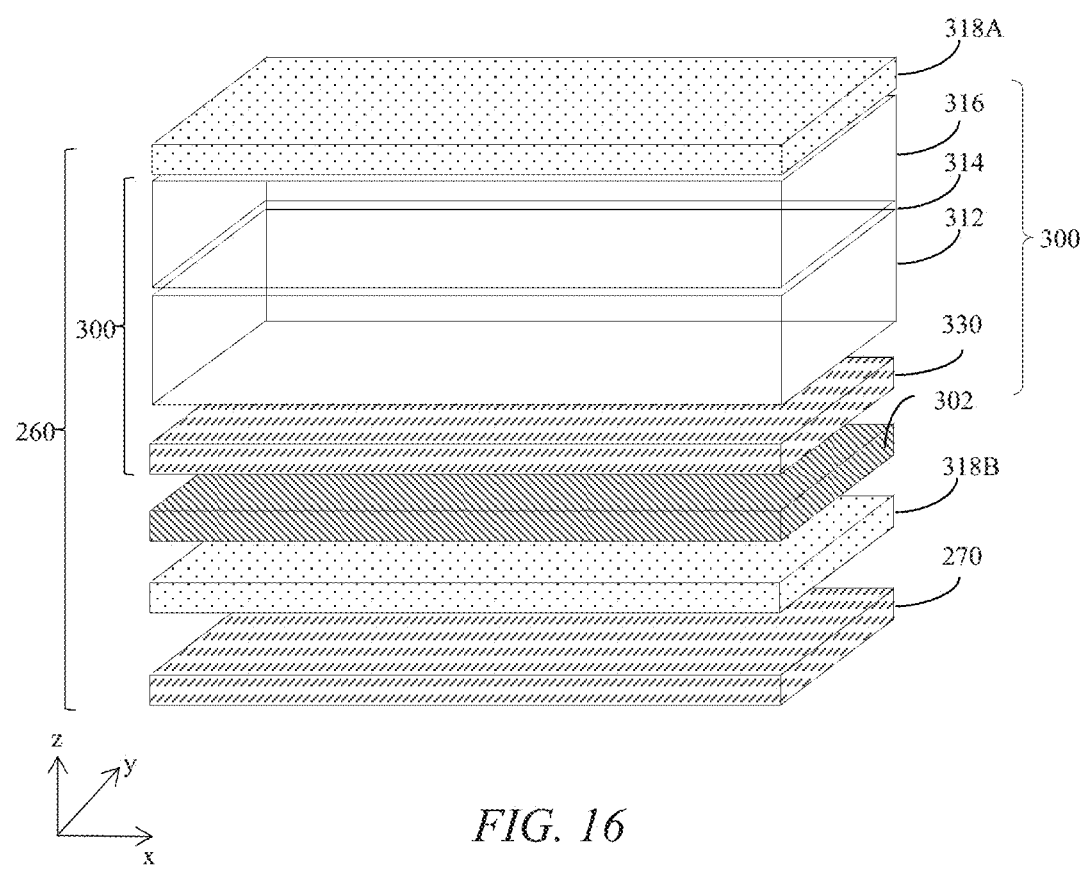
FIG. 16 is a schematic diagram illustrating in side perspective view a view angle control element comprising a passive control retarder, a first additional polariser, a reflective polariser, a passive compensation retarder, a switchable liquid crystal retarder and a second additional polariser.

FIG. 16 is a schematic diagram illustrating in side perspective view a view angle control element 260 for an emissive display.

In operation, light from the display polariser 218 has a field-of-view modification from the retarder 270 and further additional polariser 318B. Advantageously, the field of view from the emissive display is reduced. The reflective polariser 302, retarders 300 and an additional polariser 318A provide switching between a wide angle mode that is determined by the spatial light modulator 48, retarder 270 and further additional polariser 318B and a privacy mode with high off-axis reflectivity and reduced off-axis luminance in comparison to that achieved by the display 100 of FIG. 1B.

In comparison to the display of FIG. 1B, FIG. 15 further comprises a further retarder 270 and a further additional polariser 208, wherein the further retarder 270 is arranged between the first-mentioned additional polariser and the further additional polariser 318.

Figure 17A:
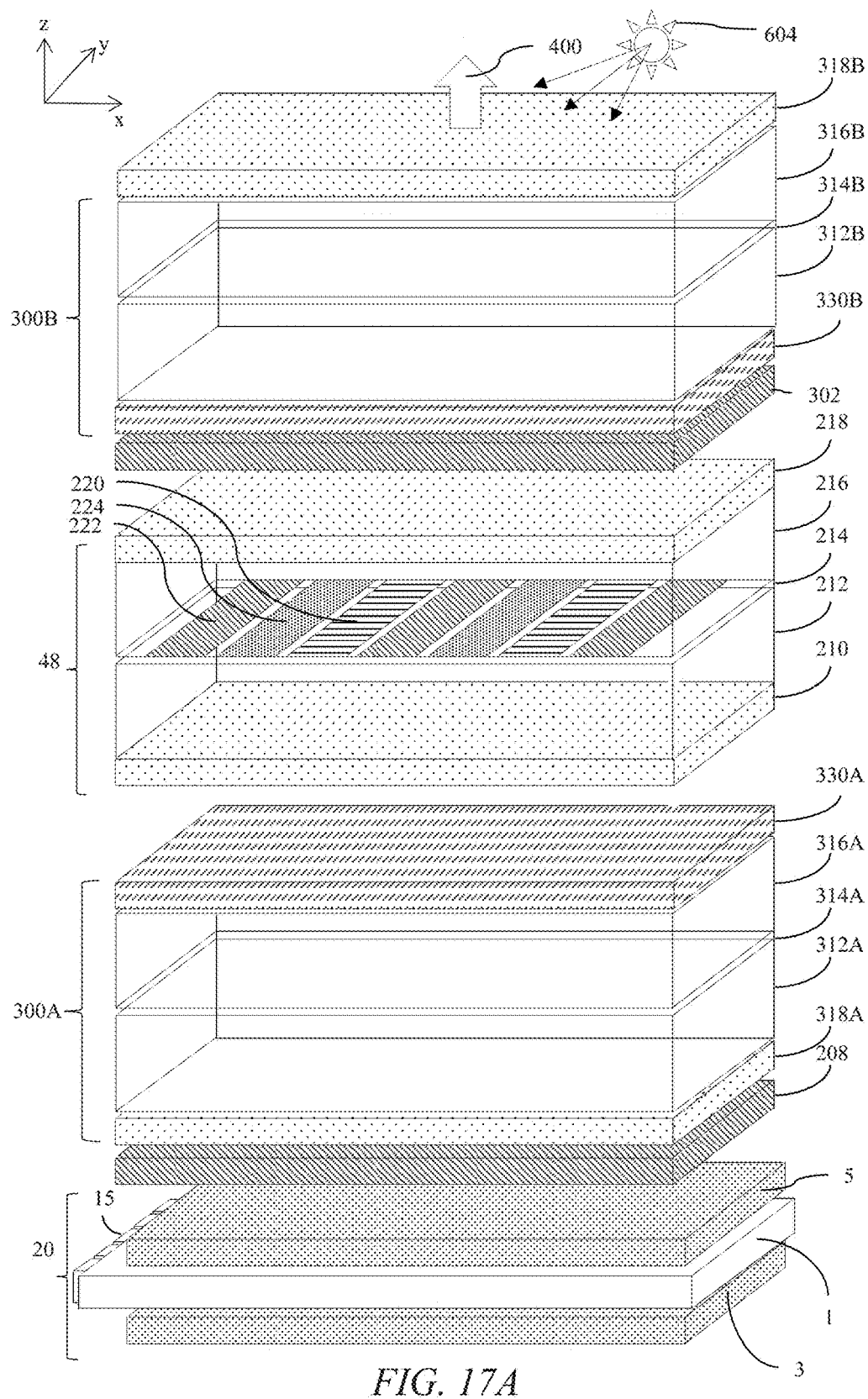
FIG. 17A is a schematic diagram illustrating in side perspective view a switchable privacy display for use in ambient illumination comprising a non-collimating backlight, a first additional polariser and a compensated switchable retarder arranged between a reflective recirculation polariser and a transmissive spatial light modulator, a reflective polariser, a compensated switchable retarder and a second additional polariser.

FIG. 17A is a schematic diagram illustrating in side perspective view a switchable privacy display 100 for use in ambient illumination 604 comprising a non-collimating backlight 20, a first additional polariser 318A and first plural retarders 300A arranged between a reflective recirculation polariser 208 and a transmissive spatial light modulator. A reflective polariser 302, a second plural retarders 300B and a second additional polariser 318B is arranged to receive light from the output polariser 218 of the spatial light modulator 48. In comparison to FIG. 14 in which the retarder 208 may be a passive retarder, the wide angle field of view of the display is increased by control of both liquid crystal layers 314A, 314B. Further, off-axis reflectivity is increased in privacy mode by reflective polariser 302 as described elsewhere herein.

Further a non-collimated backlight 20 may be provided as will be described further below. Non-collimated backlights may have reduced sensitivity to tooling and replication errors and may have lower cost.

Figure 17B:
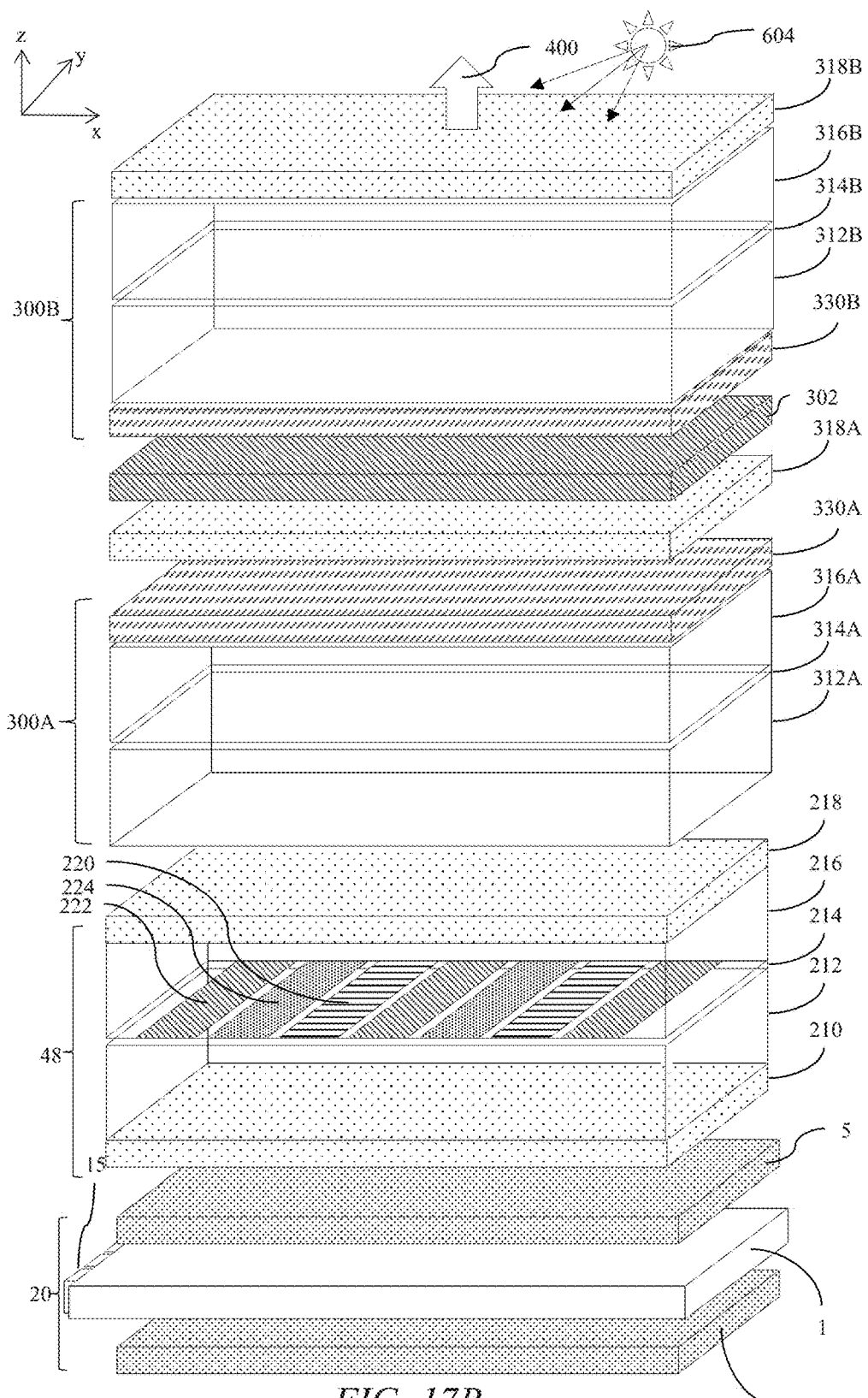
FIG. 17B is a schematic diagram illustrating in side perspective view a switchable privacy display for use in ambient illumination comprising a non-collimating backlight, a transmissive spatial light modulator, a first compensated switchable liquid crystal retarder, a first additional polariser, a reflective polariser, a second compensated switchable liquid crystal retarder and a second additional polariser.
Figure 17C:
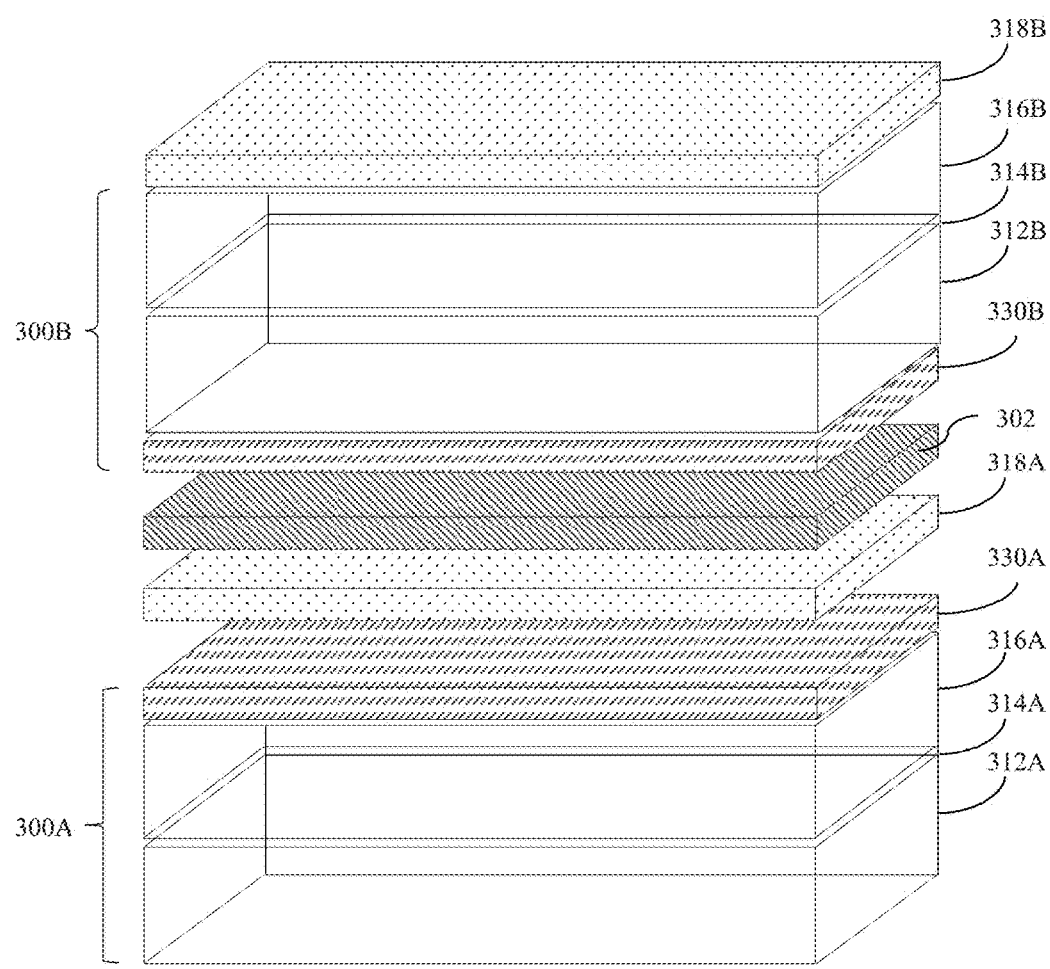
FIG. 17C is a schematic diagram illustrating in side perspective view a view angle control element comprising a first compensated switchable liquid crystal retarder, a first additional polariser, a reflective polariser, a second compensated switchable liquid crystal retarder, and a second additional polariser.

FIG. 17B is a schematic diagram illustrating in side perspective view a switchable privacy display for use in ambient illumination comprising a non-collimating backlight 20, a transmissive spatial light modulator 48, a first plural retarders 300A, a first additional polariser 318A, a reflective polariser 302, a second plural retarders 300B and a second additional polariser 318B. FIG. 17C is a schematic diagram illustrating in side perspective view a view angle control element comprising a first plural retarders 300A, a first additional polariser 318A, a reflective polariser 302, a second retarders 300B and a second additional polariser 318B.

In comparison to the arrangement of FIG. 17A, reduced luminance for off-axis viewing locations may be advantageously provided as scatter from the spatial light modulator 48 does not modify the field of view. Further a single optical component stack may be provided for convenient aftermarket or factory fitting.

The operation of the optical stack of FIGS. 17A-C will now be further described.

Figure 17D:
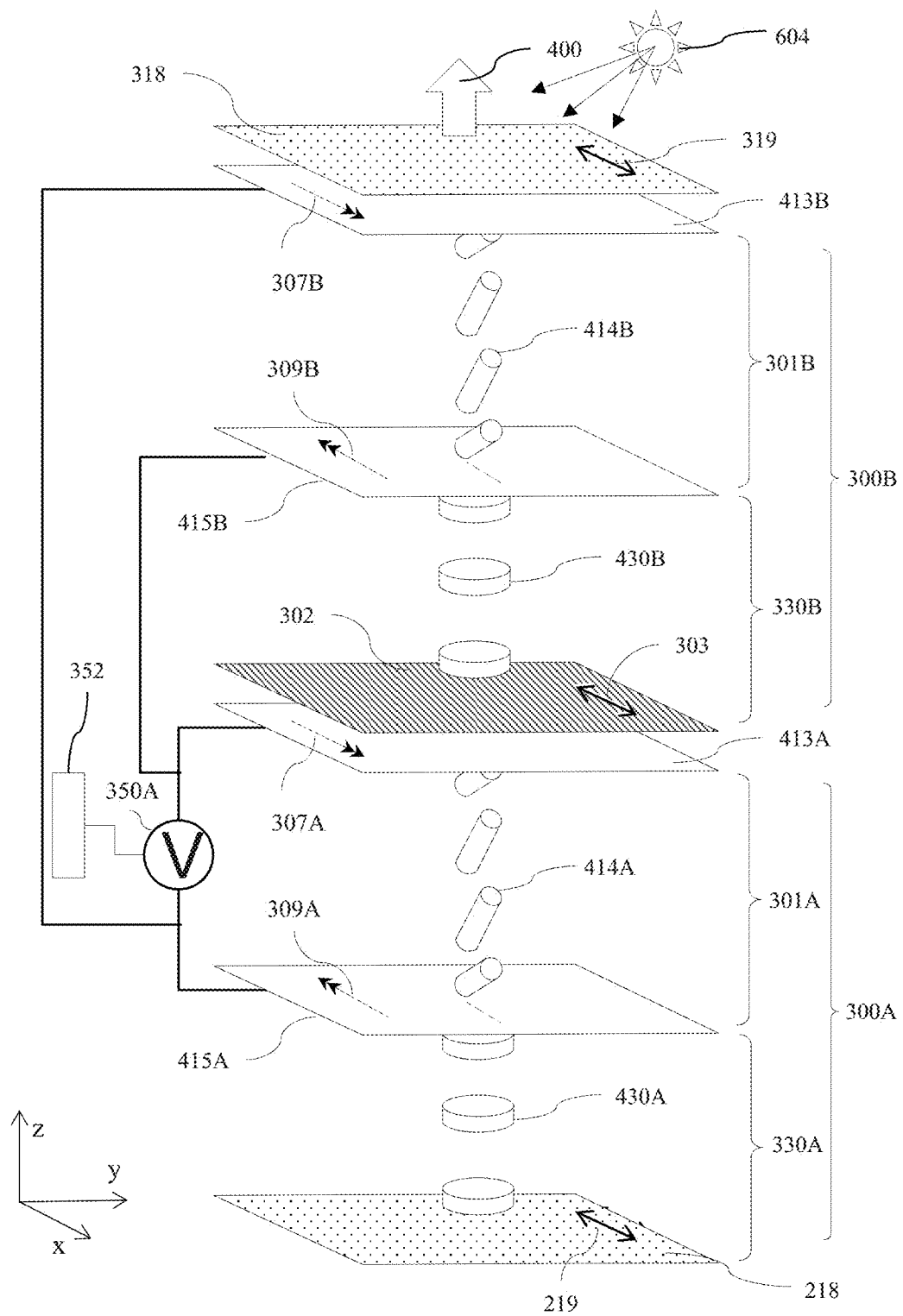
FIG. 17D is a schematic diagram illustrating in perspective side view an arrangement of a switchable retarder in a privacy mode of operation comprising a first negative C-plate passive retarder and first homogeneously aligned switchable liquid crystal retarder arranged between the output polariser and a reflective polariser; and a second negative C-plate passive retarder and second homogeneously aligned switchable liquid crystal retarder arranged between the reflective polariser and a further additional polariser.

FIG. 17D is a schematic diagram illustrating in perspective side view an arrangement of a switchable retarder in a privacy mode of operation comprising a negative C-plate passive retarder 330A and homogeneously aligned switchable liquid crystal retarder 301A arranged between the output polariser 218 and reflective polariser 302 and a negative C-plate passive retarder 330B and homogeneously aligned switchable liquid crystal retarder 301B arranged between the absorptive polariser 318 and reflective polariser 302 in a privacy mode of operation. Thus the display device may further comprise a retardance control layer 300A arranged between the output polariser 218 and the reflective polariser 302. The retardance control layer 300A may comprise a further switchable liquid crystal retarder 301A arranged between the output polariser 218 and the reflective polariser 302.

The first-mentioned plural retarders 300B comprise a first switchable liquid crystal retarder 301B comprising a first layer of liquid crystal material 414B, and the further plural retarders 300A comprises a second switchable liquid crystal retarder 301A comprising a second layer of liquid crystal material 414A. The further switchable liquid crystal retarder 301A comprises a surface alignment layer 307A disposed adjacent the liquid crystal material 414A having a pretilt having a pretilt direction with a component in the plane of the layer of liquid crystal material that is aligned parallel or antiparallel or orthogonal to the reflective polariser.

The pretilt directions 307A, 309A of the alignment layers of the further switchable liquid crystal retarder 301A may have a component in the plane of the liquid crystal layer 314A that is aligned parallel or antiparallel or orthogonal to the pretilt directions of the alignment layers 307B, 309B of the first switchable liquid crystal retarder 301B. In a wide mode of operation, both switchable liquid crystal layers 301B, 301A are driven to provide a wide viewing angle. In a privacy mode of operation, switchable liquid crystal retarders 301A, 301B may cooperate to advantageously achieve increased luminance reduction and thus improved privacy in a single axis.

The first and second liquid crystal retarders 301A, 301B may have retardances that are different. The retardation provided by the first liquid crystal retarder 301B and further liquid crystal layer 314A may be different. The control system 352 may be arranged to control apply a common voltage across the first and second switchable liquid crystal retarders 301A, 301B. The liquid crystal material 414B of the first liquid crystal retarder 301B may be different from the liquid crystal material 414A of the second liquid crystal layer 301A. Chromatic variation of the polar luminance profiles illustrated elsewhere herein may be reduced, so that advantageously off-axis colour appearance is improved.

Alternatively, switchable liquid crystal retarders 301A, 301B may have orthogonal alignments so that reduced luminance is achieved in both horizontal and vertical directions, to advantageously achieve landscape and portrait privacy operation.

The retardance control layer 300A may comprise a passive retarder 330A arranged between the output polariser 218 and the reflective polariser 302. More generally, the switchable liquid crystal retarder 301A may be omitted and a fixed luminance reduction may be provided by passive retarders 330A. For example, luminance reduction in viewing quadrants may be provided by means of layer 330A alone. Advantageously polar region for luminance reduction may be achieved.

It may be desirable to provide both entertainment and night-time modes of operation in an automotive vehicle.

Figure 18A:
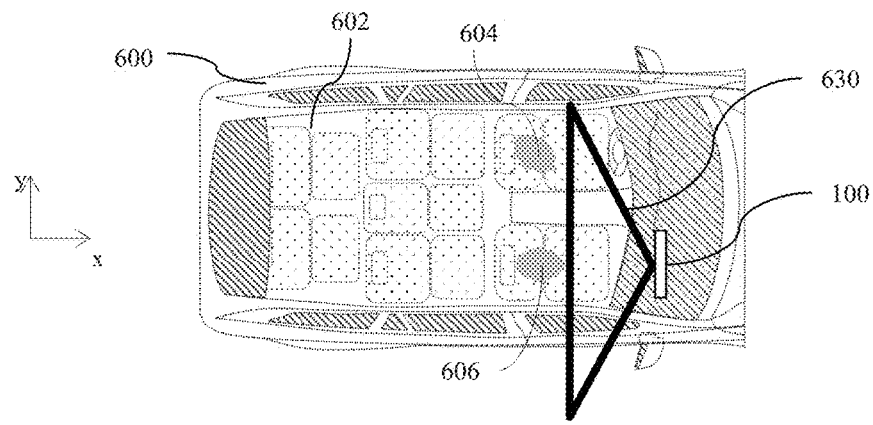
FIG. 18A is a schematic diagram illustrating in top view an automotive vehicle with a switchable directional display arranged within the vehicle cabin for day-time and/or sharing modes of operation.
Figure 18B:
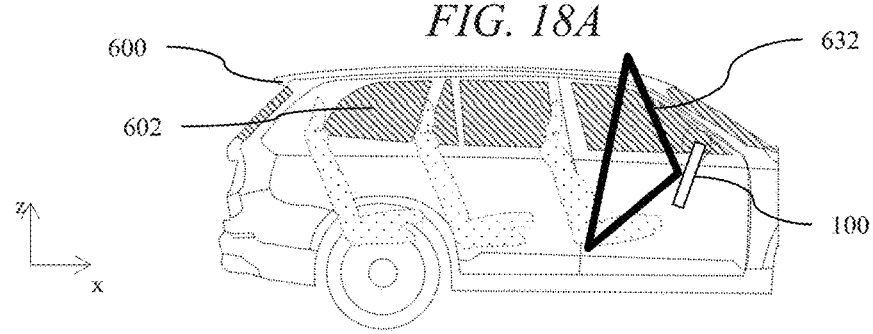
FIG. 18B is a schematic diagram illustrating in side view an automotive vehicle with a switchable directional display arranged within the vehicle cabin for day-time and/or sharing modes of operation.
Figure 18C:
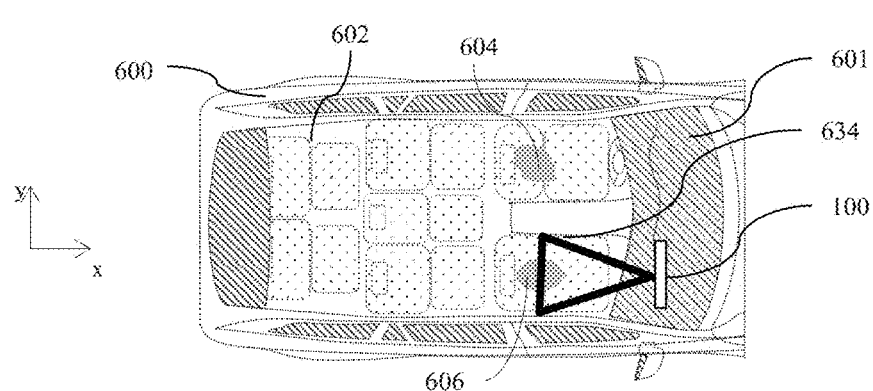
FIG. 18C is a schematic diagram illustrating in top view an automotive vehicle with a switchable directional display arranged within the vehicle cabin for night-time and/or entertainment modes of operation.
Figure 18D:
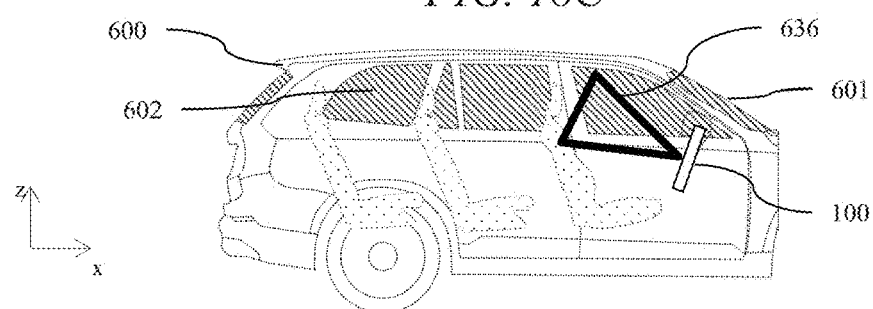
FIG. 18D is a schematic diagram illustrating in side view an automotive vehicle with a switchable directional display arranged within the vehicle cabin for night-time and/or entertainment modes of operation.

FIG. 18A is a schematic diagram illustrating in top view an automotive vehicle with a switchable directional display such as that illustrated in FIGS. 17A-B arranged within the vehicle cabin 602 for day-time and/or sharing modes of operation; and FIG. 18B is a schematic diagram illustrating in side view an automotive vehicle with a switchable directional display arranged within the vehicle cabin 602 for day-time and/or sharing modes of operation. Light cone 630, 632 is provided with a wide angular field of view and thus the display is advantageously visible by multiple occupants with low reflectivity. FIG. 18C is a schematic diagram illustrating in top view an automotive vehicle with a switchable directional display such as that illustrated in FIGS. 17A-B arranged within the vehicle cabin 602 for night-time and/or entertainment modes of operation; FIG. 18D is a schematic diagram illustrating in side view an automotive vehicle with a switchable directional display arranged within the vehicle cabin 602 for night-time and/or entertainment modes of operation. Light cone 634, 636 is provided with a narrow angular field of view and thus the display is advantageously visible only by a single occupant. Off-axis occupants further see increased reflections from the display, reducing visibility. Advantageously stray light for night-time operation is reduced, increasing driver safety. Further, reflections of the display from windscreen 601 are reduced, minimising distraction to the driver 604.

Displays 100 comprising retarders 300 that are passive retarders 270 and comprising reflective polariser 302 and additional polariser 318 will now be further described. The embodiments of FIGS. 19A-D illustrate passive retarder stack 270 that comprises four passive retarders as will be illustrated in FIGS. 22A-B below. However, other types of passive retarder stacks will also be described below and may be incorporated.

Figure 19A:
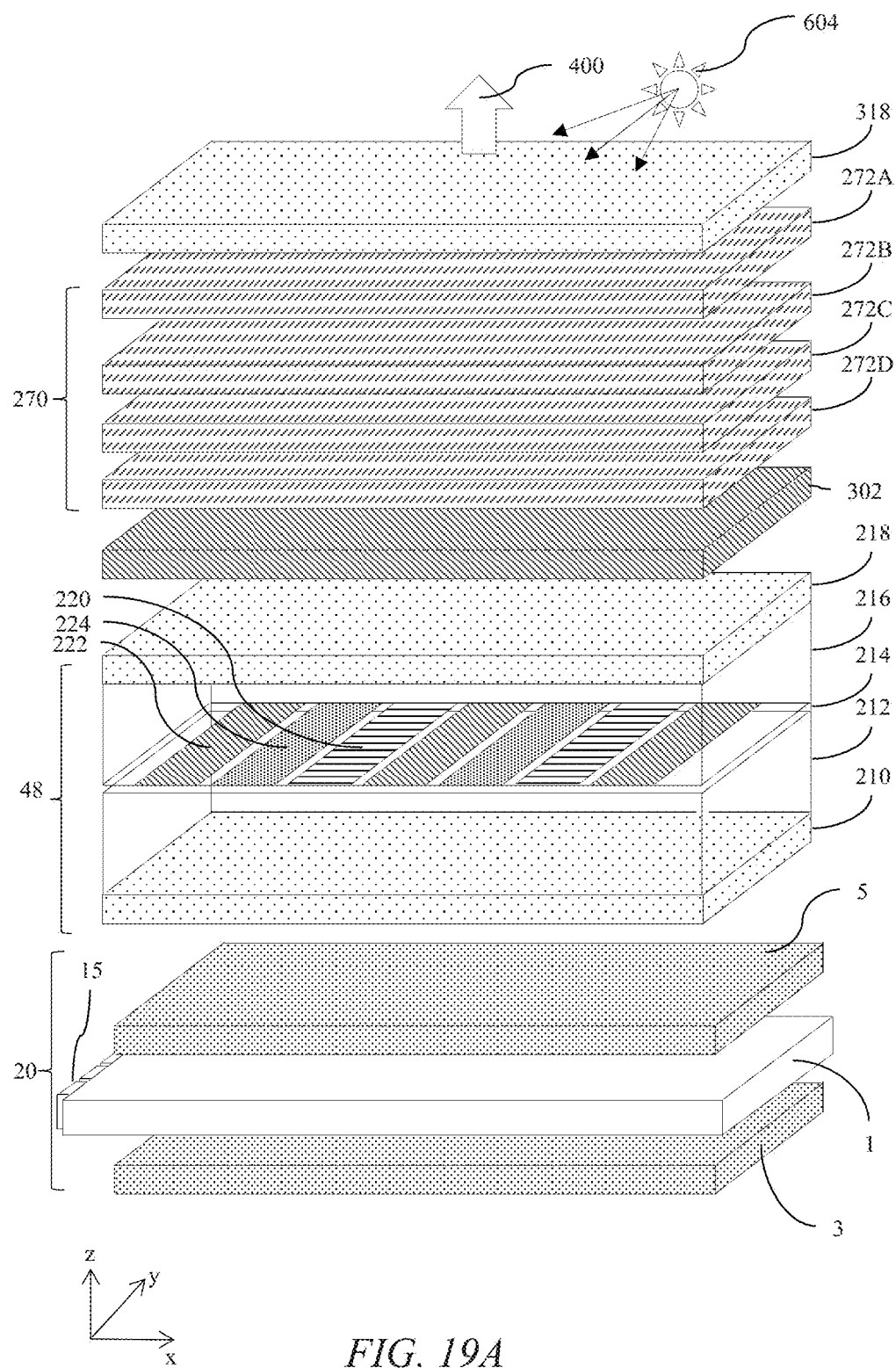
FIG. 19A is a schematic diagram illustrating in side perspective view a privacy display for use in ambient illumination comprising a backlight, a transmissive spatial light modulator, a reflective polariser, a retarder stack and an additional polariser.
Figure 19B:
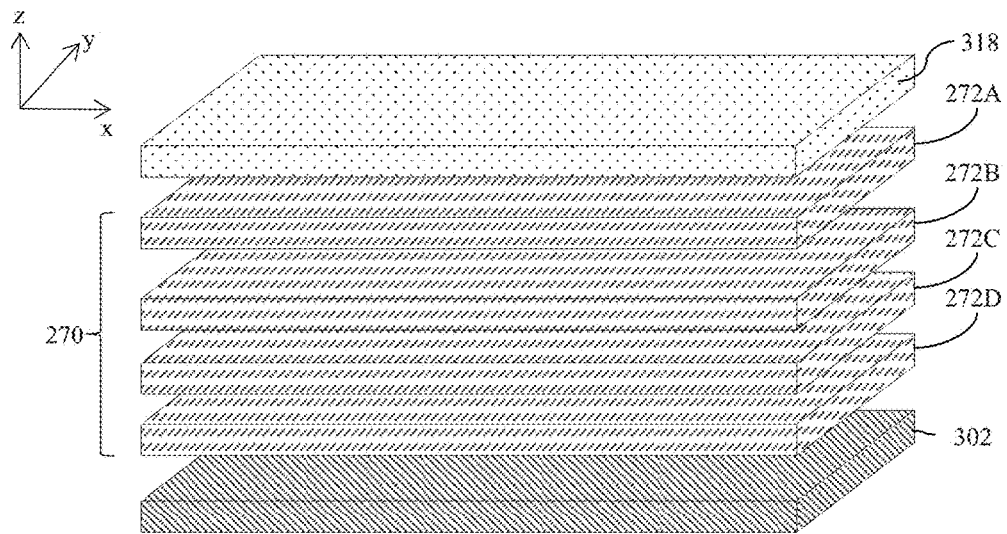
FIG. 19B is a schematic diagram illustrating in side perspective view a view angle control element comprising a reflective polariser, a retarder stack and an additional polariser.

FIG. 19A is a schematic diagram illustrating in side perspective view a privacy display 100 for use in ambient illumination 604 comprising a backlight 20, a transmissive spatial light modulator 48, a reflective polariser 302, a passive retarder stack 270 comprising passive retarders 272A, 272B, 272C and 272D; and additional polariser 318; and FIG. 19B is a schematic diagram illustrating in side perspective view a view angle control element comprising a reflective polariser 302, a passive retarder stack 270 and an additional polariser 318.

The operation of such a display is described elsewhere herein. Advantageously a low cost privacy or other type of low stray light display may be provided. Further the complexity and thickness of the display is reduced in comparison to switchable displays 100.

Figure 19C:
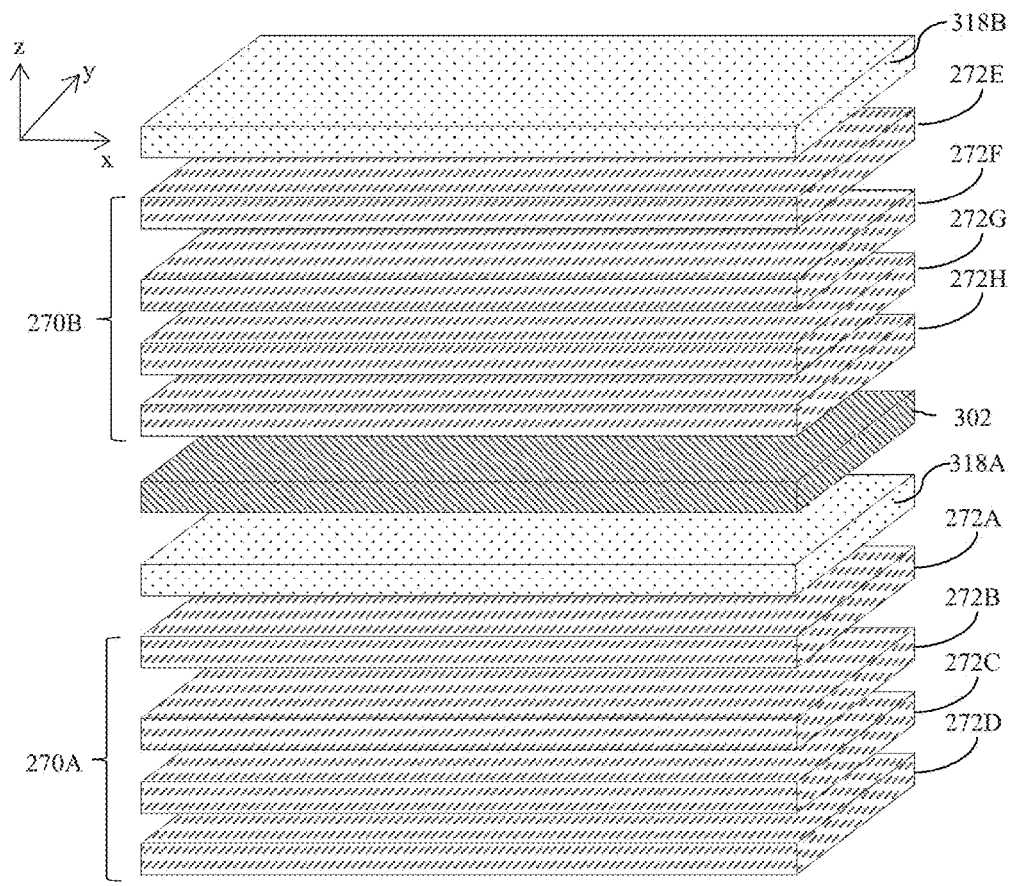
FIG. 19C is a schematic diagram illustrating in side perspective view a view angle control element comprising a first retarder stack and an additional polariser; a reflective polariser; a second retarder stack and a further additional polariser.

FIG. 19C is a schematic diagram illustrating in side perspective view a view angle control element comprising a first retarder stack 270A and a further additional polariser 318A; a reflective polariser 302; a second retarder stack 270B and additional polariser 318B. In comparison to the stack of FIG. 19B, off-axis luminance may be further reduced while head-on luminance may be substantially maintained.

Figure 19D:
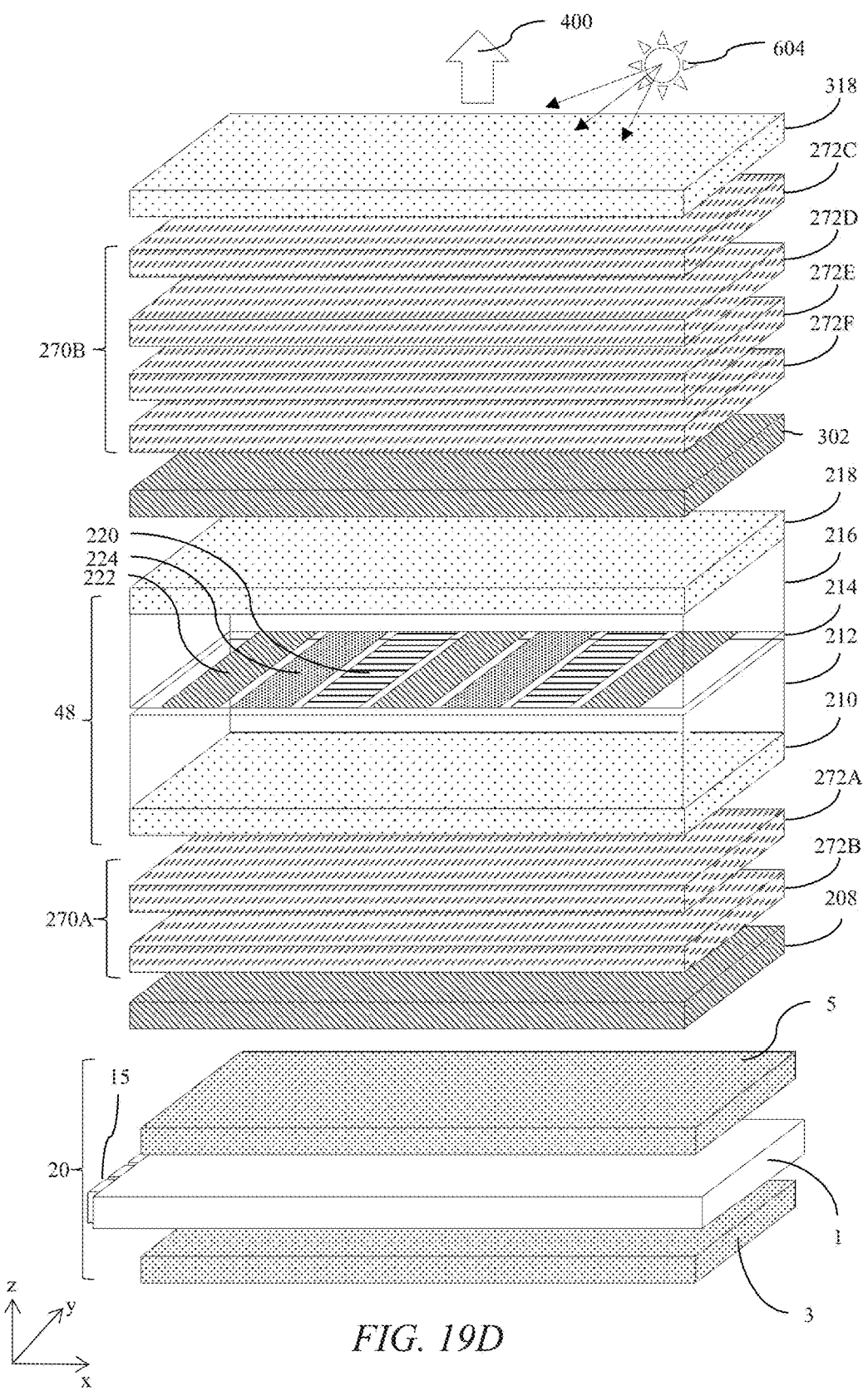
FIG. 19D is a schematic diagram illustrating in side perspective view a privacy display for use in ambient illumination comprising a backlight, a reflective recirculation polariser, an input retarder stack, a transmissive spatial light modulator, a reflective polariser, a retarder stack and an additional polariser.

FIG. 19D is a schematic diagram illustrating in side perspective view a privacy display for use in ambient illumination comprising a backlight 20, a reflective recirculation polariser 208, a further input retarder stack 270A comprising retarders 272A, 272B, a transmissive spatial light modulator 48, a reflective polariser 302, a retarder stack 270B and an additional polariser 318. Advantageously the reflective recirculation polariser 208 (that is different in function to reflective polariser 302) may provide the further additional polariser, to achieve high efficiency and reduced field of view for privacy operation.

Various passive retarders 270 will now be described.

Figure 20A:
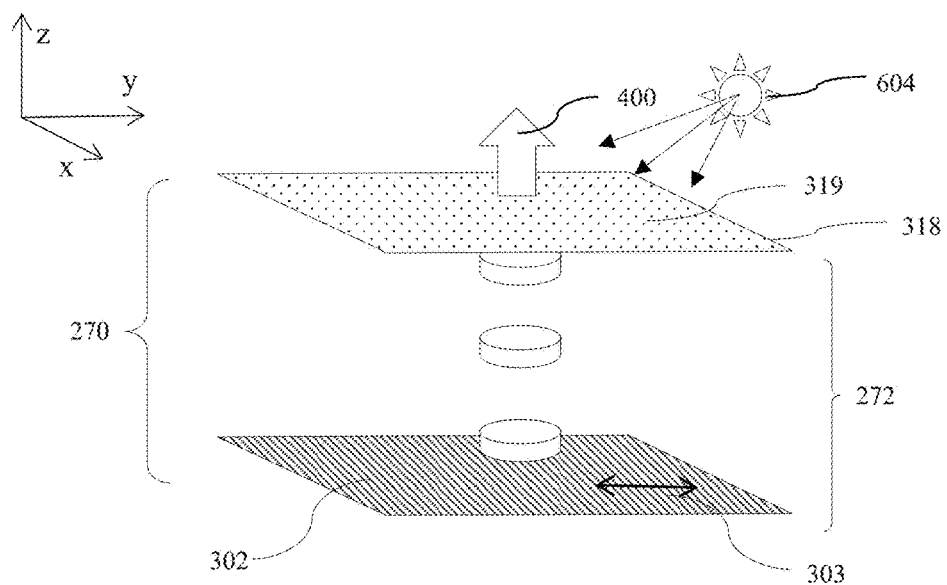
FIG. 20A is a schematic diagram illustrating in side perspective view an optical stack of a passive retarder comprising a negative C-plate and arranged to provide field-of-view modification of a display device.
Figure 20B:
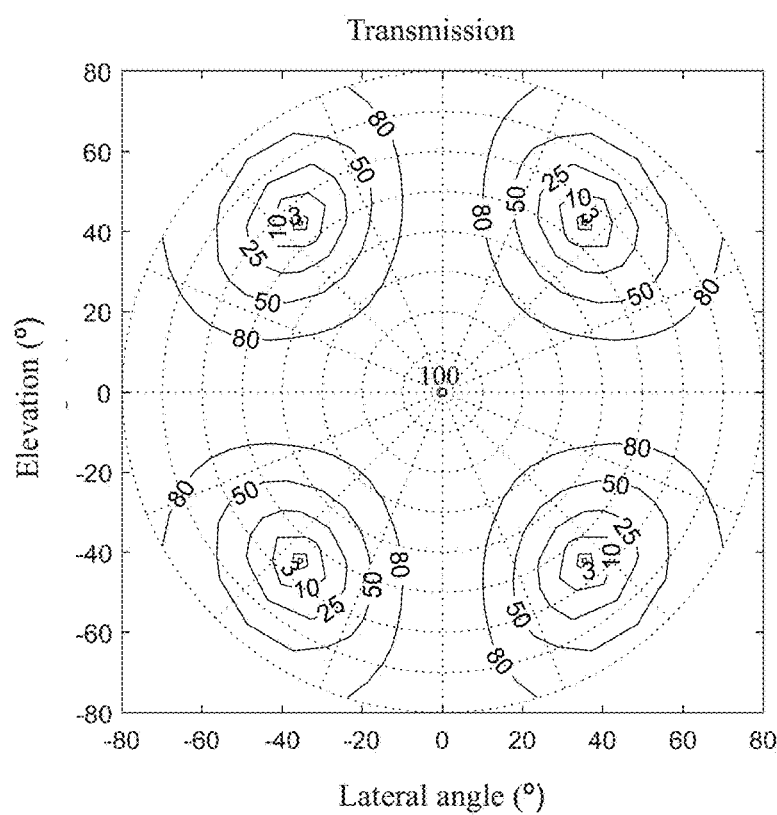
FIG. 20B is a schematic graph illustrating the variation of output transmission with polar direction for transmitted light rays in the passive retarder of FIG. 20A.

FIG. 20A is a schematic diagram illustrating in side perspective view an optical stack of a passive retarder comprising a negative C-plate and arranged to provide field-of-view modification of a display device; and FIG. 20B is a schematic graph illustrating the variation of output transmission with polar direction for transmitted light rays in the passive retarder of FIG. 20A.

Figure 20C:
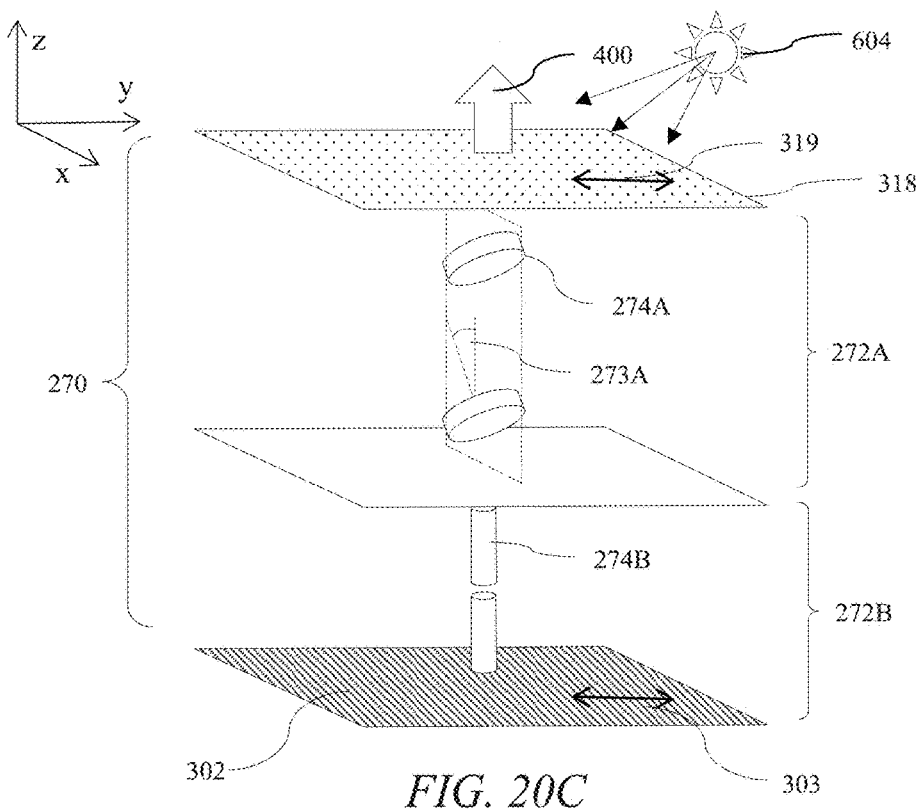
FIG. 20C is a schematic diagram illustrating in side perspective view an optical stack of a passive retarder comprising a negative O-plate tilted in a plane orthogonal to the display polariser electric vector transmission direction and a negative C-plate and arranged to provide field-of-view modification of a display device.
Figure 20D:
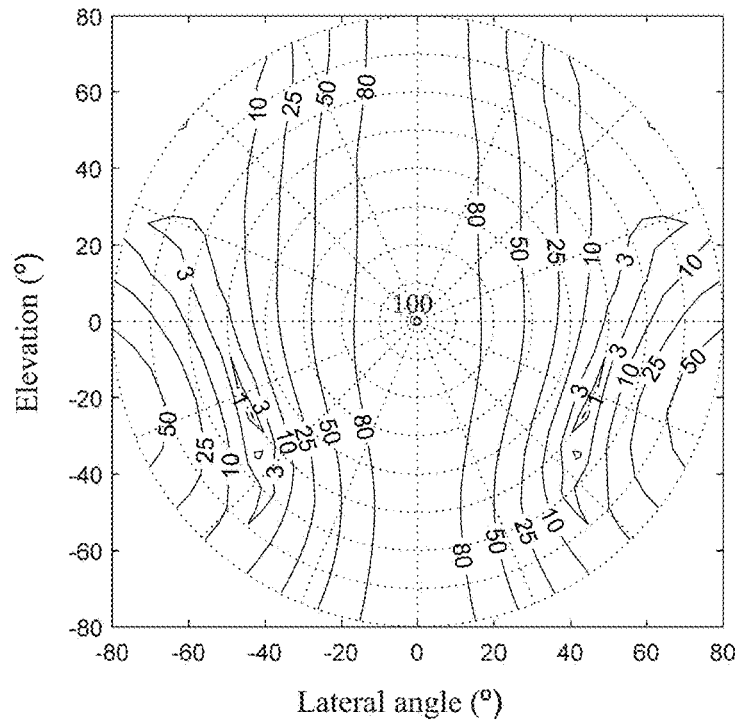
FIG. 20D is a schematic graph illustrating the variation of output transmission with polar direction for transmitted light rays in the passive retarder of FIG. 20C.

FIG. 20C is a schematic diagram illustrating in side perspective view an optical stack of a passive retarder comprising a negative O-plate tilted in a plane orthogonal to the display polariser electric vector transmission direction and a negative C-plate and arranged to provide field-of-view modification of a display device; and FIG. 20D is a schematic graph illustrating the variation of output transmission with polar direction for transmitted light rays in the passive retarder of FIG. 20C, comprising the structure illustrated in TABLE 5.

TABLE 5

| | Passive retarder | | | |
|---|---|---|---|---|
| FIGS. | Layer | Type | Out of plane angle/° | In plane angle/° | Δn · d/nm |
| 20C & 20D | 272A | Negative O | 65 | 90 | −550 |
| | 272B | Positive C | 90 | 0 | +500 |

The passive retarder 270 thus comprises a passive retarder 272A that is a negative O-plate which has an optical axis with a component in the plane of the passive retarder 272A and a component perpendicular to the plane of the passive retarder 272A. Further the component in the plane of the passive retarder extends at 90°, with respect to an electric vector transmission direction that is parallel to the electric vector transmission 219 of the display polariser 218. The passive retarder 272B comprises a passive retarder having an optical axis perpendicular to the plane of the passive retarder.

Advantageously luminance may be reduced for lateral viewing directions. A mobile display may be comfortably rotated about a horizontal axis while achieving privacy for off-axis snoopers in a lateral direction.

Figure 21A:
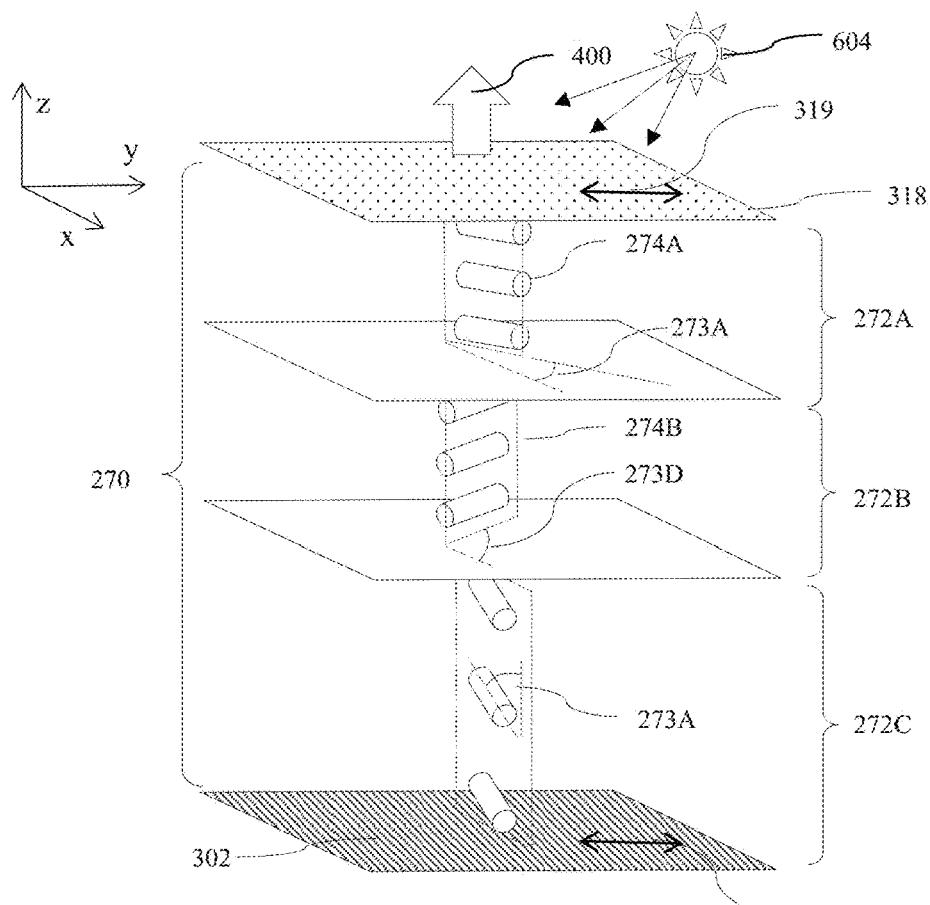
FIG. 21A is a schematic diagram illustrating in side perspective view an optical stack of a passive retarder comprising a positive O-plate tilted in a plane orthogonal to the display polariser electric vector transmission direction and crossed A-plates and arranged to provide field-of-view modification of a display device.
Figure 21B:
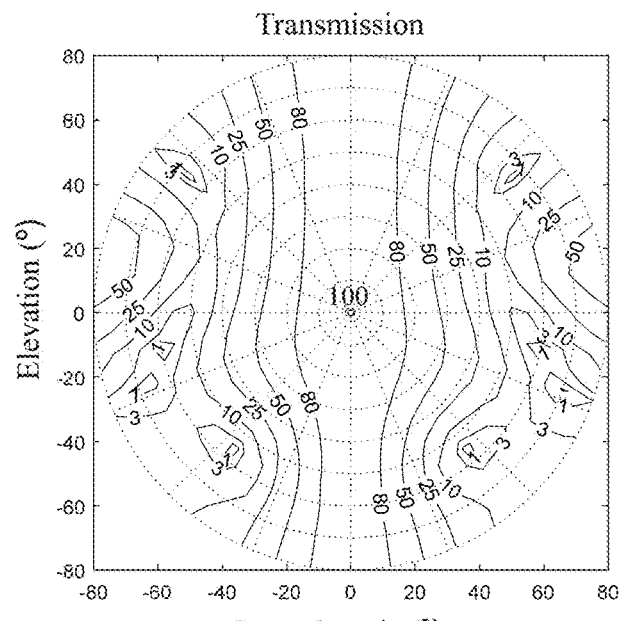
FIG. 21B is a schematic graph illustrating the variation of output transmission with polar direction for transmitted light rays in the passive retarder of FIG. 21A.

FIG. 21A is a schematic diagram illustrating in side perspective view an optical stack of a passive retarder comprising crossed A-plates and a positive O-plate; and FIG. 21B is a schematic graph illustrating the variation of output transmission with polar direction for transmitted light rays in the passive retarder of FIG. 21A, comprising the structure illustrated in TABLE 6.

TABLE 6

| | Passive retarder | | | |
|---|---|---|---|---|
| FIGS. | Layer | Type | Out of plane angle/° | In plane angle/° | Δn · d/nm |
| 21A & 21B | 272A | Positive A | 0 | 45 | +500 |
| | 272B | Positive A | 0 | 135 | +500 |
| | 272C | Positive O | 65 | 90 | +550 |

The passive retarder 270 thus comprises passive retarders 272A, 272B that are crossed A-plates and retarder 272C which has an optical axis with a component in the plane of the passive retarder 272C and a component perpendicular to the plane of the passive retarder 272C. The component in the plane of the passive retarder extends at 90°, with respect to an electric vector transmission direction that is parallel to the electric vector transmission 219 of the display polariser 218. Advantageously luminance may be reduced for lateral viewing directions. A mobile display may be comfortably rotated about a horizontal axis while achieving privacy for off-axis snoopers in a lateral direction.

It may be desirable to provide reduction of luminance in both lateral and elevation directions.

Figure 22A:
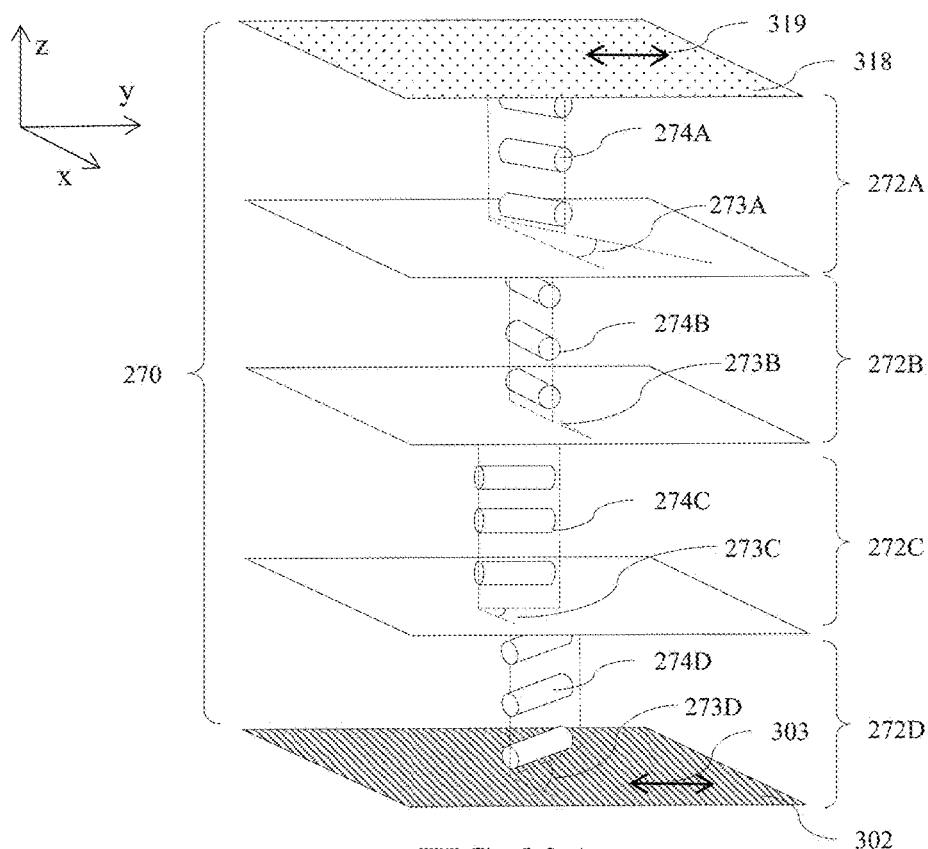
FIG. 22A is a schematic diagram illustrating in side perspective view an optical stack arranged to provide field-of-view modification of a display device comprising two pairs of crossed A-plates.
Figure 22B:
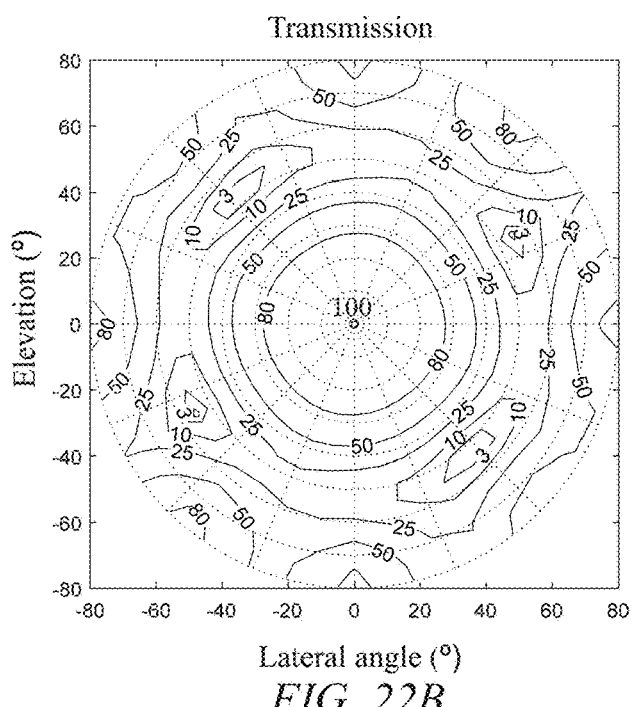
FIG. 22B is a schematic graph illustrating the variation of output transmission with polar direction for transmitted light rays in the passive retarder of FIG. 22A.

FIG. 22A is a schematic diagram illustrating in side perspective view an optical stack of a passive retarders 272A-D comprising two pairs of crossed A-plates; and FIG. 22B is a schematic graph illustrating the variation of output transmission with polar direction for transmitted light rays in the passive retarder of FIG. 22A, comprising the structure illustrated in TABLE 7.

TABLE 7

| | Passive control retarder | | | |
|---|---|---|---|---|
| FIGS. | Layer | Type | Out of plane angle/° | In plane angle/° | Δn · d/nm |
| 22A, 22B | 272A | Positive A | 0 | 45 | 700 |
| | 272B | | | 90 | |
| | 272C | | | 0 | |
| | 272D | | | 135 | |

The retarder thus comprises a pair of passive retarders 272A, 272D which have optical axes in the plane of the retarders that are crossed. The pair of retarders each comprise plural A-plates having respective optical axes aligned at different angles from each other. The pair of passive retarders 272B, 272C have optical axes that each extend at 90° and 0°, respectively, with respect to an electric vector transmission direction that is parallel to the electric vector transmission 211 of the display polariser 210.

The pair of passive retarders 272A, 272D have optical axes that extend at 45° and at 135°, respectively, with respect to an electric vector transmission direction 211 that is parallel to the electric vector transmission of the display polariser 218 respectively.

The display further comprises an additional pair of passive retarders 272B, 272C disposed between the first-mentioned pair of passive retarders 272A, 272D and which have optical axes in the plane of the retarders that are crossed. The additional pair of passive retarders 272B, 272C have optical axes that each extend at 0° and at 90°, respectively, with respect to an electric vector transmission direction 211, 317 that is parallel to the electric vector transmission of the display polariser 210, 316.

The retardance of each A-plate for light of a wavelength of 550 nm may be in a range from 600 nm to 850 nm, preferably in a range from 650 nm to 730 nm, and most preferably in a range from 670 nm to 710 nm. The colour change of absorbed light from a central viewing location to an off-axis viewing location may be advantageously reduced.

In further illustrative embodiments, preferably the angle 273A is at least 40° and at most 50°, most preferably at least 42.5° and at most 47.5° and most preferably at least 44° and at most 46°. Preferably the angle 273D is at least 130° and at most 140°, more preferably at least 132.5° and at most 137.5° and most preferably at least 134° and at most 136°.

In further illustrative embodiments, the inner retarder pair 272B, 272C may have looser tolerances than the outer retarder pair 272A, 272D. Preferably the angle 273B is at least −10° and at most 10°, more preferably at least −5° and at most 5° and most preferably at least −2° and at most 2°. Preferably the angle 273C is at least 80° and at most 100°, more preferably at least 85° and at most 95° and most preferably at least 88° and at most 92°.

The present embodiment provides a transmission profile that has some rotational symmetry. Advantageously a privacy display may be provided with reduced visibility of image from a wide field of view for lateral or elevated viewing positions of a snooper. Further, such an arrangement may be used to achieve enhanced privacy operation for landscape and portrait operation of a mobile display. Such an arrangement may be provided in a vehicle to reduce stray light to off-axis passengers, and also to reduce light falling on windscreen and other glass surfaces in the vehicle.

Figure 23A:
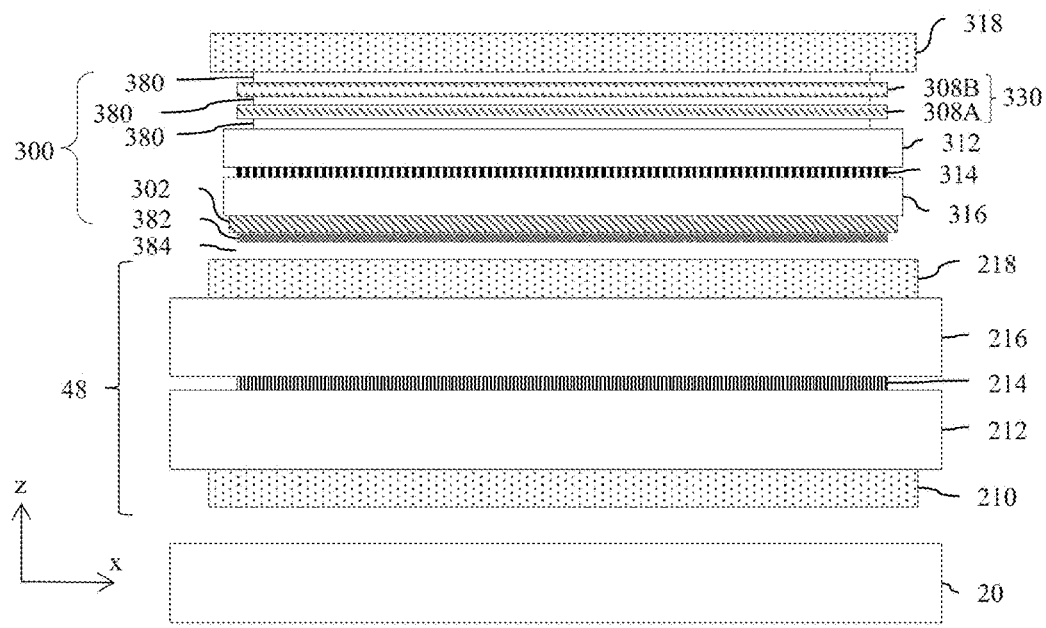
FIG. 23A and FIG. 23B are schematic diagrams illustrating in side view a privacy display for use in ambient illumination comprising a transmissive spatial light modulator, a reflective polariser, a liquid crystal retarder, compensating retarders and an additional polariser.
Figure 23B:
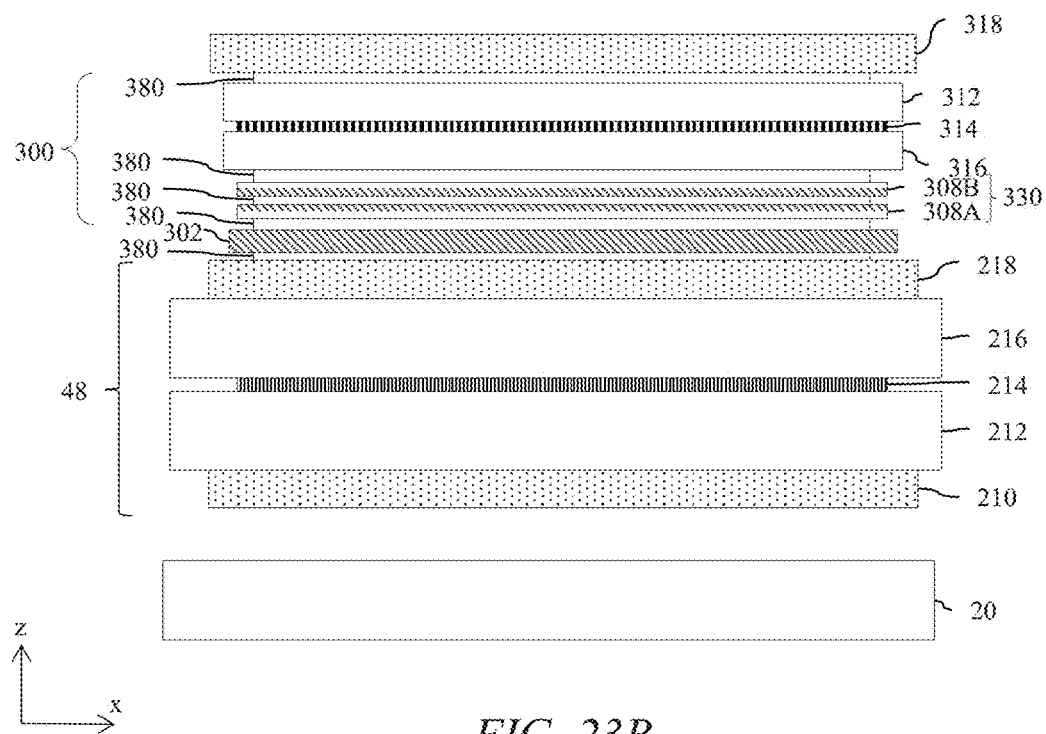

FIG. 23A-B are schematic diagrams illustrating in side views part of a display comprising a switchable compensated retarder and optical bonding layers 380. Optical bonding layers 380 may be provided to laminate films and substrates, achieving increased efficiency and reduced luminance at high viewing angles in privacy mode. Further an air gap 384 may be provided between the spatial light modulator 48 and the retarders 300. To reduce wetting of the two surfaces at the air gap 384, an anti-wetting surface 382 may be provided to at least one of the retarders 300 or spatial light modulator 48.

The retarder 330 may be provided between the switchable liquid crystal layer 314 and spatial light modulator 48 as illustrated in FIG. 23B, or may be provided between the additional polariser 318 and switchable liquid crystal layer 314 as illustrated in FIG. 23A. Substantially the same optical performance is provided in both systems other than for hybrid alignment as described elsewhere herein.

It would be desirable to provide reduced thickness and reduced total number of optical components.

Figure 24A:
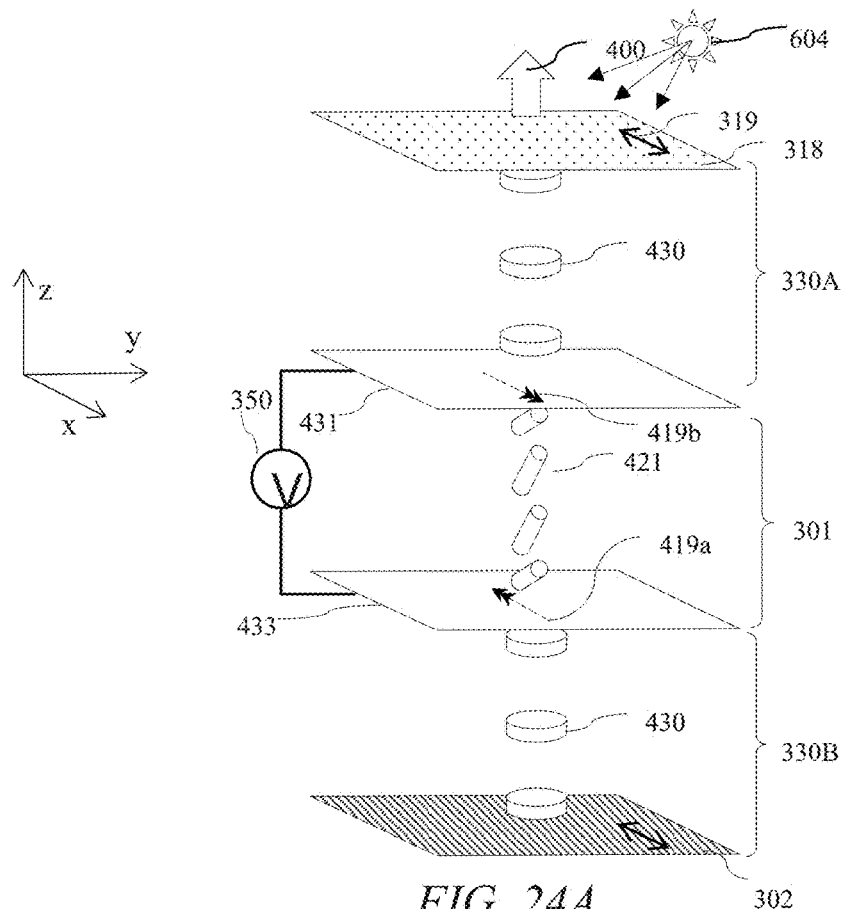
FIG. 24A is a schematic diagram illustrating in perspective side view an arrangement of a switchable compensated retarder in a privacy mode of operation comprising a homogeneously aligned switchable liquid crystal retarder arranged between first and second C-plate passive compensation retarders.
Figure 24B:
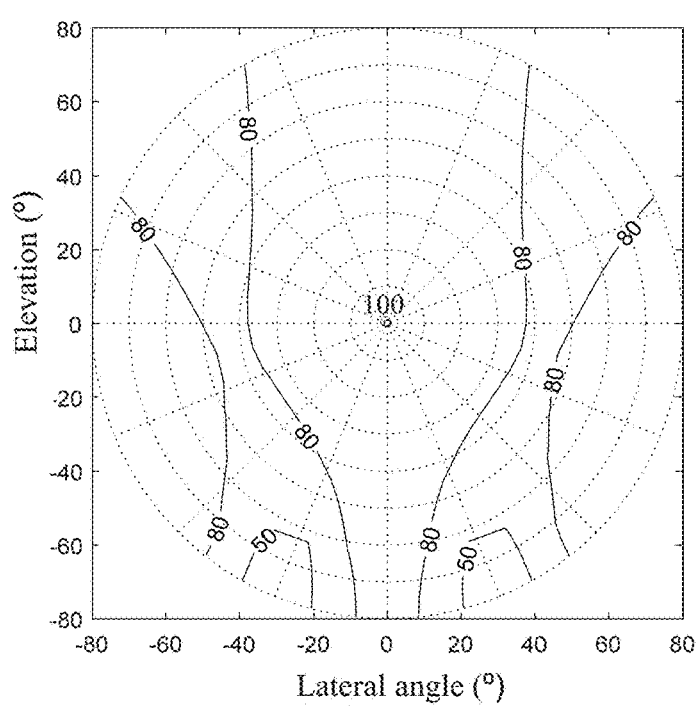
FIG. 24B and FIG. 24C are schematic graphs illustrating the variation of output transmission with polar direction for transmitted light rays in the optical stack of FIG. 24A in a wide angle mode and a privacy mode of operation respectively.
Figure 24C:
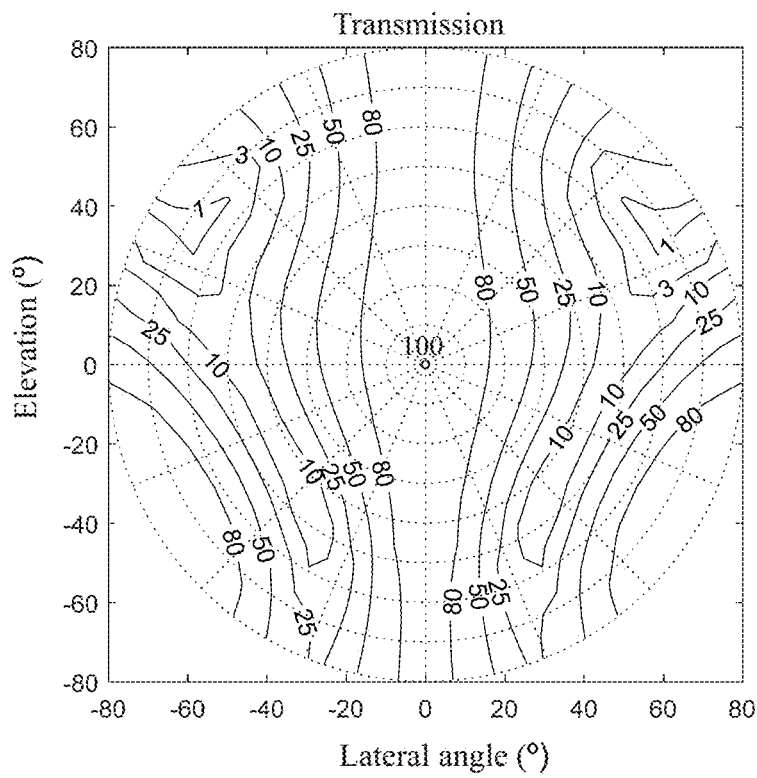
Figure 24D:
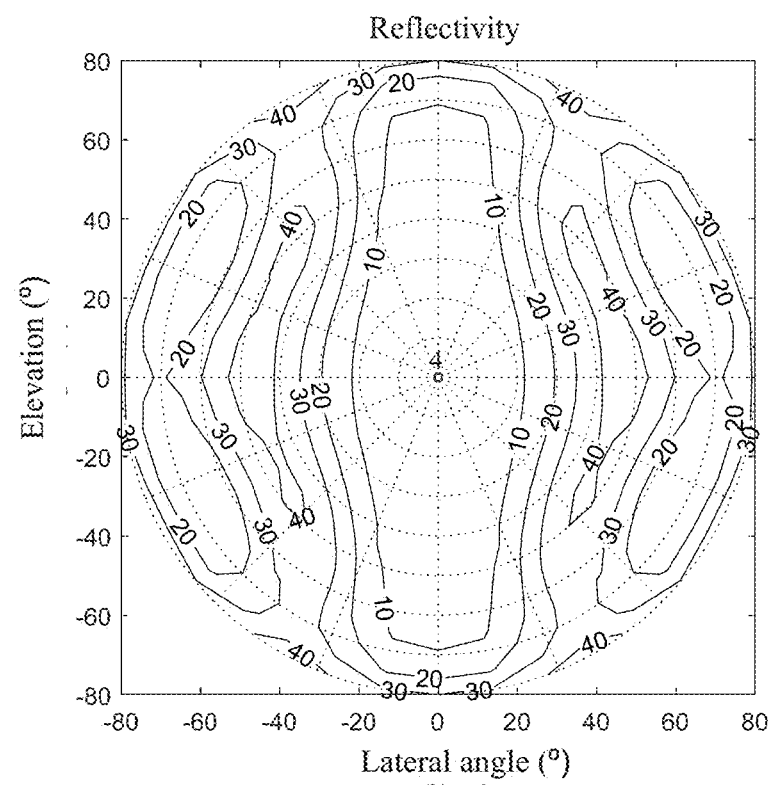
FIG. 24D is a schematic graph illustrating the variation in reflectivity with polar direction for reflected light rays in FIG. 24A in a privacy mode of operation.

FIG. 24A is a schematic diagram illustrating in perspective side view an arrangement of a switchable compensated retarder in a privacy angle mode of operation comprising a homogeneously aligned switchable liquid crystal retarder arranged between first and second C-plate passive compensation retarders; FIG. 24B and FIG. 24C are schematic graphs illustrating the variation of output transmission with polar direction for transmitted light rays in the optical stack of FIG. 24A in a wide angle mode and a privacy mode of operation respectively; and FIG. 24D is a schematic graph illustrating the variation in reflectivity with polar direction for reflected light rays in FIG. 24A in a privacy mode of operation, comprising the embodiments illustrated in TABLE 8.

TABLE 8

| FIG. | Mode | Passive compensation retarder(s) | | Active LC retarder | | | |
|---|---|---|---|---|---|---|---|
| | | Type | Δn.d/ nm | Alignment layers | Pretilt/ deg | Δn.d/ nm | Δε | Voltage/V |
| 24B | Wide | Negative C, 330A | −275 | Homogeneous | 2 | 750 | 13.2 | 5.0 |
| 24C & 24D | Privacy | Negative C, 330B | −275 | Homogeneous | 2 | | | 2.6 |
| 25D | Wide | A-plate, 330A | 575 | Homogeneous | 2 | 750 | 13.2 | 5.0 |
| 25E | Privacy | A-plate, 330B | 575 | Homogeneous | 2 | | | 2.6 |

The passive compensation retarder 330 comprises first and second C-plates 330A, 330B; and the switchable liquid crystal layer 314 is provided between the first and second C-plates 330A, 330B. The switchable liquid crystal retarder comprises two surface alignment layers 419a, 419b disposed adjacent to the layer 314 of liquid crystal material 414 and on opposite sides thereof and each arranged to provide homogeneous alignment in the adjacent liquid crystal material 414. The layer of liquid crystal material 414 of the switchable liquid crystal retarder comprises a liquid crystal material 414 with a negative positive dielectric anisotropy.

The layer of liquid crystal material 314 has a retardance for light of a wavelength of 550 nm in a range from 500 nm to 1000 nm, preferably in a range from 600 nm to 900 nm and most preferably in a range from 700 nm to 850 nm. The two passive retarders each comprises a passive retarder having an optical axis perpendicular to the plane of the retarder with a total retardance for light of a wavelength of 550 nm in a range −300 nm to −700 nm, preferably in a range from −350 nm to −600 nm and most preferably −400 nm to −500 nm.

Figure 25A:
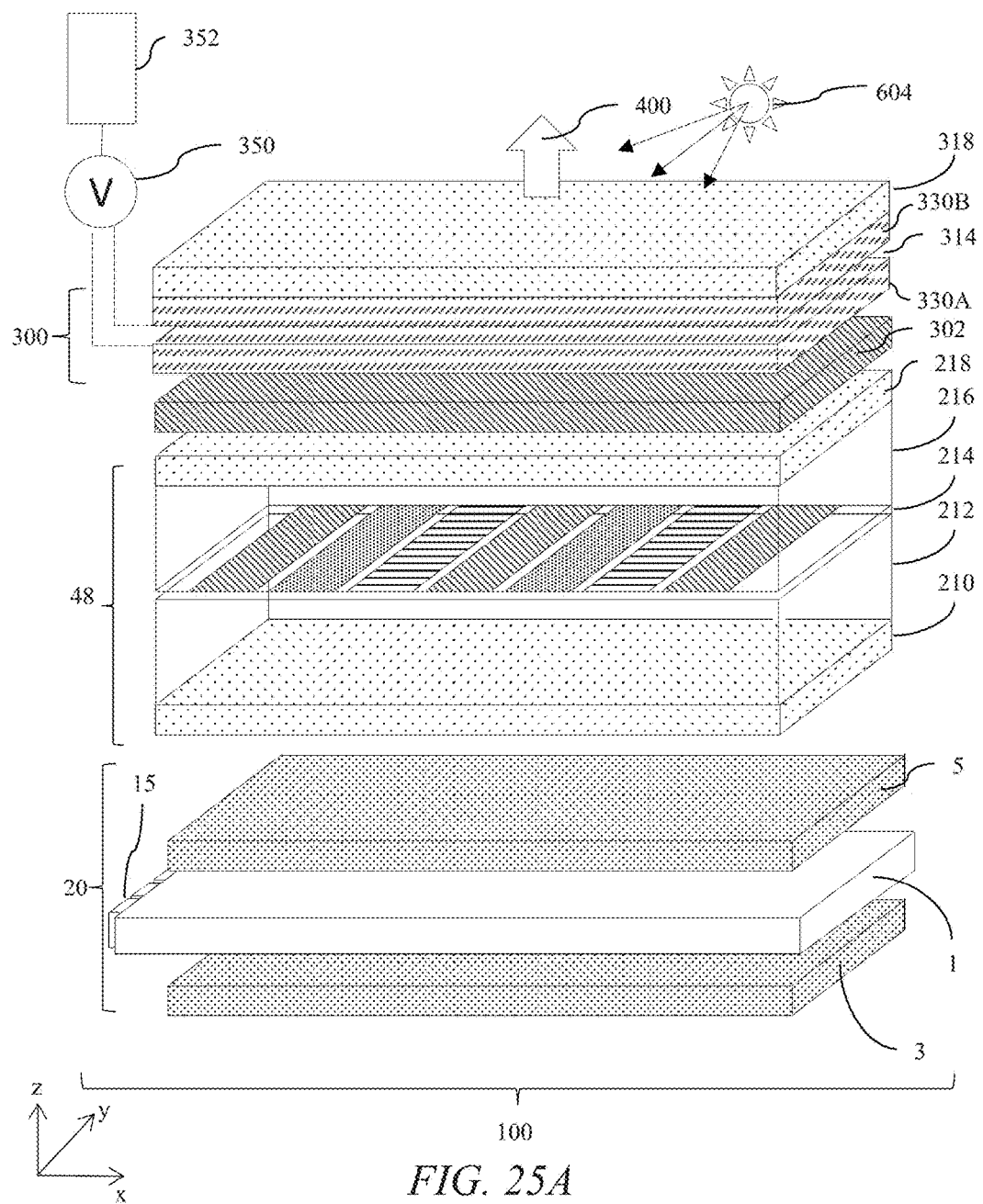
FIG. 25A is a schematic diagram illustrating in perspective side view a display comprising a switchable compensated retarder arranged between first and second C-plate passive compensation retarder substrates.
Figure 25B:
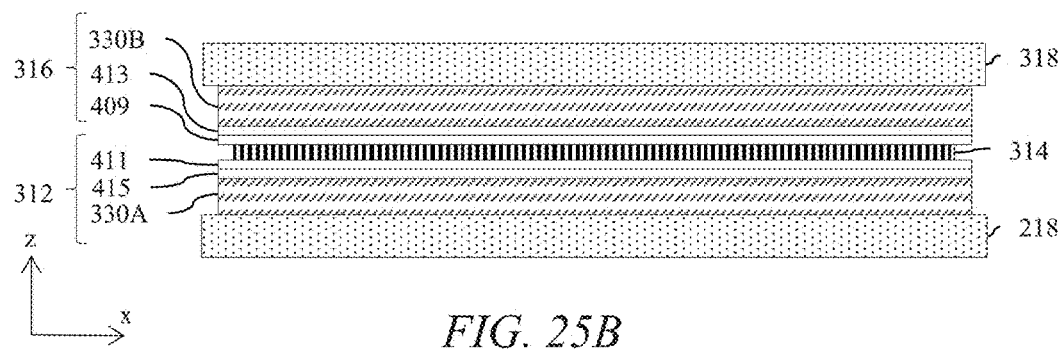
FIG. 25B is a schematic diagram illustrating in side view part of a display comprising a switchable compensated retarder arranged between first and second C-plate passive compensation retarder substrates.

FIG. 25A is a schematic diagram illustrating in perspective side view a display comprising a switchable compensated retarder arranged between first and second C-plate passive compensation retarder substrates; and FIG. 25B is a schematic diagram illustrating in side view part of a display comprising a switchable compensated retarder arranged between first and second C-plate passive compensation retarder substrates.

The retarders 300 comprise two passive retarders 330A, 330B, and a switchable liquid crystal retarder 301 comprising a layer 314 of liquid crystal material provided between the two passive retarders 330A, 330B. The display device 100 further comprises a transmissive electrodes 413, 415 and liquid crystal surface alignment layers 409, 411 formed on a side of each of the two passive retarders 330A, 330B adjacent the switchable liquid crystal retarder layer 314. The display device 100 further comprises first and second substrates between which the switchable liquid crystal retarder layer 314 is provided, the first and second substrates each comprising one of the two passive retarders 330A, 330B.

Thus the first C-plate 330A has a transparent electrode layer 415 and liquid crystal alignment layer 411 formed on one side and the second C-plate 330B has a transparent electrode layer 413 and liquid crystal alignment layer 409 formed on one side.

The liquid crystal layer 314 is provided between first and second substrates 312, 316, and the first and second substrates 312, 316 each comprises one of the first and second C-plates 330A, 330B. The C-plates may be provided in double stretched COP films that are ITO coated to provide electrodes 413, 415 and have liquid crystal alignment layers 409, 411 formed thereon.

Advantageously, the number of layers may be reduced in comparison to the arrangement of FIG. 1, reducing thickness, cost and complexity. Further the C-plates 330A, 330B may be flexible substrates, and may provide a flexible privacy display.

It would be desirable to provide a liquid crystal layer 314 between first and second A-plate substrates.

Figure 25C:
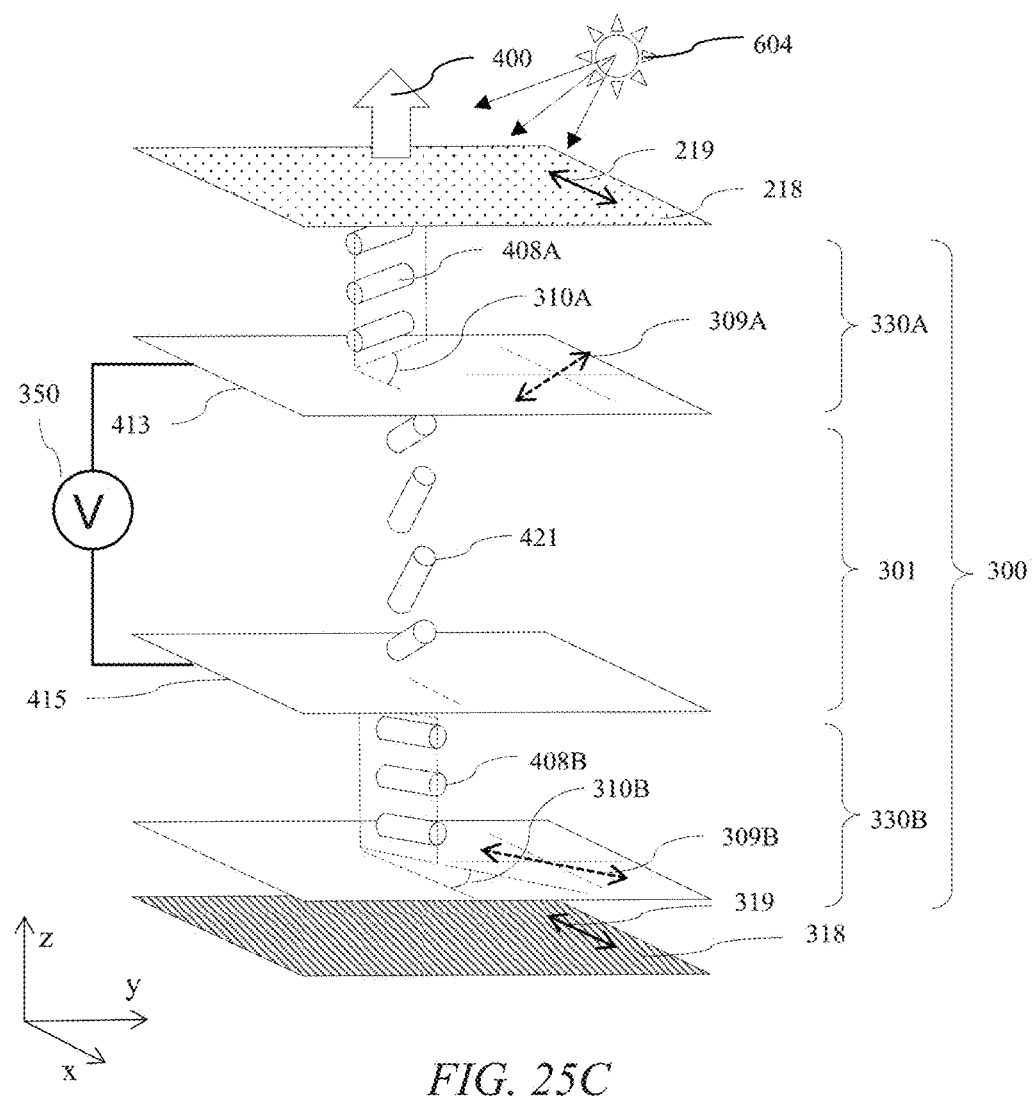
FIG. 25C is a schematic diagram illustrating in perspective side view an arrangement of a switchable compensated retarder in a wide angle mode of operation comprising a homogeneously aligned switchable liquid crystal retarder arranged between first and second crossed A-plate passive compensation retarders.
Figure 25D:
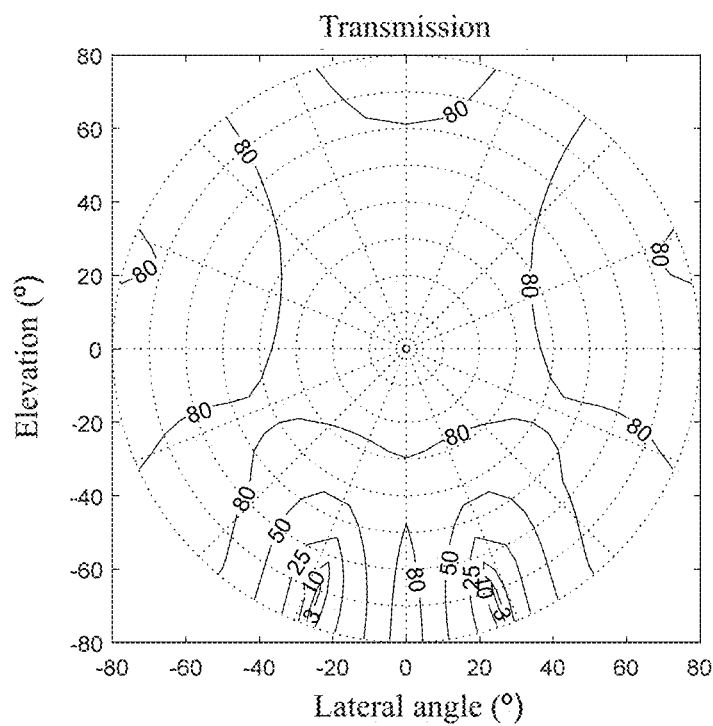
FIG. 25D and FIG. 25E are schematic graphs illustrating the variation of output transmission with polar direction for transmitted light rays for the arrangement of FIG. 25C in wide angle and privacy modes respectively.
Figure 25E:
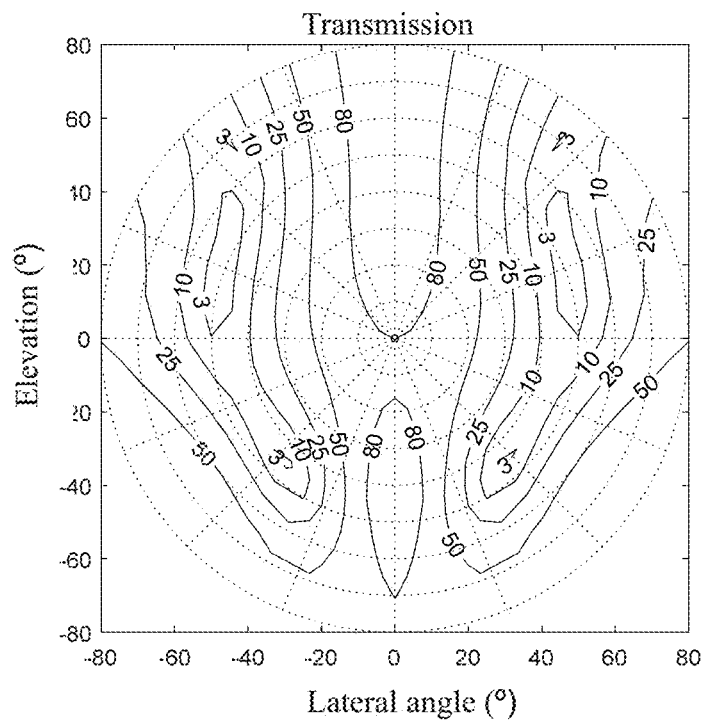

FIG. 25C is a schematic diagram illustrating in perspective side view an arrangement of a switchable compensated retarder in a wide angle mode of operation comprising a homogeneously aligned switchable liquid crystal retarder arranged between first and second crossed A-plate passive compensation retarders; and FIG. 25D and FIG. 25E are schematic graphs illustrating the variation of output transmission with polar direction for transmitted light rays for the structure of FIG. 25C when driven in wide angle and privacy modes of operation respectively comprising the embodiments further illustrated in TABLE 8.

The switchable liquid crystal retarder comprises two surface alignment layers 419a, 419b disposed adjacent to the layer 314 of liquid crystal material 414 and on opposite sides thereof and each arranged to provide homogeneous alignment in the adjacent liquid crystal material 414. The layer of liquid crystal material 414 of the switchable liquid crystal retarder comprises a liquid crystal material 414 with a negative positive dielectric anisotropy.

The layer of liquid crystal material 314 has a retardance for light of a wavelength of 550 nm in a range from 500 nm to 1000 nm, preferably in a range from 600 nm to 900 nm and most preferably in a range from 700 nm to 850 nm. Each of the two passive retarders has an optical axis in the plane of the passive retarder, wherein the optical axes are crossed, and each passive retarder of the pair of passive retarders having a retardance for light of a wavelength of 550 nm in a range from 150 nm to 800 nm, preferably in a range from 200 nm to 700 nm and most preferably in a range from 250 nm to 600 nm.

In comparison to the arrangement of FIG. 24A, advantageously A-plates may be manufactured at reduced cost compared to C-plates.

It would be desirable to provide improved image appearance by means of adding camouflage to the private image seen by the snooper 47 in privacy mode of operation.

FIG. 26A is a schematic diagram illustrating in perspective side view an arrangement of a switchable retarder in a privacy mode of operation comprising a negative C-plate passive retarder and homogeneously aligned switchable liquid crystal retarder further comprising a patterned electrode 415 layer.

At least one of the electrodes 413, 415 may be patterned, in this example electrode 415 is patterned with regions 415a, 415b, 415c and driven by respective voltage drivers 350a, 350b, 350c with voltages Va, Vb, Vc. Gaps 417 may be provided between the electrode regions 415a, 415b, 415c. The tilt of the molecules 414a, 414b, 414c may thus be adjusted independently to reveal a camouflage pattern with different luminance levels for off-axis viewing.

Thus the switchable liquid crystal retarder 301 arranged between the reflective polariser 302 and the additional polariser 318 is controlled by means of addressing electrodes 415a, 415b, 415c and uniform electrode 413. The addressing electrodes may be patterned to provide at least two pattern regions comprising electrode 415a and gap 417.

FIG. 26B is a schematic diagram illustrating in perspective front view illumination of a primary viewer and a snooper by a camouflaged luminance controlled privacy display. Display 100 may have dark image data 601 and white background data 603 that is visible to the primary viewer 45 in viewing window 26p. By way of comparison snooper 47 may see the camouflaged image as illustrated in FIG. 26C which is a schematic diagram illustrating in perspective side view illumination of a snooper by a camouflaged luminance controlled privacy display. Thus in white background regions 603, a camouflage structure may be provided that has mixed luminance of the white region 603. The pattern regions of the electrodes 415a, 415b, 415c are thus camouflage patterns. At least one of the pattern regions is individually addressable and is arranged to operate in a privacy mode of operation.

The pattern regions may be arranged to provide camouflage for multiple spatial frequencies by means of control of which patterns are provided during privacy mode of operation. In an illustrative example, a presentation may be provided with 20 mm high text. A camouflage pattern with similar pattern size may be provided with a first control of an electrode pattern. In a second example a photo may be provided with large area content that is most visible to a snooper 47. The spatial frequency of the camouflage pattern may be reduced to hide the larger area structures, by combining first and second electrode regions to provide the voltage and achieve a resultant lower spatial frequency pattern.

Advantageously a controllable camouflage structure may be provided by means of adjustment of the voltages Va, Vb, Vc across the layer 892. Substantially no visibility of the camouflage structure may be seen for head-on operation. Further the camouflage image may be removed by providing Va, Vb and Vc to be the same.

Further to providing camouflage from luminance modulation of the private image, the present embodiments provide camouflaged reflection from ambient illumination 604, advantageously achieving further hiding of private images to the snooper 47 while achieving non-camouflaged reflection to the primary user 45.

The performance of retarders between parallel polarisers when arranged in series will now be described. First, the field of view of a homogeneously aligned liquid crystal retarder 301 will now be described for two different drive voltages.

Figure 27B:
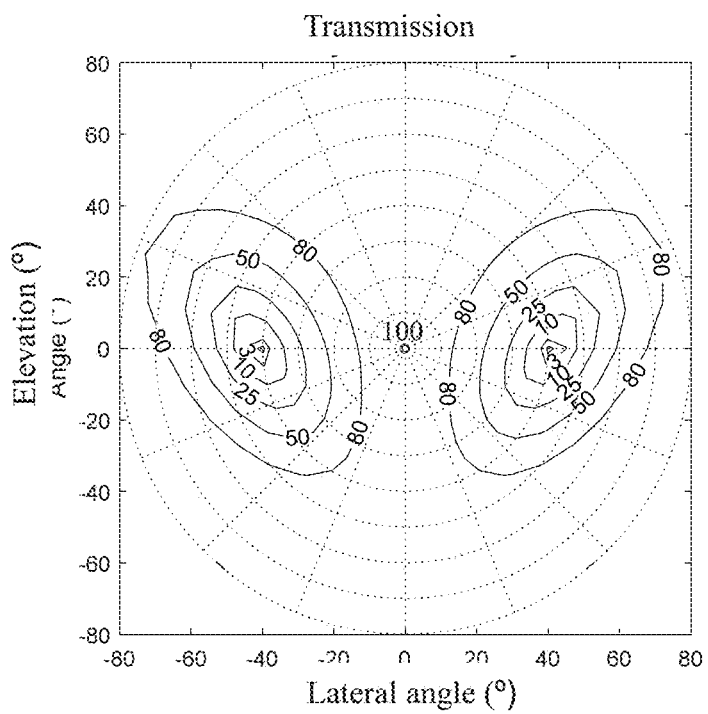
FIG. 27B is a schematic graph illustrating the variation of output transmission with polar direction for transmitted light rays in FIG. 27A for a first applied voltage.
Figure 27C:
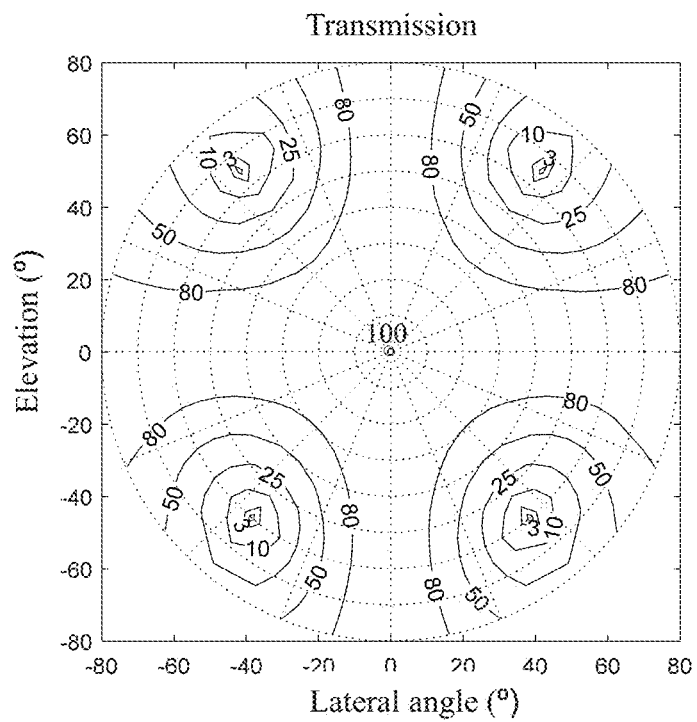
FIG. 27C is a schematic graph illustrating the variation of output transmission with polar direction for transmitted light rays in FIG. 27A for a second applied voltage that is greater than the first applied voltage.

FIG. 27A is a schematic diagram illustrating in perspective side view an arrangement of a homogeneously aligned switchable liquid crystal retarder; FIG. 27B is a schematic graph illustrating the variation of output transmission with polar direction for transmitted light rays in FIG. 27A for a first applied voltage; and FIG. 27C is a schematic graph illustrating the variation of output transmission with polar direction for transmitted light rays in FIG. 27A for a second applied voltage that is greater than the first applied voltage, comprising the structure illustrated in TABLE 9.

Figure 27D:
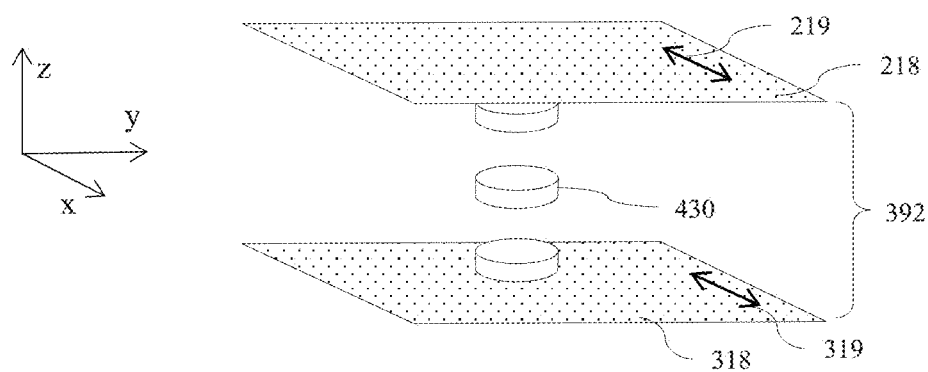
FIG. 27D is a schematic diagram illustrating in perspective side view a C-plate arranged between parallel polarisers.
Figure 27E:
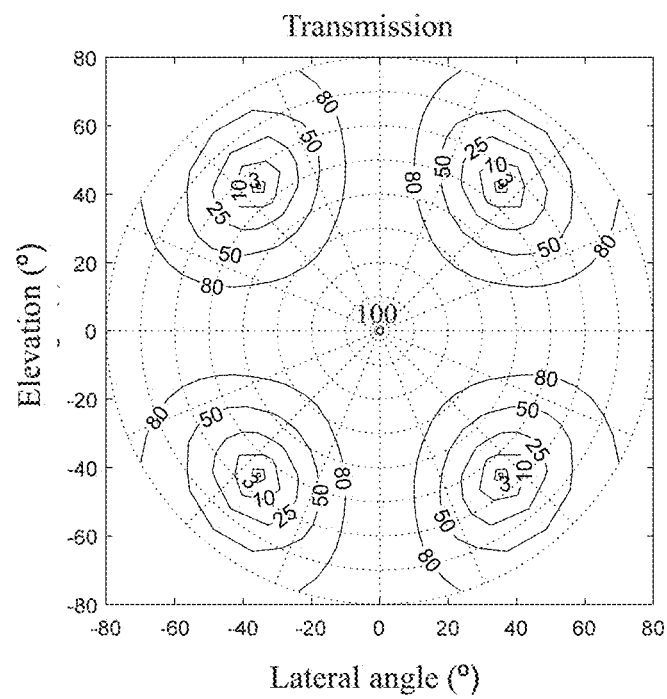
FIG. 27E is a schematic graph illustrating the variation of output transmission with polar direction for transmitted light rays in FIG. 27D.

FIG. 27D is a schematic diagram illustrating in perspective side view a C-plate arranged between parallel polarisers; and FIG. 27E is a schematic graph illustrating the variation of output transmission with polar direction for transmitted light rays in FIG. 27D, comprising the structure illustrated in TABLE 9.

TABLE 9

| | Passive compensation retarder(s) | | Central polariser? | Active LC retarder Alignment layers | Pretilt/deg | Δn.d/nm | Δε | Voltage/V |
|---|---|---|---|---|---|---|---|---|
| FIG. | Type | Δn.d/nm | | | | | | |
| 27A & 27B | — | — | — | Homogeneous | 1 | 900 | +15 | 2.4 |
| 27C | | | | Homogeneous | | | | 20.0 |
| 27D & 27E | Negative C | −700 | — | — | — | — | — | — |
| 28A & 28B | Negative C | −700 | Yes | Homogeneous | 1 | 900 | +15 | 2.4 |
| 28C | | | | Homogeneous | | | | 20.0 |
| 29A & 29B | Negative C | −700 | No | Homogeneous | 1 | 900 | +15 | 2.4 |
| 29C | | | | Homogeneous | | | | 20.0 |

Figure 28A:
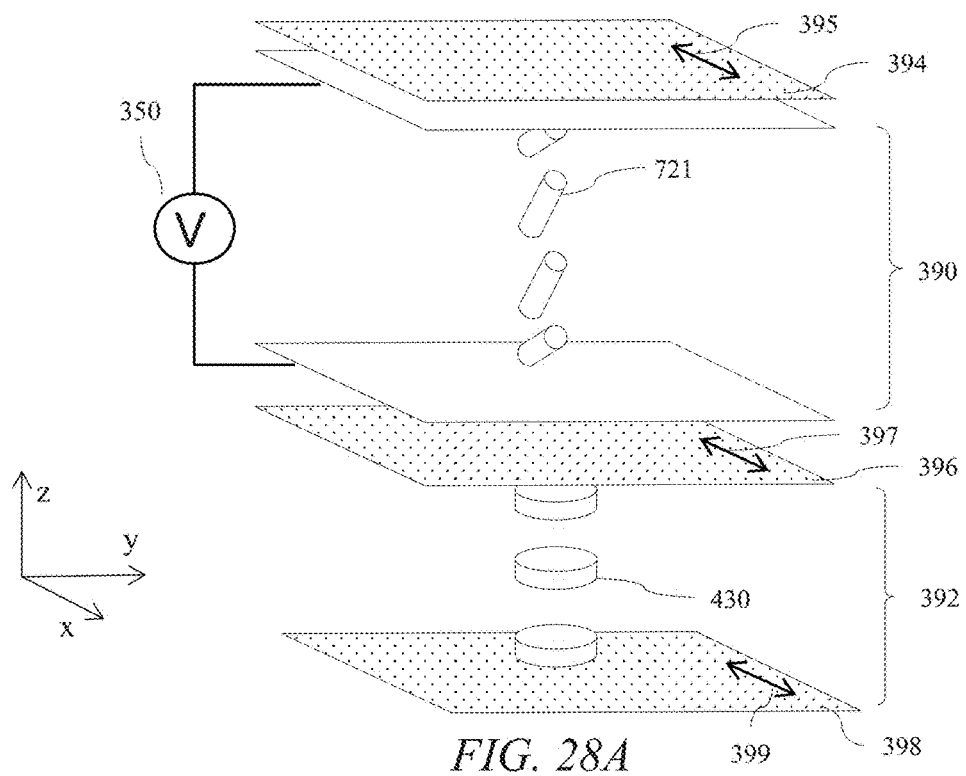
FIG. 28A is a schematic diagram illustrating in perspective side view an arrangement of a homogeneously aligned switchable liquid crystal retarder arranged between parallel polarisers in series with a C-plate arranged between parallel polarisers.
Figure 28B:
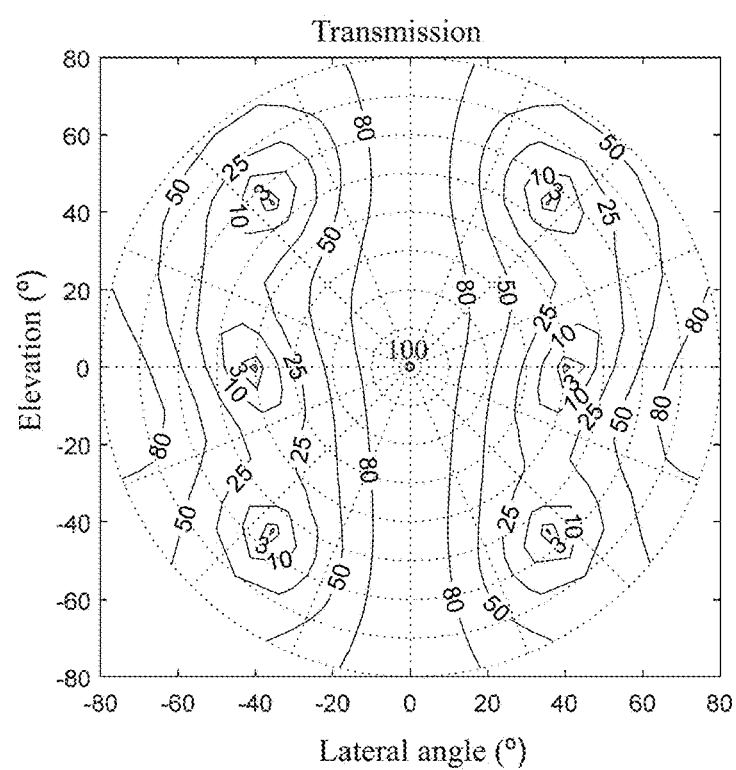
FIG. 28B is a schematic graph illustrating the variation of output transmission with polar direction for transmitted light rays in FIG. 28A for a first applied voltage.
Figure 28C:
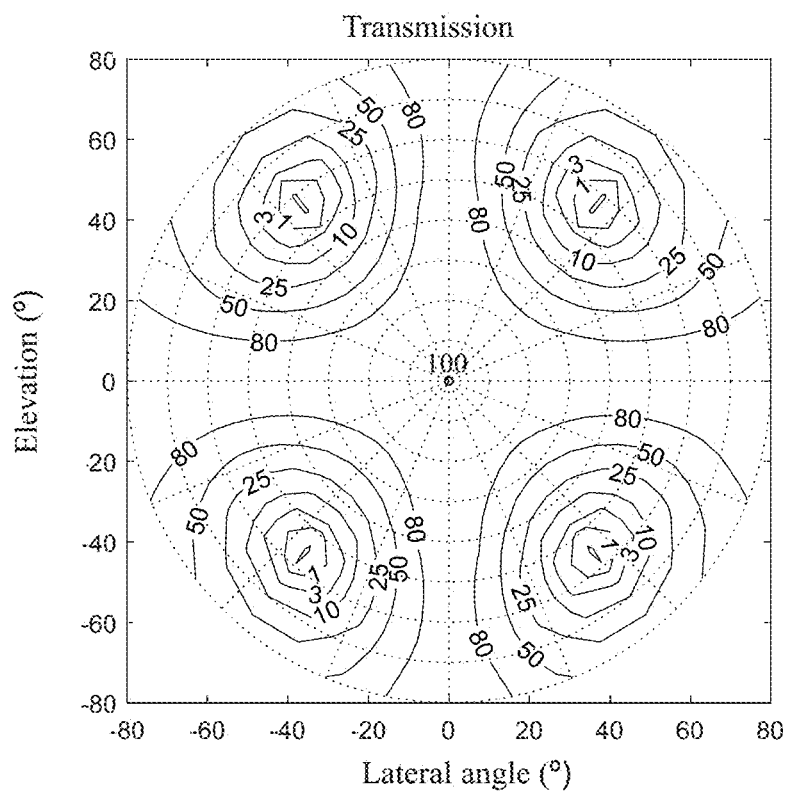
FIG. 28C is a schematic graph illustrating the variation of output transmission with polar direction for transmitted light rays in FIG. 28A for a second applied voltage that is greater than the first applied voltage.

FIG. 28A is a schematic diagram illustrating in perspective side view an arrangement of a homogeneously aligned switchable liquid crystal retarder 390 arranged between parallel polarisers 394, 396 in series with a field-of-view control passive retarder comprising a C-plate retarder 392 arranged between parallel polarisers 396, 398; FIG. 28B is a schematic graph illustrating the variation of output transmission with polar direction for transmitted light rays in FIG. 28A for a first applied voltage; FIG. 28C is a schematic graph illustrating the variation of output transmission with polar direction for transmitted light rays in FIG. 28A for a second applied voltage that is greater than the first applied voltage, comprising the structure illustrated in TABLE 9.

Figure 29A:
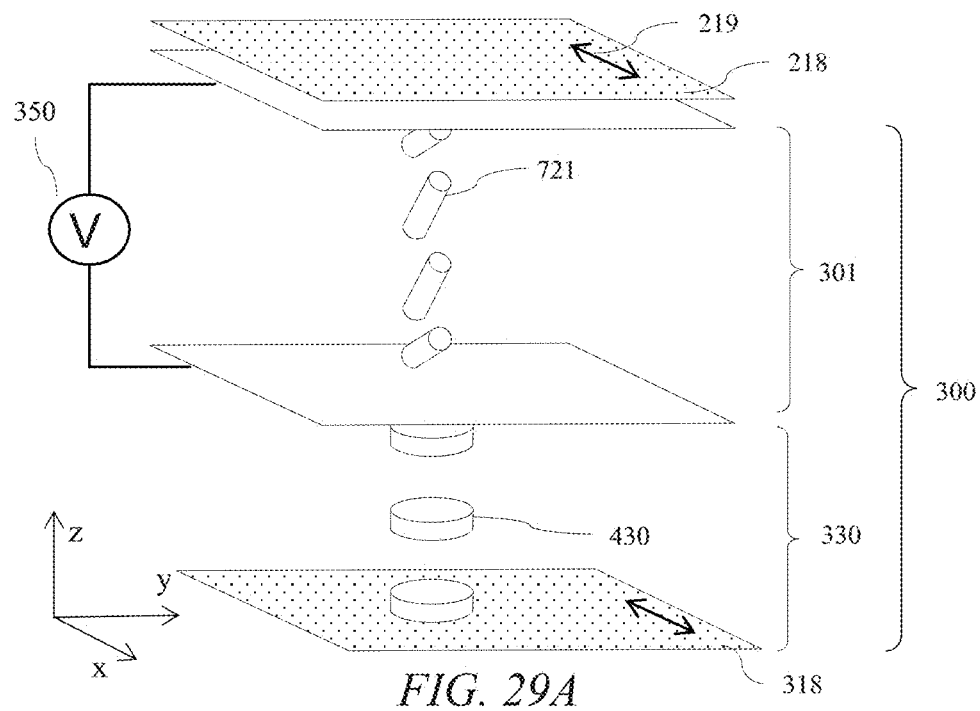
FIG. 29A is a schematic diagram illustrating in perspective side view an arrangement of a homogeneously aligned switchable liquid crystal retarder in series with a C-plate compensation retarder wherein the homogeneously aligned switchable liquid crystal and C-plate compensation retarder are arranged between a single pair of parallel polarisers.
Figure 29B:
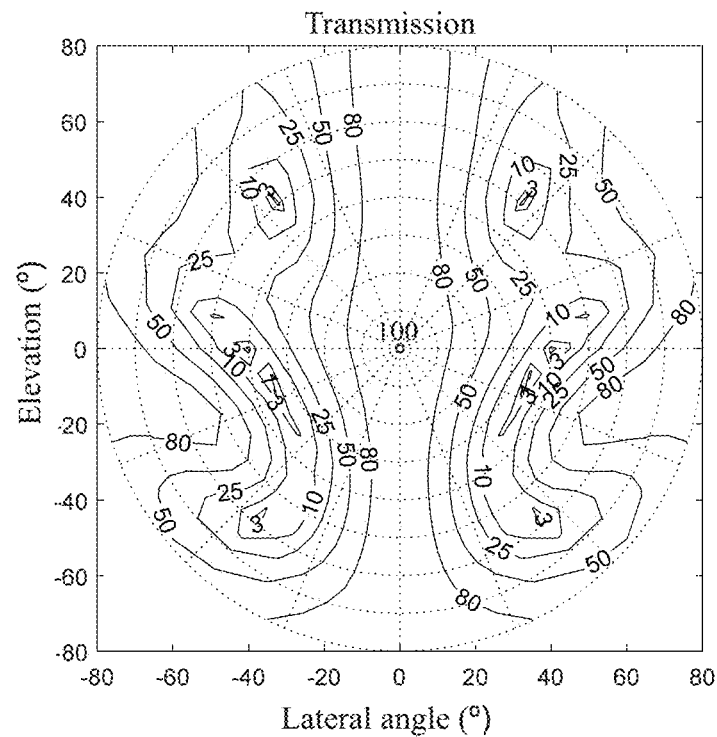
FIG. 29B is a schematic graph illustrating the variation of output transmission with polar direction for transmitted light rays in FIG. 29A for a first applied voltage.
Figure 29C:
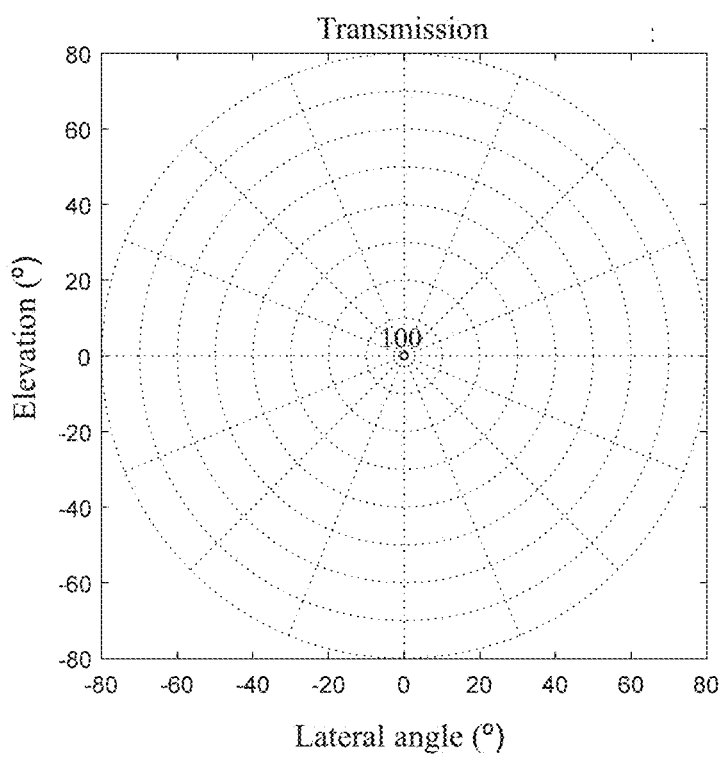
FIG. 29C is a schematic graph illustrating the variation of output transmission with polar direction for transmitted light rays in FIG. 29A for a second applied voltage that is greater than the first applied voltage.

FIG. 29A is a schematic diagram illustrating in perspective side view an arrangement of a homogeneously aligned switchable liquid crystal retarder in series with a C-plate compensation retarder wherein the homogeneously aligned switchable liquid crystal and C-plate compensation retarder are arranged between a single pair of parallel polarisers; FIG. 29B is a schematic graph illustrating the variation of output transmission with polar direction for transmitted light rays in FIG. 29A for a first applied voltage; and FIG. 29C is a schematic graph illustrating the variation of output transmission with polar direction for transmitted light rays in FIG. 29A for a second applied voltage that is greater than the first applied voltage, comprising the structure illustrated in TABLE 9.

Unexpectedly, the optimum conditions for maximum field-of-view operation is provided by equal and opposite net retardation of the compensation retarder 330 in comparison to the switchable liquid crystal retarder layer 314 in its undriven state. An ideal compensation retarder 330 and switchable liquid crystal retarder layer 314 may achieve (i) no modification of the wide angle mode performance from the input light and (ii) optimal reduction of lateral viewing angle for off-axis positions for all elevations when arranged to provide a narrow angle state. This teaching may be applied to all the display devices disclosed herein.

It would be desirable to provide further reduction of off-axis luminance by means of directional illumination from the spatial light modulator 48. Directional illumination of the spatial light modulator 48 by directional backlights 20 will now be described.

Figure 30A:
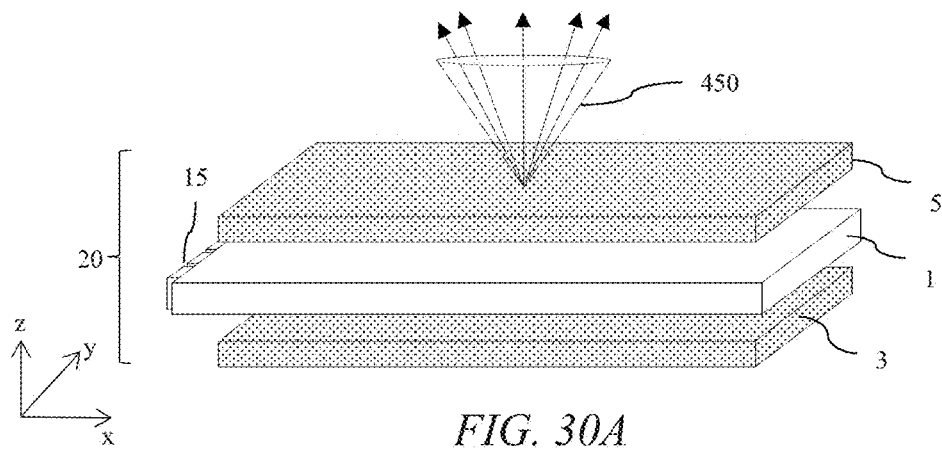
FIG. 30A is a schematic diagram illustrating in front perspective view a directional backlight.
Figure 30B:
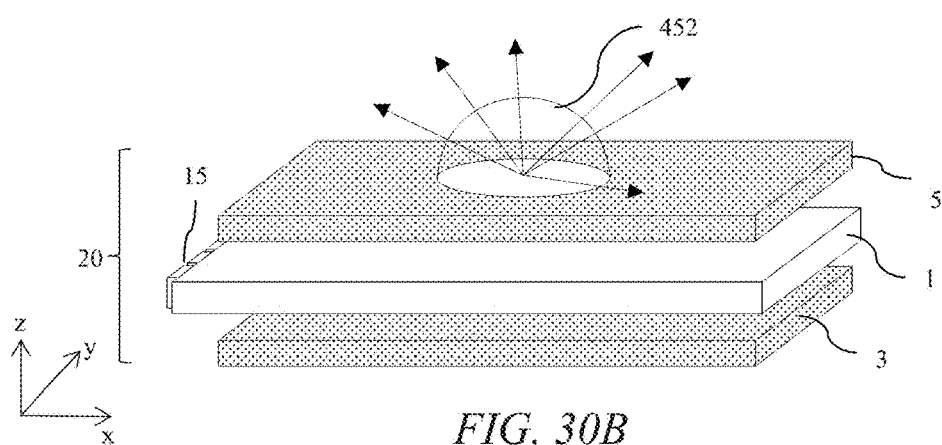
FIG. 30B is a schematic diagram illustrating in front perspective view a non-directional backlight.

FIG. 30A is a schematic diagram illustrating in front perspective view a directional backlight 20, and FIG. 30B is a schematic diagram illustrating in front perspective view a non-directional backlight 20, either of which may be applied in any of the devices described herein. Thus a directional backlight 20 as shown in FIG. 30A provides a narrow cone 450, whereas a non-directional backlight 20 as shown in FIG. 30B provides a wide angular distribution cone 452 of light output rays.

Figure 30C:
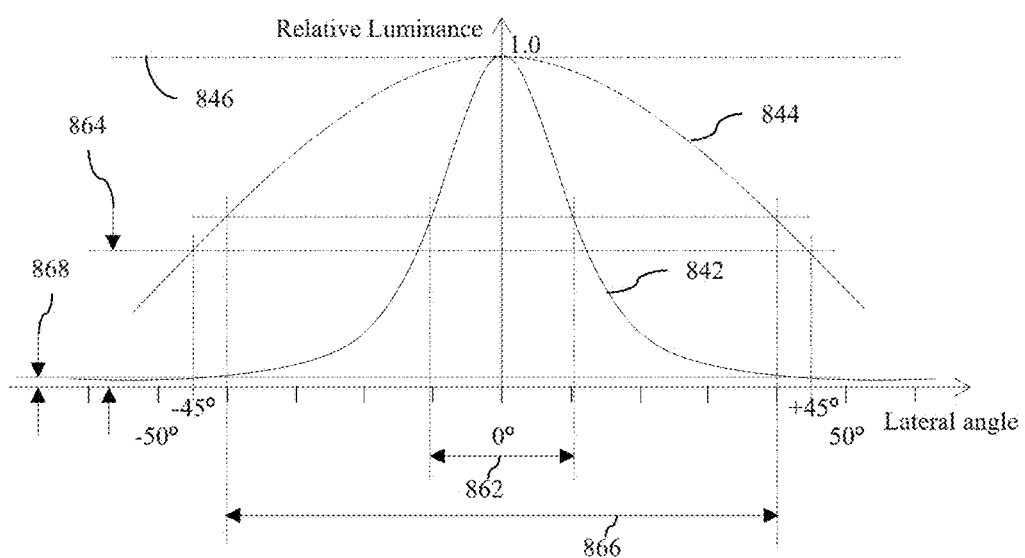
FIG. 30C is a schematic graph illustrating variation with luminance with lateral viewing angle of displays with different fields of view.

FIG. 30C is a schematic graph illustrating variation with luminance with lateral viewing angle for various different backlight arrangements. The graph of FIG. 30C may be a cross section through the polar field-of-view profiles described herein.

A Lambertian backlight has a luminance profile 846 that is independent of viewing angle.

A typical wide angle backlight has a roll-off at higher angles such that the full width half maximum 866 of relative luminance may be greater than 40°, preferably greater than 60° and most preferably greater than 80°. Further the relative luminance 864 at +/−45°, is preferably greater than 7.5%, most preferably greater than 10% and most preferably greater than 20%.

By way of comparison a directional backlight 20 has a roll-off at higher angles such that the full width half maximum 862 of relative luminance may be less than 60°, preferably less than 40° and most preferably less than 20°. Further the backlight 20 may provide a luminance at polar angles to the normal to the spatial light modulator 48 greater than 45 degrees that is at most 33% of the luminance along the normal to the spatial light modulator 48, preferably at most 20% of the luminance along the normal to the spatial light modulator 48, and most preferably at most 10% of the luminance along the normal to the spatial light modulator 48.

Such luminance profiles may be provided by the directional backlights 20 described below or may also be provided by wide angle backlights in combination with further additional polariser 318B and passive retarders 270 or additional compensated switching liquid crystal retarder 300B.

Figure 31A:
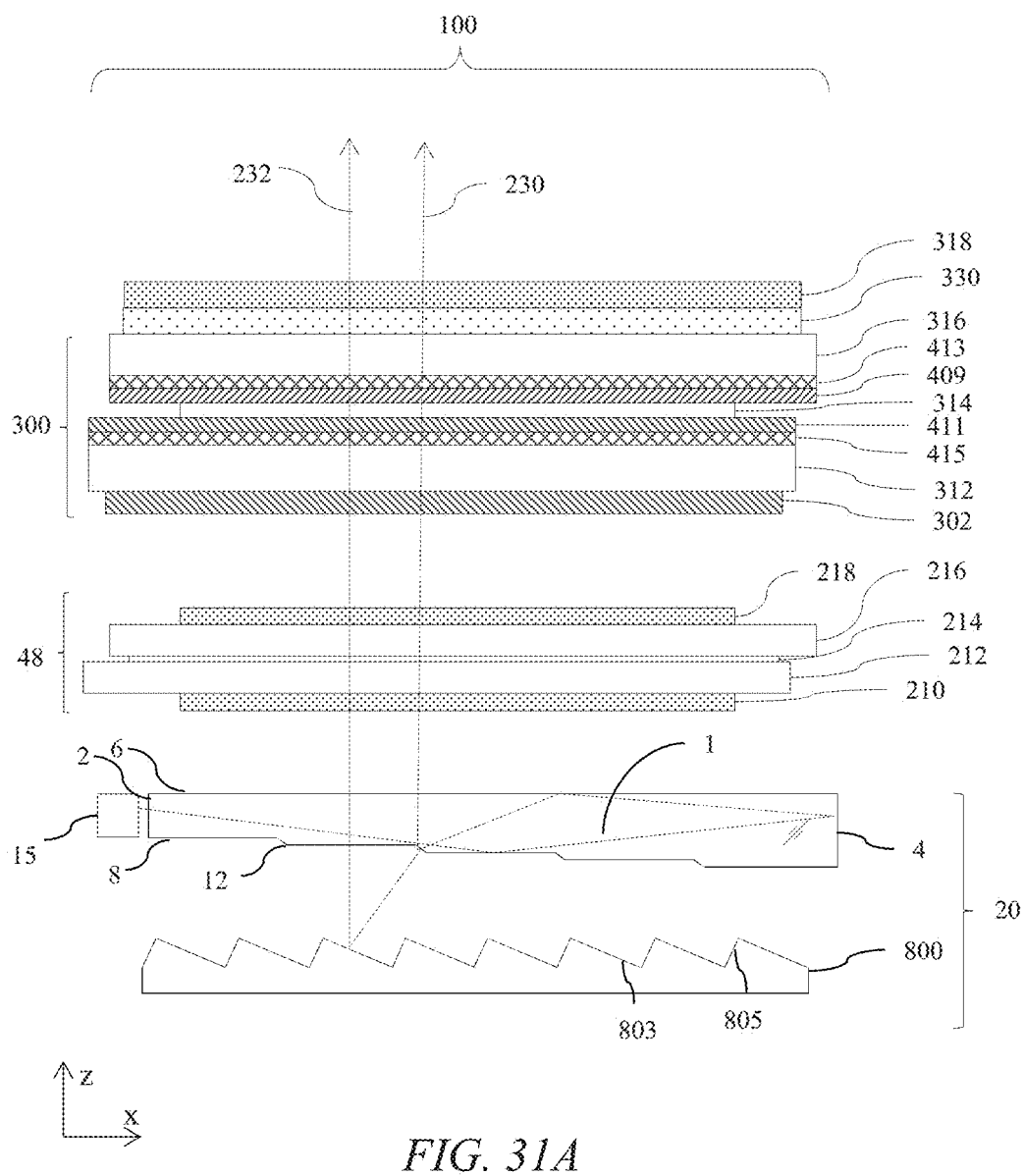
FIG. 31A is a schematic diagram illustrating in side view a switchable directional display apparatus comprising an imaging waveguide and switchable liquid crystal retarder.
Figure 31B:
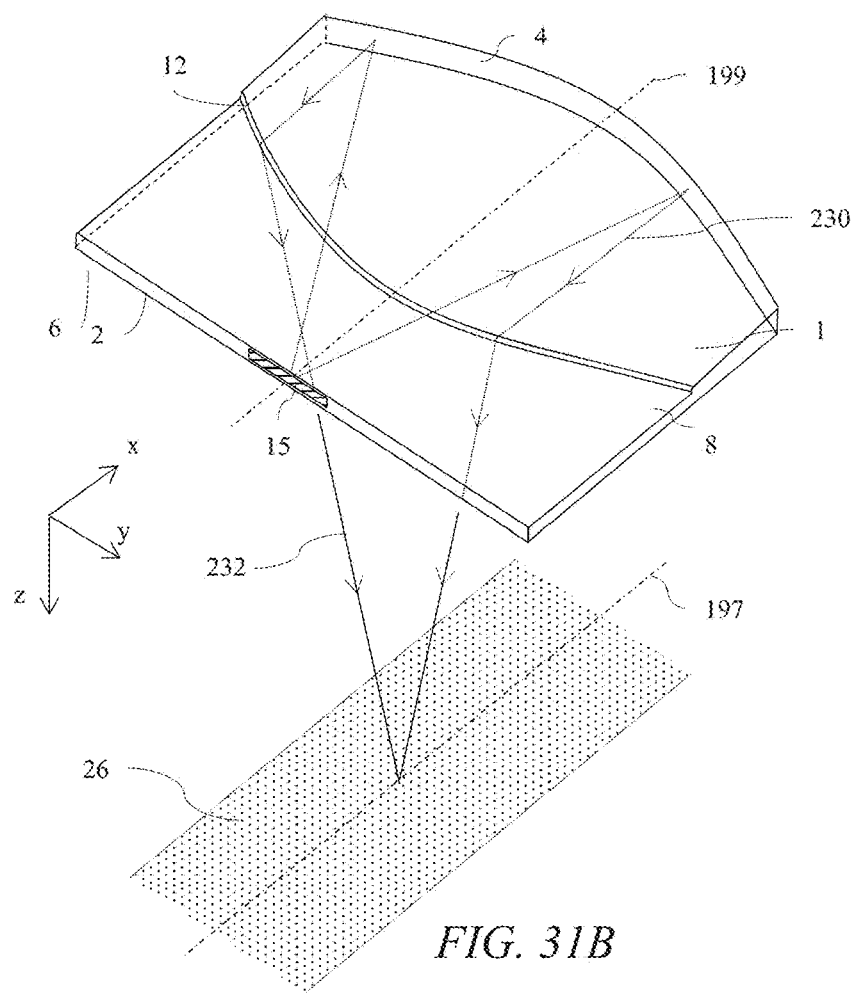
FIG. 31B is a schematic diagram illustrating in rear perspective view operation of an imaging waveguide in a narrow angle mode of operation.

FIG. 31A is a schematic diagram illustrating in side view a switchable directional display apparatus 100 comprising a switchable liquid crystal retarder 300 and backlight 20. The backlight 20 of FIG. 31A may be applied in any of the devices described herein and which comprises an imaging waveguide 1 illuminated by a light source array 15 through an input end 2. FIG. 31B which is a schematic diagram illustrating in rear perspective view operation of the imaging waveguide 1 of FIG. 31A in a narrow angle mode of operation.

The imaging waveguides 1 is of the type described in U.S. Pat. No. 9,519,153, which is herein incorporated by reference in its entirety. The waveguide 1 has an input end 2 extending in a lateral direction along the waveguide 1. An array of light sources 15 are disposed along the input end 2 and input light into the waveguide 1.

The waveguide 1 also has opposed first and second guide surfaces 6, 8 extending across the waveguide 1 from the input end 2 to a reflective end 4 for guiding light input at the input end 2 forwards and back along the waveguide 1. The second guide surface 8 has a plurality of light extraction features 12 facing the reflective end 4 and arranged to deflect at least some of the light guided back through the waveguide 1 from the reflective end 4 from different input positions across the input end 2 in different directions through the first guide surface 6 that are dependent on the input position.

In operation, light rays are directed from light source array 15 through an input end and are guided between first and second guiding surfaces 6,8 without loss to a reflective end 4. Reflected rays are incident onto facets 12 and output by reflection as light rays 230 or transmitted as light rays 232. Transmitted light rays 232 are directed back through the waveguide 1 by facets 803, 805 of rear reflector 800. Operation of rear reflectors are described further in U.S. Patent Publ. No. 2014-0240828, filed Feb. 21, 2014, entitled "Directional backlight having a rear reflector" incorporated herein by reference in its entirety.

As illustrated in FIG. 31B, optical power of the curved reflective end 4 and facets 12 provide an optical window 26 that is transmitted through the spatial light modulator 48 and has an axis 197 that is typically aligned to the optical axis 199 of the waveguide 1. Similar optical window 26 is provided by transmitted light rays 232 that are reflected by the rear reflector 800.

Figure 31C:
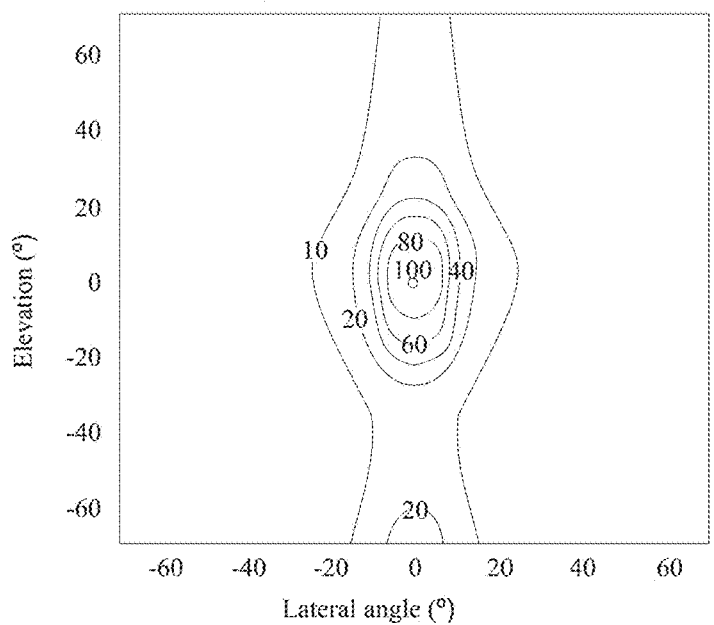
FIG. 31C is a schematic graph illustrating a field-of-view luminance plot of the output of FIG. 31B when used in a display apparatus with no switchable liquid crystal retarder.

FIG. 31C is a schematic graph illustrating field-of-view luminance plot of the output of FIG. 31B when used in a display apparatus with no switchable liquid crystal retarder. Thus for off-axis viewing positions observed by snoopers 47 may have reduced luminance, for example between 1% and 3% of the central peak luminance at an elevation of 0 degrees and lateral angle of +/−45 degrees. Further reduction of off-axis luminance is achieved by the plural retarders 301, 330 of the present embodiments.

Another type of directional backlight with low off-axis luminance will now be described.

Figure 32A:
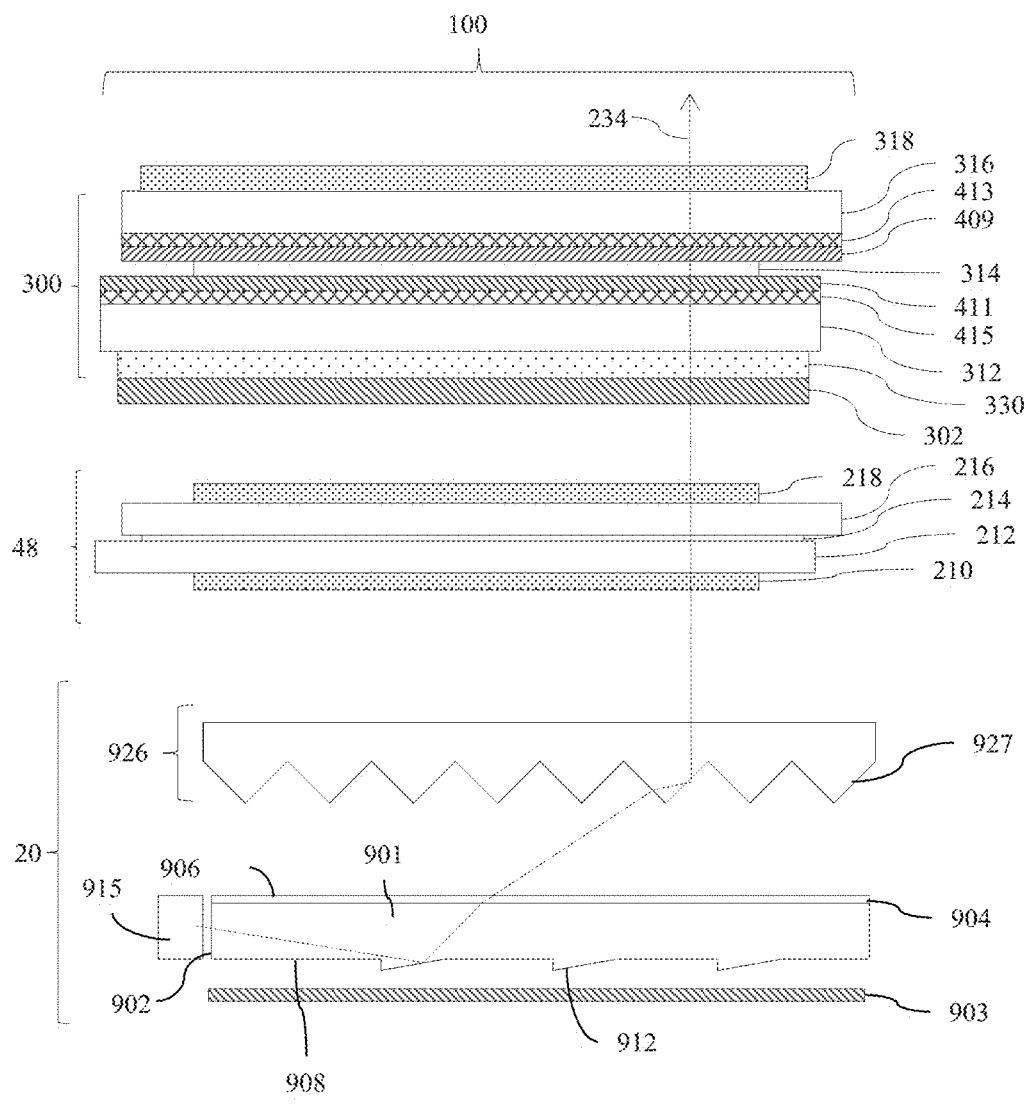
FIG. 32A is a schematic diagram illustrating in side view a switchable directional display apparatus comprising a switchable collimating waveguide and a switchable liquid crystal retarder operating in a privacy mode of operation.

FIG. 32A is a schematic diagram illustrating in side view a switchable directional display apparatus comprising a backlight 20 including a switchable collimating waveguide 901 and a switchable liquid crystal retarder 300 and additional polariser 318. The backlight 20 of FIG. 32A may be applied in any of the devices described herein and is arranged as follows.

The waveguide 901 has an input end 902 extending in a lateral direction along the waveguide 901. An array of light sources 915 are disposed along the input end 902 and input light into the waveguide 1. The waveguide 901 also has opposed first and second guide surfaces 906, 908 extending across the waveguide 1 from the input end 2 to a reflective end 4 for guiding light input at the input end 2 forwards and back along the waveguide 1. In operation, light is guided between the first and second guiding surface 906, 908.

The first guiding surface 906 may be provided with a lenticular structure 904 comprising a plurality of elongate lenticular elements 905 and the second guiding surface 908 may be provided with prismatic structures 912 which are inclined and act as light extraction features. The plurality of elongate lenticular elements 905 of the lenticular structure 904 and the plurality of inclined light extraction features deflect input light guided through the waveguide 901 to exit through the first guide surface 906.

A rear reflector 903 that may be a planar reflector is provided to direct light that is transmitted through the surface 908 back through the waveguide 901.

Output light rays that are incident on both the prismatic structures 912 and lenticular elements 905 of the lenticular structure 904 are output at angles close to grazing incidence to the surface 906. A prismatic turning film 926 comprising facets 927 is arranged to redirect output light rays 234 by total internal reflection through the spatial light modulator 48 and compensated switchable liquid crystal retarder 300.

Figure 32B:
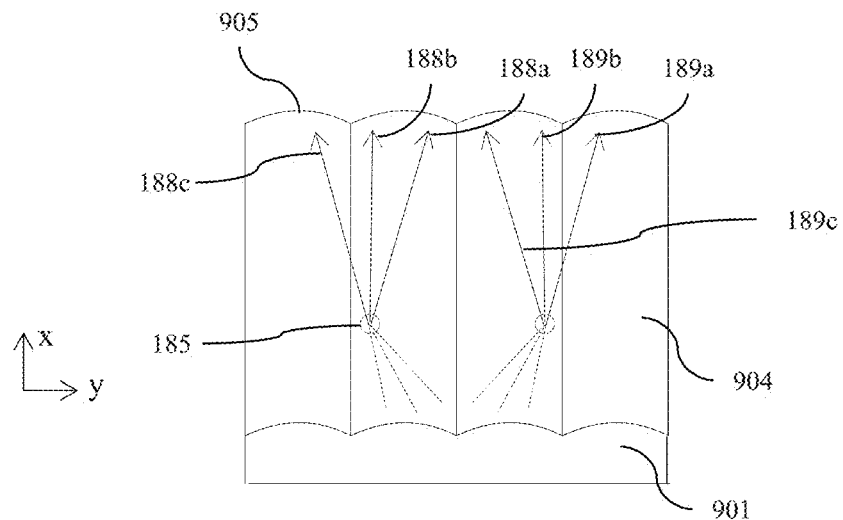
FIG. 32B is a schematic diagram illustrating in top view output of a collimating waveguide.

FIG. 32B is a schematic diagram illustrating in top view output of the collimating waveguide 901. Prismatic structures 912 are arranged to provide light at angles of incidence onto the lenticular structure 904 that are below the critical angle and thus may escape. On incidence at the edges of a lenticular surface, the inclination of the surface provides a light deflection for escaping rays and provides a collimating effect. Light ray 234 may be provided by light rays 188*a-c* and light rays 189*a-c*, with incidence on locations 185 of the lenticular structure 904 of the collimated waveguide 901.

Figure 32C:
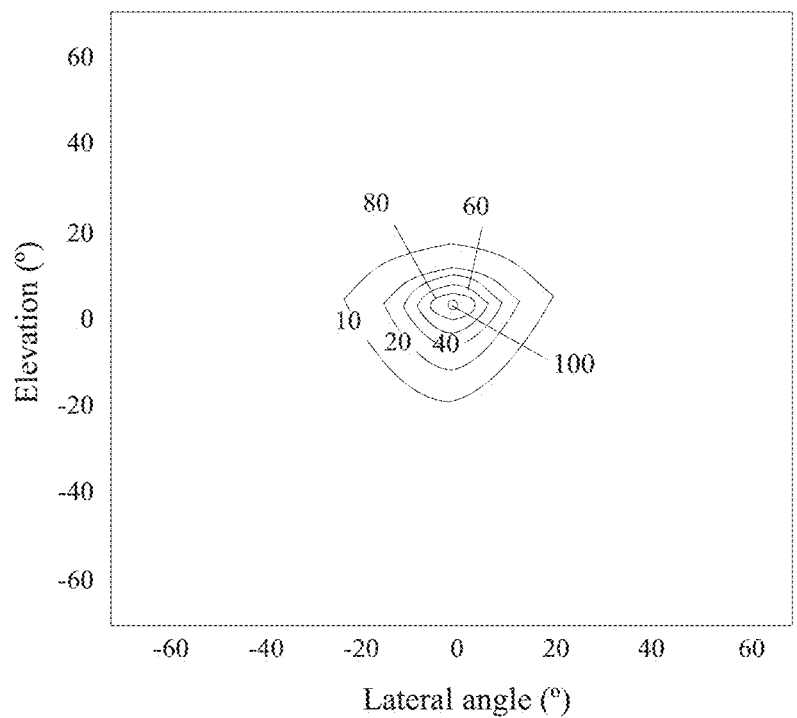
FIG. 32C is a schematic graph illustrating an iso-luminance field-of-view polar plot for the display apparatus of FIG. 32A.

FIG. 32C is a schematic graph illustrating an iso-luminance field-of-view polar plot for the display apparatus of FIG. 32A. Thus a narrow output light cone may be provided, with size determined by the structures of the structures 904, 912 and the turning film 926.

Advantageously in regions in which snoopers may be located with lateral angles of 45 degrees or greater for example, the luminance of output from the display is small, typically less than 2%. It would be desirable to achieve further reduction of output luminance. Such further reduction is provided by the compensated switchable liquid crystal retarder 300 and additional polariser 318 as illustrated in FIG. 32A. Advantageously a high performance privacy display with low off-axis luminance may be provided over a wide field of view.

Directional backlights such as the types described in FIG. 31A and FIG. 32A together with the plural retarders 301, 330 of the present embodiments may achieve off-axis luminance of less than 1.5%, preferably less than 0.75% and most preferably less than 0.5% may be achieved for typical snooper 47 locations. Further, high on-axis luminance and uniformity may be provided for the primary user 45. Advantageously a high performance privacy display with low off-axis luminance may be provided over a wide field of view, that may be switched to a wide angle mode by means of control of the switchable retarder 301 by means of control system 352 illustrated in FIG. 1A.

The operation of retarder layers between parallel polarisers for off-axis illumination will now be described further. In the various devices described above, at least one retarder is arranged between the reflective polariser 318 and the additional polariser 218 in various different configurations. In each case, the at least one retarder is configured so that it does not affect the luminance of light passing through the reflective polariser 318, the at least one retarder, and the additional polariser 218 along an axis along a normal to the plane of the retarder(s) but it does reduce the luminance of light passing through the reflective polariser 318, the at least one retarder, and the additional polariser 218 along an axis inclined to a normal to the plane of the retarder(s), at least in one of the switchable states of the compensated switchable retarder 300. There will now be given a description of this effect in more detail, the principles of which may be applied in general to all of the devices described above.

Figure 33A:
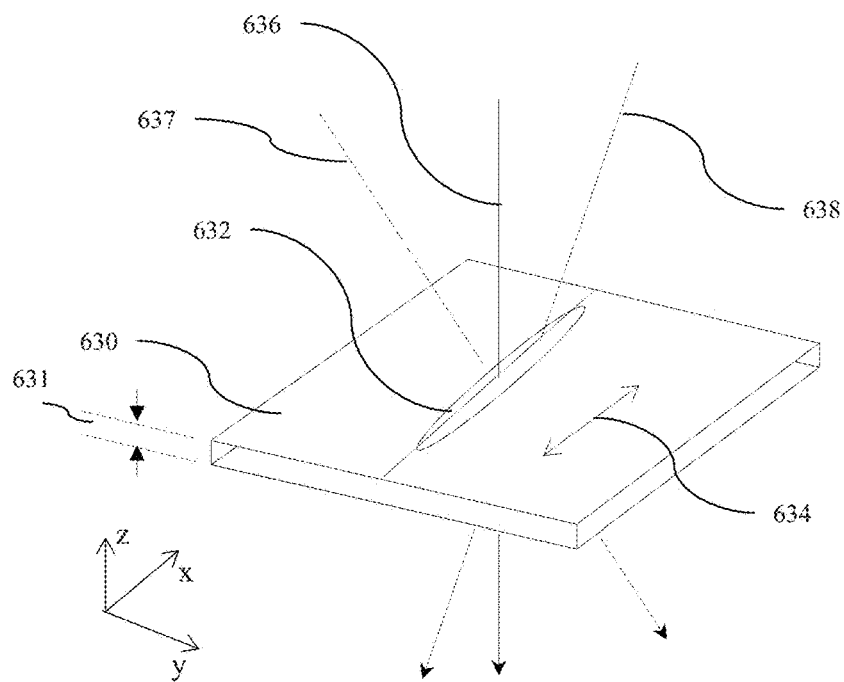
FIG. 33A is a schematic diagram illustrating in perspective view illumination of a retarder layer by off-axis light.

FIG. 33A is a schematic diagram illustrating in perspective view illumination of a retarder layer by off-axis light. Correction retarder 630 may comprise birefringent material, represented by refractive index ellipsoid 632 with optical axis direction 634 at 0 degrees to the x-axis, and have a thickness 631. Normal light rays 636 propagate so that the path length in the material is the same as the thickness 631. Light rays 637 are in the y-z plane have an increased path length; however the birefringence of the material is substantially the same as the rays 636. By way of comparison light rays 638 that are in the x-z plane have an increased path length in the birefringent material and further the birefringence is different to the normal ray 636.

The retardance of the retarder 630 is thus dependent on the angle of incidence of the respective ray, and also the plane of incidence, that is rays 638 in the x-z will have a retardance different from the normal rays 636 and the rays 637 in the y-z plane.

The interaction of polarized light with the retarder 630 will now be described. To distinguish from the first and second polarization components during operation in a directional backlight 101, the following explanation will refer to third and fourth polarization components.

Figure 33B:
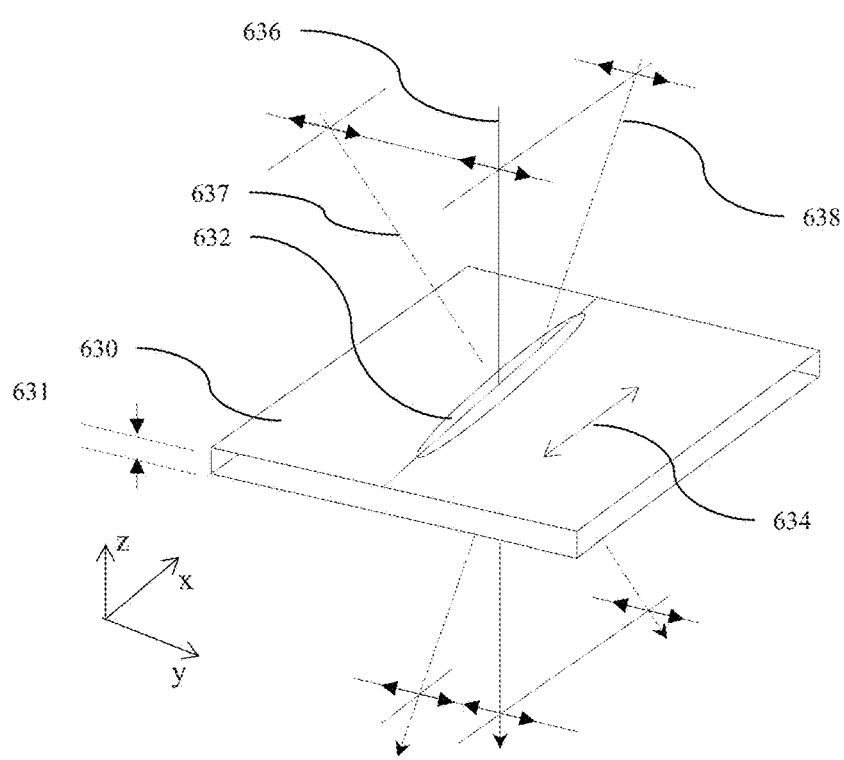
FIG. 33B is a schematic diagram illustrating in perspective view illumination of a retarder layer by off-axis light of a first linear polarization state at 0 degrees.
Figure 33C:
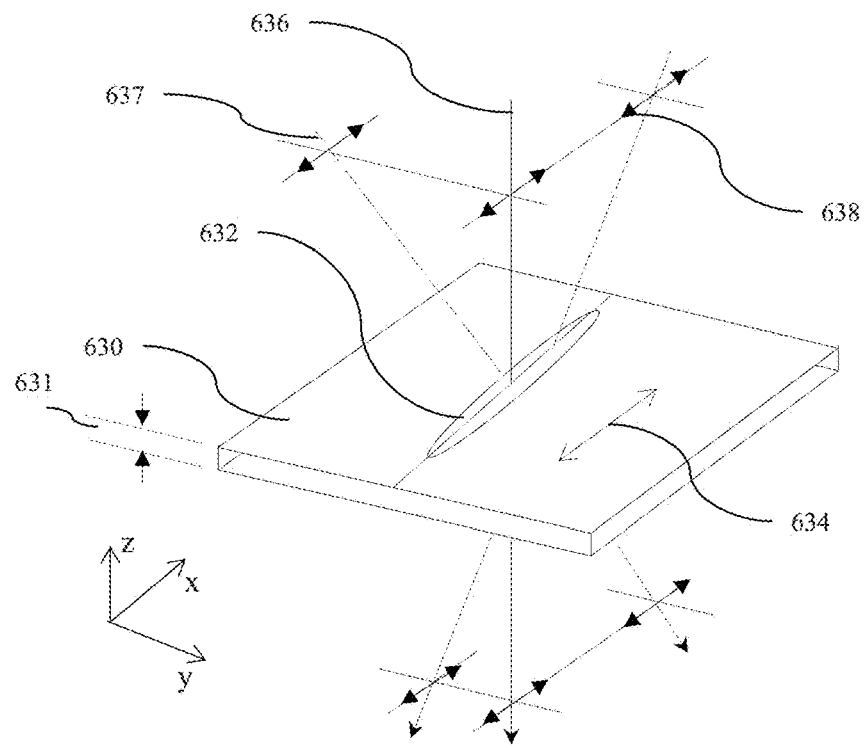
FIG. 33C is a schematic diagram illustrating in perspective view illumination of a retarder layer by off-axis light of a first linear polarization state at 90 degrees.

FIG. 33B is a schematic diagram illustrating in perspective view illumination of a retarder layer by off-axis light of a third linear polarization state at 90 degrees to the x-axis and FIG. 33C is a schematic diagram illustrating in perspective view illumination of a retarder layer by off-axis light of a fourth linear polarization state at 0 degrees to the x-axis. In such arrangements, the incident linear polarization states are aligned to the optical axes of the birefringent material, represented by ellipse 632. Consequently, no phase difference between the third and fourth orthogonal polarization components is provided, and there is no resultant change of the polarization state of the linearly polarized input for each ray 636, 637, 638. Thus, the retarder 630 introduces no phase shift to polarisation components of light passed by the polariser on the input side of the retarder 630 along an axis along a normal to the plane of the retarder 630. Accordingly, the retarder 630 does not affect the luminance of light passing through the retarder 630 and polarisers (not shown) on each side of the retarder 630. Although FIGS. 29A-C relate specifically to the retarder 630 that is passive, a similar effect is achieved by the retarders in the devices described above.

Figure 33D:
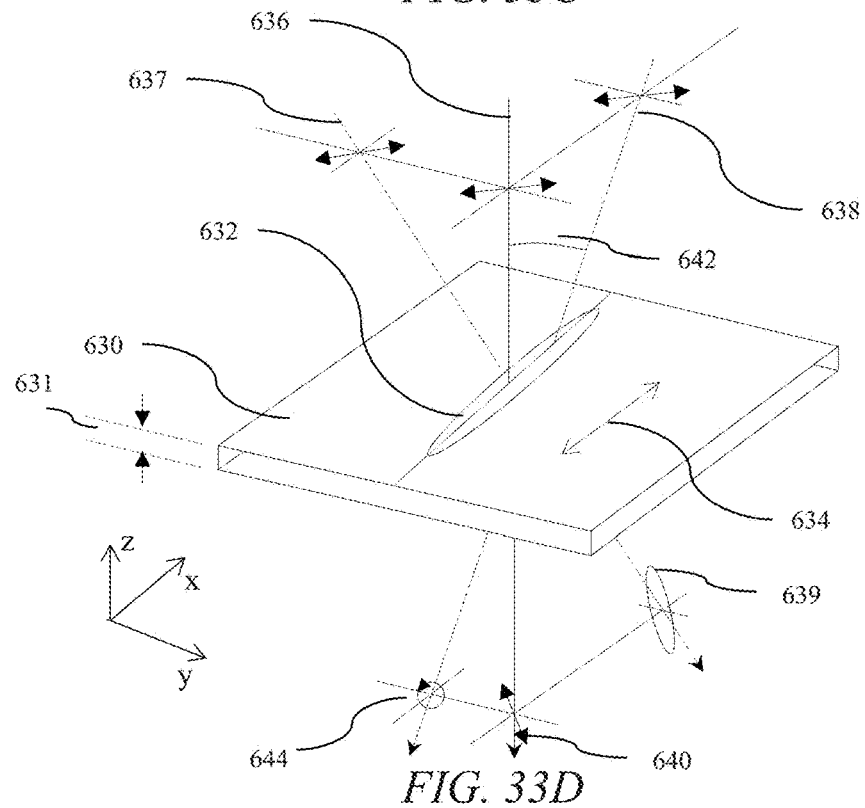
FIG. 33D is a schematic diagram illustrating in perspective view illumination of a retarder layer by off-axis light of a first linear polarization state at 45 degrees.

FIG. 33D is a schematic diagram illustrating in perspective view illumination of a retarder 630 layer by off-axis light of a linear polarization state at 45 degrees. The linear polarization state may be resolved into third and fourth polarization components that are respectively orthogonal and parallel to optical axis 634 direction. The retarder thickness 631 and material retardance represented by refractive index ellipsoid 632 may provide a net effect of relatively shifting the phase of the third and fourth polarization components incident thereon in a normal direction represented by ray 636 by half a wavelength, for a design wavelength. The design wavelength may for example be in the range of 500 to 550 nm.

At the design wavelength and for light propagating normally along ray 636 then the output polarization may be rotated by 90 degrees to a linear polarization state 640 at −45 degrees. Light propagating along ray 637 may see a phase difference that is similar but not identical to the phase difference along ray 637 due to the change in thickness, and thus an elliptical polarization state 639 may be output which may have a major axis similar to the linear polarization axis of the output light for ray 636.

By way of contrast, the phase difference for the incident linear polarization state along ray 638 may be significantly different, in particular a lower phase difference may be provided. Such phase difference may provide an output polarization state 644 that is substantially circular at a given inclination angle 642. Thus, the retarder 630 introduces a phase shift to polarisation components of light passed by the polariser on the input side of the retarder 630 along an axis corresponding to ray 638 that is inclined to a normal to the plane of the retarder 630. Although FIG. 29D relates to the retarder 630 that is passive, a similar effect is achieved by the retarders described above, in a switchable state of the switchable liquid crystal retarder corresponding to the privacy mode.

To illustrate the off-axis behaviour of retarder stacks, the angular luminance control of C-plates 308A, 308B between an additional polariser 318 and output display polariser 218 will now be described for various off-axis illumination arrangements with reference to the operation of a C-plate between the parallel polarisers 500, 210 will now be described.

Figure 34A:
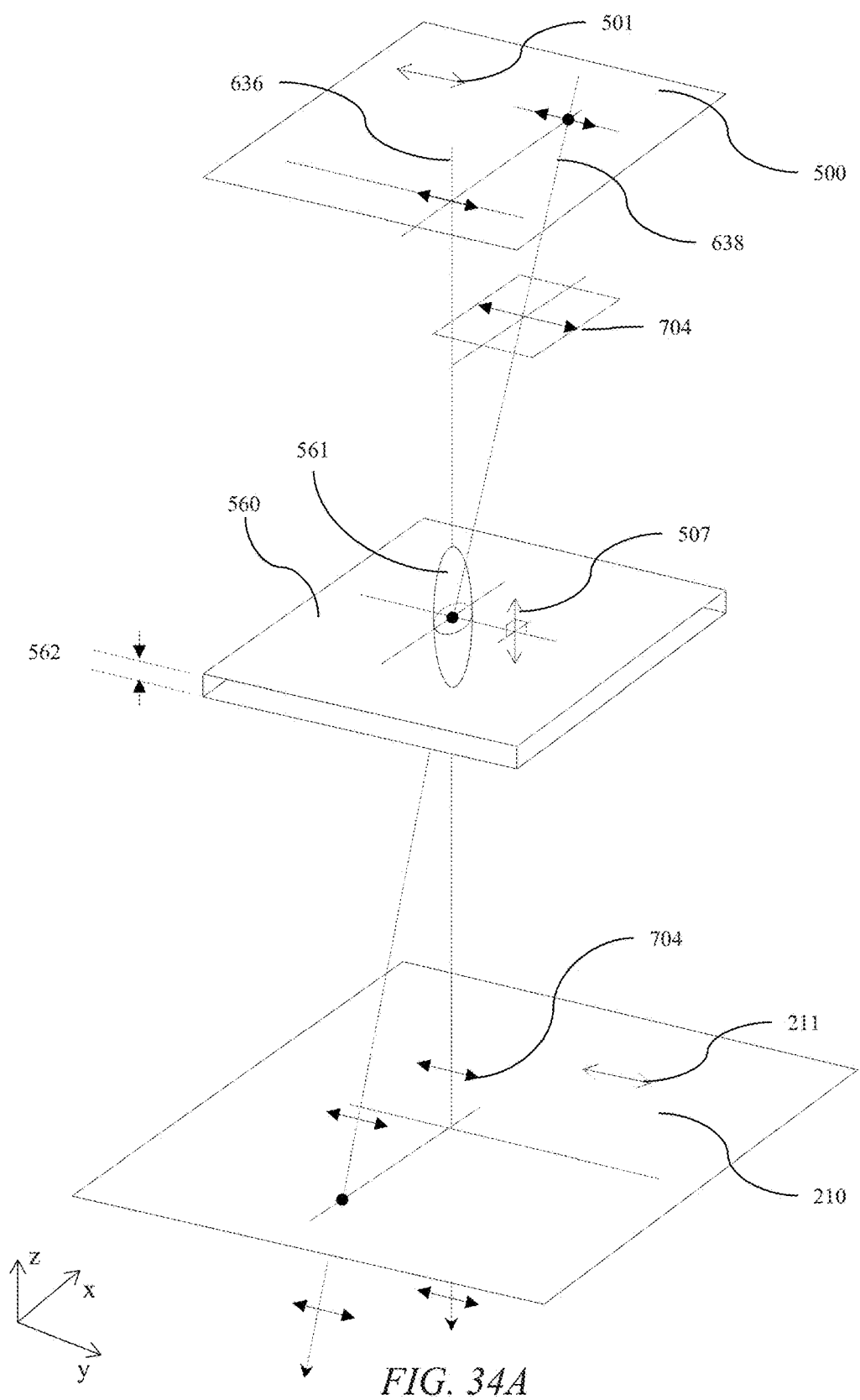
FIG. 34A is a schematic diagram illustrating in perspective view illumination of a C-plate retarder by off-axis polarised light with a positive elevation.

FIG. 34A is a schematic diagram illustrating in perspective view illumination of a C-plate layer by off-axis polarised light with a positive elevation. Incident linear polarisation component 704 is incident onto the birefringent material 632 of the retarder 560 that is a C-plate with optical axis direction 507 that is perpendicular to the plane of the retarder 560. Polarisation component 704 sees no net phase difference on transmission through the liquid crystal molecule and so the output polarisation component is the same as component 704. Thus a maximum transmission is seen through the polariser 210. Thus the retarder 560 having an optical axis 561 perpendicular to the plane of the retarder 560, that is the x-y plane. The retarder 560 having an optical axis perpendicular to the plane of the retarder comprises a C-plate.

Figure 34B:
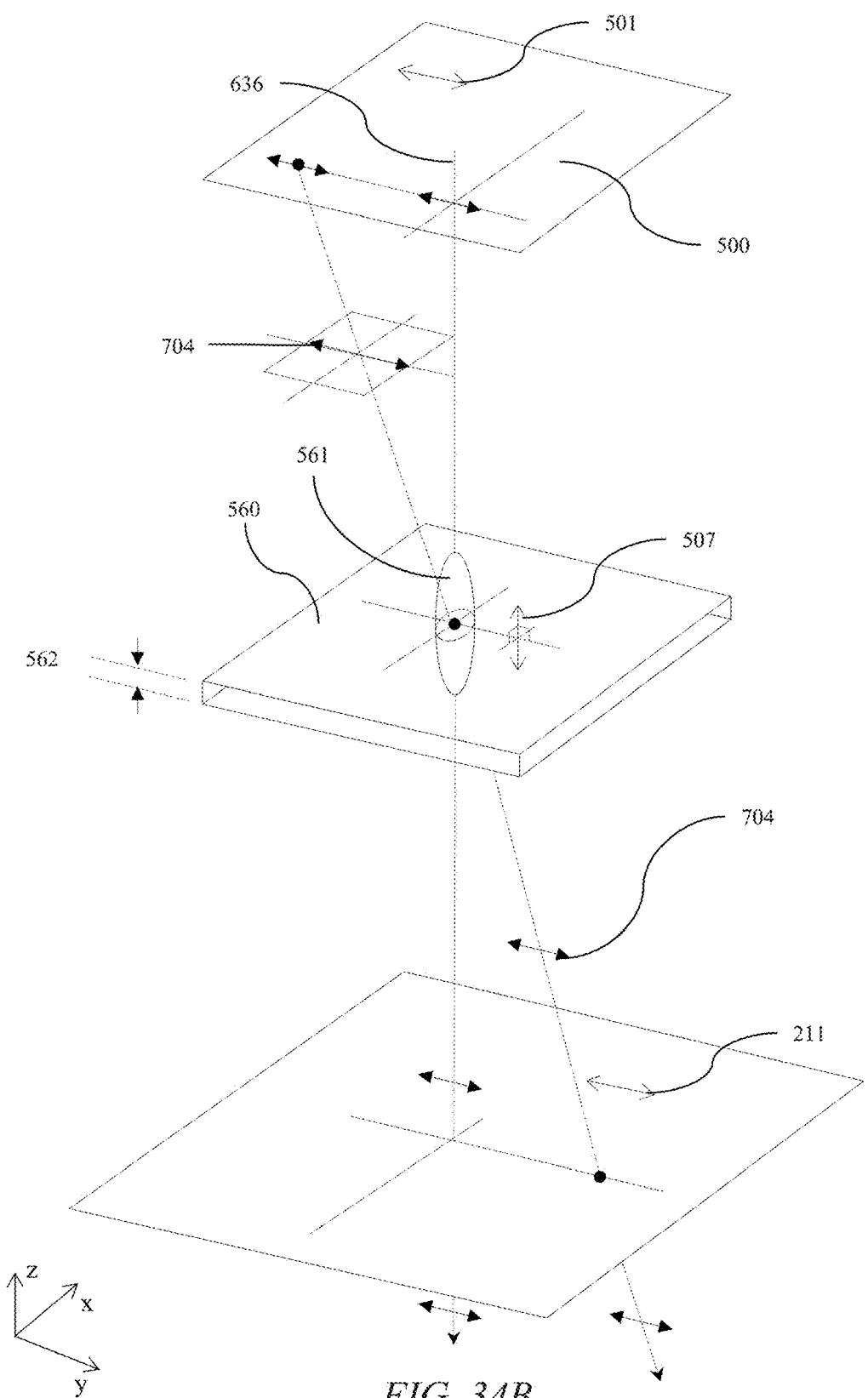
FIG. 34B is a schematic diagram illustrating in perspective view illumination of a C-plate retarder by off-axis polarised light with a negative lateral angle.

FIG. 34B is a schematic diagram illustrating in perspective view illumination of a C-plate layer by off-axis polarised light with a negative lateral angle. As with the arrangement of FIG. 34A, polarisation state 704 sees no net phase difference and is transmitted with maximum luminance. Thus, the retarder 560 introduces no phase shift to polarisation components of light passed by the polariser on the input side of the retarder 560 along an axis along a normal to the plane of the retarder 560. Accordingly, the retarder 560 does not affect the luminance of light passing through the retarder 560 and polarisers (not shown) on each side of the retarder 560. Although FIGS. 29A-C relate specifically to the retarder 560 that is passive, a similar effect is achieved by the retarders in the devices described above.

Figure 34C:
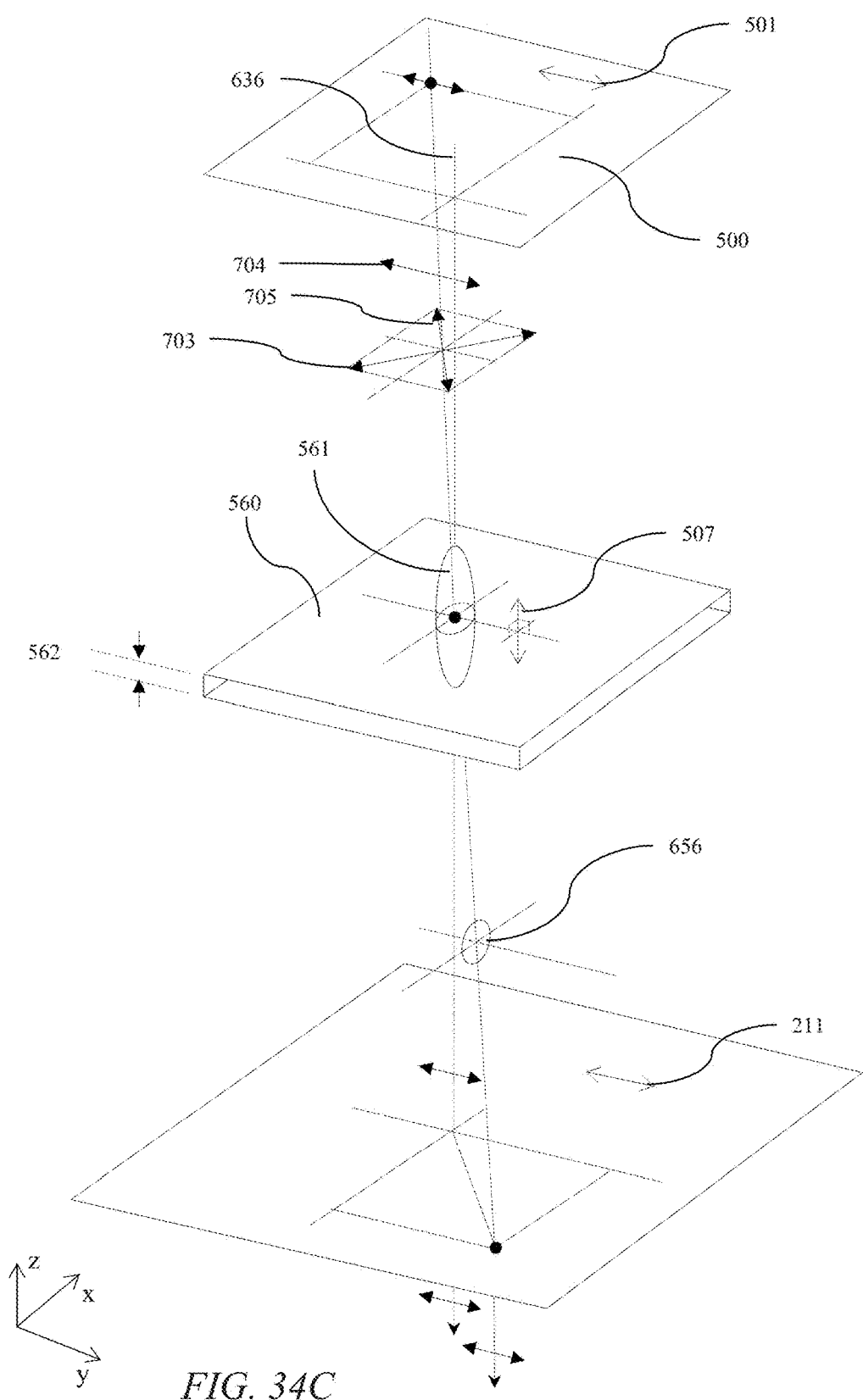
FIG. 34C is a schematic diagram illustrating in perspective view illumination of a C-plate retarder by off-axis polarised light with a positive elevation and negative lateral angle.

FIG. 34C is a schematic diagram illustrating in perspective view illumination of a C-plate layer by off-axis polarised light with a positive elevation and negative lateral angle. In comparison to the arrangement of FIGS. 34A-B, the polarisation state 704 resolves onto eigenstates 703, 705 with respect to the birefringent material 632 providing a net phase difference on transmission through the retarder 560. The resultant elliptical polarisation component 656 is transmitted through polariser 210 with reduced luminance in comparison to the rays illustrated in FIGS. 34A-B.

Figure 34D:
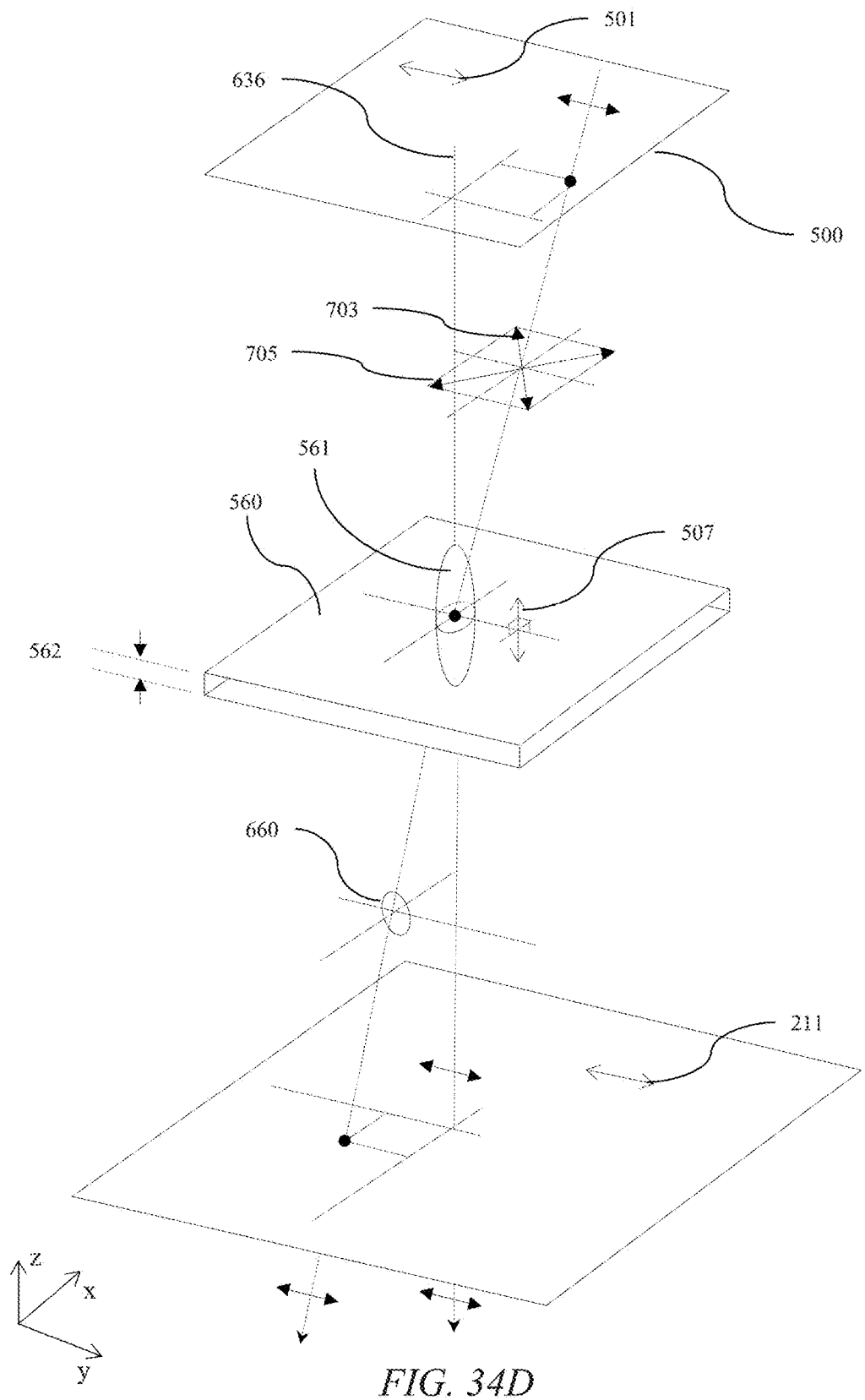
FIG. 34D is a schematic diagram illustrating in perspective view illumination of a C-plate retarder by off-axis polarised light with a positive elevation and positive lateral angle.

FIG. 34D is a schematic diagram illustrating in perspective view illumination of a C-plate layer by off-axis polarised light with a positive elevation and positive lateral angle. In a similar manner to FIG. 34C, the polarisation component 704 is resolved into eigenstates 703, 705 that undergo a net phase difference, and elliptical polarisation component 660 is provided, which after transmission through the polariser reduces the luminance of the respective off-axis ray. Thus, the retarder 560 introduces a phase shift to polarisation components of light passed by the polariser on the input side of the retarder 560 along an axis that is inclined to a normal to the plane of the retarder 560. Although FIG. 29D relates to the retarder 560 that is passive, a similar effect is achieved by the retarders described above, in a switchable state of the switchable liquid crystal retarder corresponding to the privacy mode.

Figure 34E:
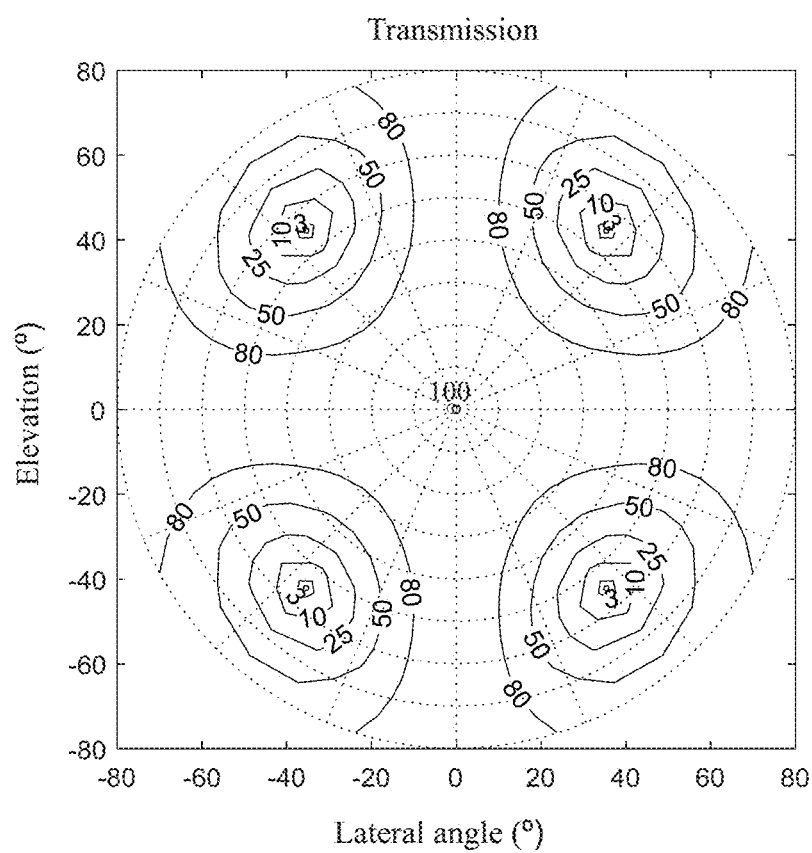
FIG. 34E is a schematic graph illustrating the variation of output transmission with polar direction for transmitted light rays in FIGS. 34A-D.

FIG. 34E is a schematic graph illustrating the variation of output transmission with polar direction for transmitted light rays in FIGS. 34A-D. Thus, the C-plate may provide luminance reduction in polar quadrants. In combination with switchable liquid crystal retarder layer 314 described elsewhere herein, (i) removal of luminance reduction of the C-plate may be provided in a first wide angle state of operation (ii) extended polar region for luminance reduction may be achieved in a second privacy state of operation.

To illustrate the off-axis behaviour of retarder stacks, the angular luminance control of crossed A-plates 308A, 308B between an additional polariser 318 and output display polariser 218 will now be described for various off-axis illumination arrangements.

Figure 35A:
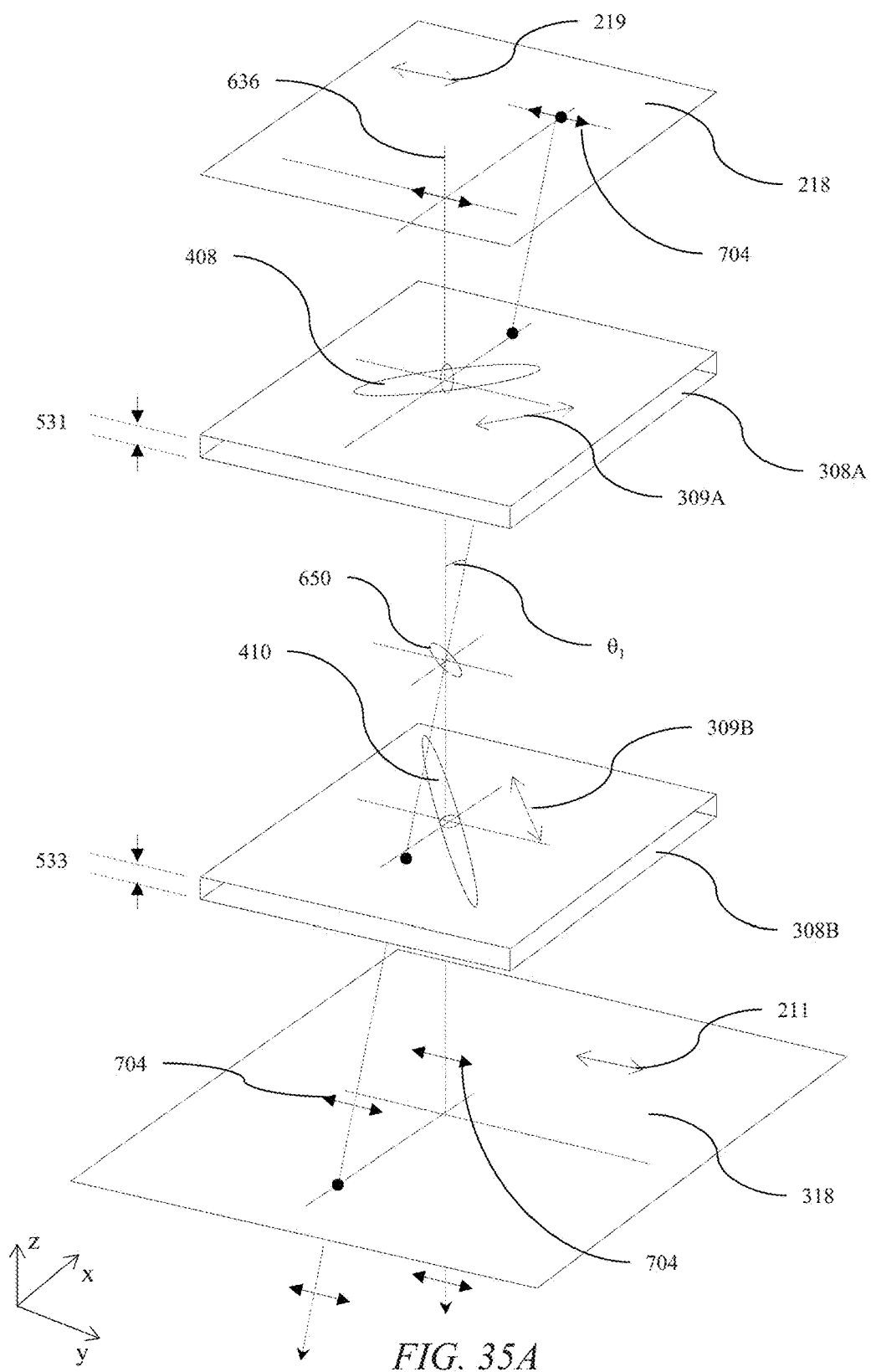
FIG. 35A is a schematic diagram illustrating in perspective view illumination of crossed A-plate retarder layers by off-axis polarised light with a positive elevation.

FIG. 35A is a schematic diagram illustrating in perspective view illumination of crossed A-plate retarder layers by off-axis polarised light with a positive elevation. Linear polariser 218 with electric vector transmission direction 219 is used to provide a linear polarisation state 704 that is parallel to the lateral direction onto first A-plate 308A of the crossed A-plates 308A, 308B. The optical axis direction 309A is inclined at +45 degrees to the lateral direction. The retardance of the retarder 308A for the off-axis angle $\theta_1$ in the positive elevation direction provides a resultant polarisation component 650 that is generally elliptical on output. Polarisation component 650 is incident onto the second A-plate 308B of the crossed A-plates 308A, 308B that has an optical axis direction 309B that is orthogonal to the optical axis direction 309A of the first A-plate 308A. In the plane of incidence of FIG. 35A, the retardance of the second A-plate 308B for the off-axis angle $\theta_1$ is equal and opposite to the retardance of the first A-plate 308A. Thus a net zero retardation is provided for the incident polarisation component 704 and the output polarisation component is the same as the input polarisation component 704.

The output polarisation component is aligned to the electric vector transmission direction of the additional polariser 318, and thus is transmitted efficiently. Advantageously substantially no losses are provided for light rays that have zero lateral angle angular component so that full transmission efficiency is achieved.

Figure 35B:
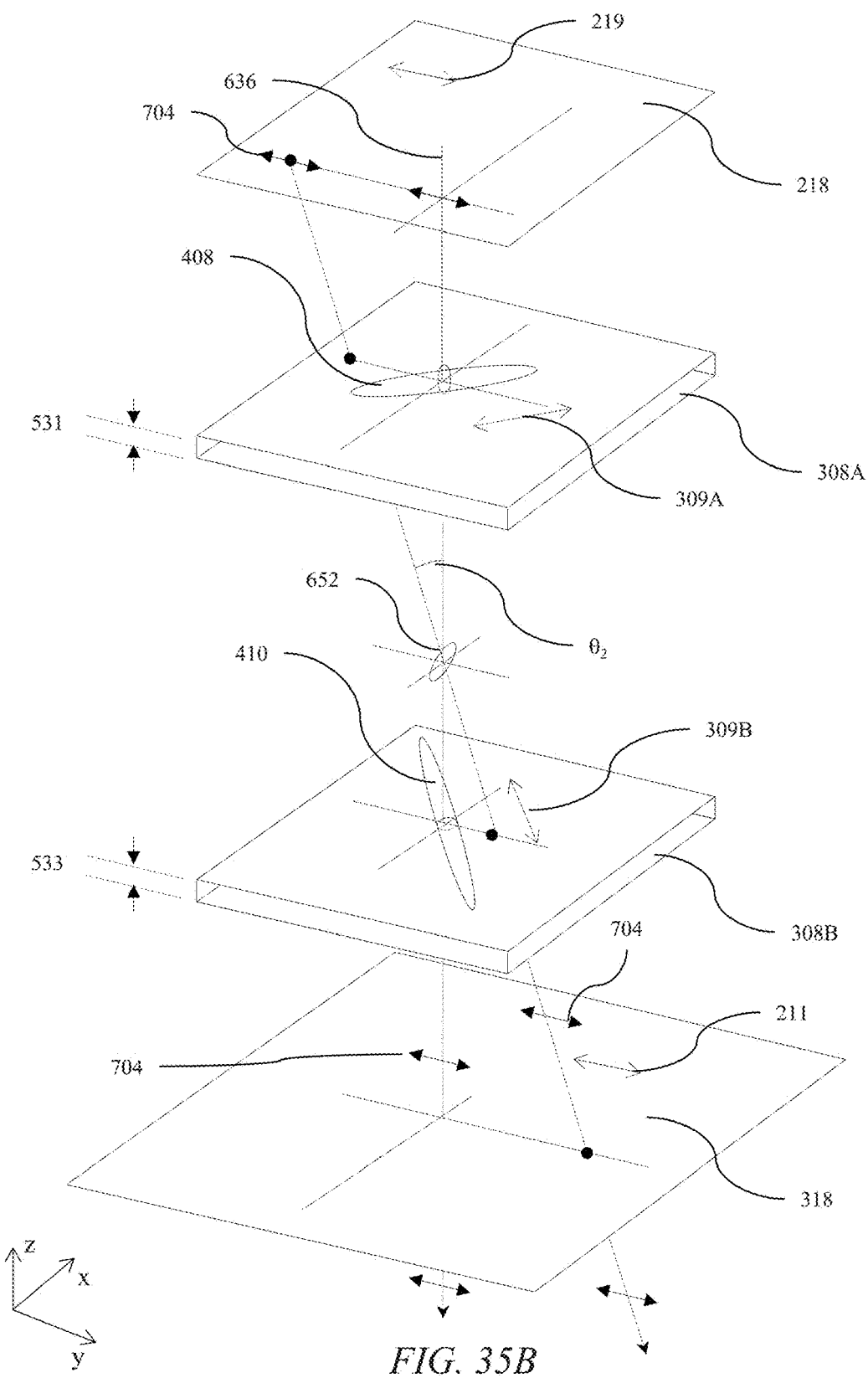
FIG. 35B is a schematic diagram illustrating in perspective view illumination of crossed A-plate retarder layers by off-axis polarised light with a negative lateral angle.

FIG. 35B is a schematic diagram illustrating in perspective view illumination of crossed A-plate retarder layers by off-axis polarised light with a negative lateral angle. Thus input polarisation component is converted by the first A-plate 308A to an intermediate polarisation component 652 that is generally an elliptical polarisation state. The second A-plate 308B again provides an equal and opposite retardation to the first A-plate so that the output polarisation component is the same as the input polarisation component 704 and light is efficiently transmitted through the polariser 318.

Thus the retarder comprises a pair of retarders 308A, 308B which have optical axes in the plane of the retarders 308A, 308B that are crossed, that is the x-y plane in the present embodiments. The pair of retarders 308A, 308B have optical axes 309A, 309B that each extend at 45° with respect to an electric vector transmission direction that is parallel to the electric vector transmission of the polariser 318.

Advantageously substantially no losses are provided for light rays that have zero elevation angular component so that full transmission efficiency is achieved.

Figure 35C:
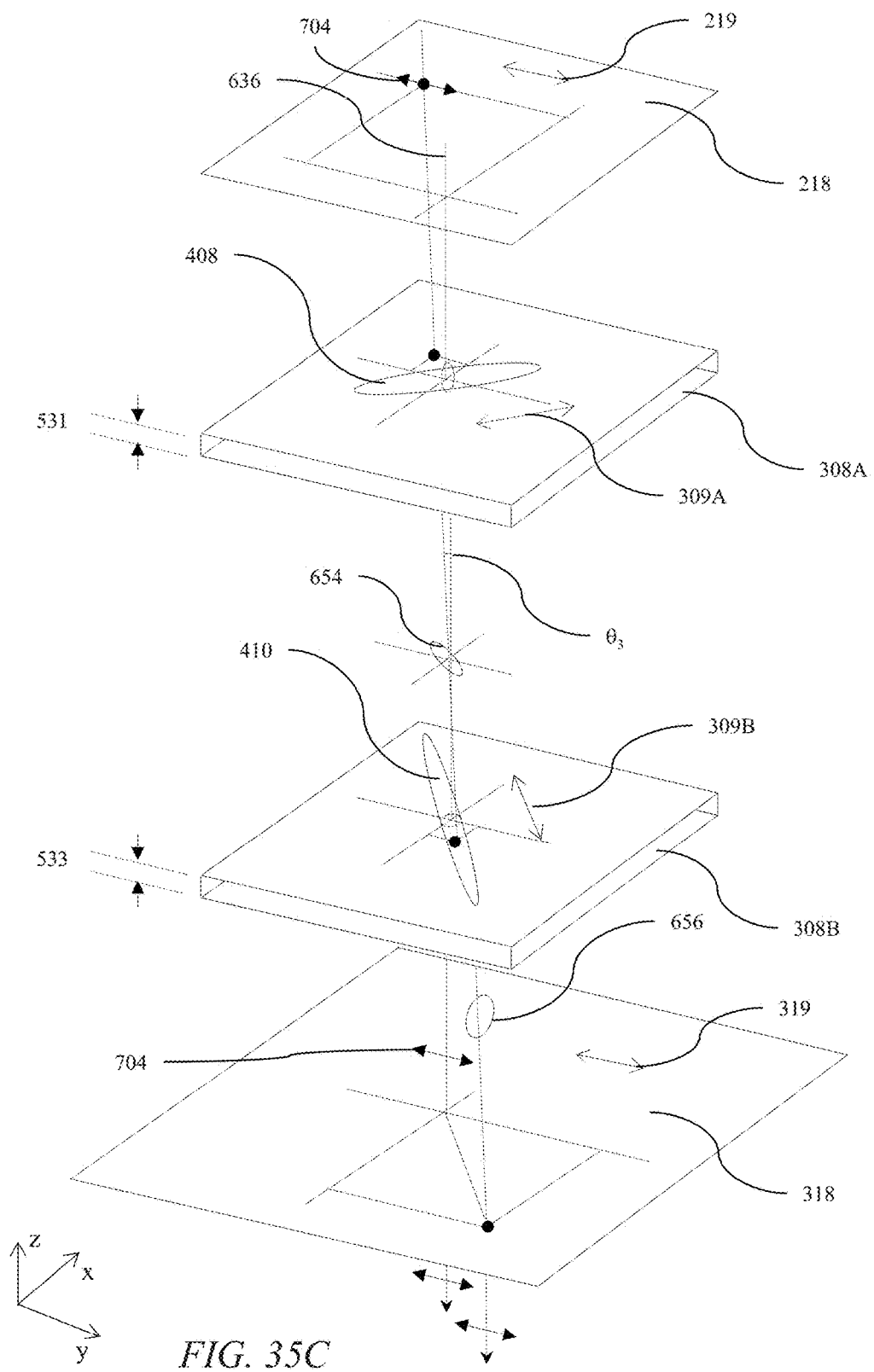
FIG. 35C is a schematic diagram illustrating in perspective view illumination of crossed A-plate retarder layers by off-axis polarised light with a positive elevation and negative lateral angle.

FIG. 35C is a schematic diagram illustrating in perspective view illumination of crossed A-plate retarder layers by off-axis polarised light with a positive elevation and negative lateral angle. Polarisation component 704 is converted to an elliptical polarisation component 654 by first A-plate 308A. A resultant elliptical component 656 is output from the second A-plate 308B. Elliptical component 656 is analysed by input polariser 318 with reduced luminance in comparison to the input luminance of the first polarisation component 704.

Figure 35D:
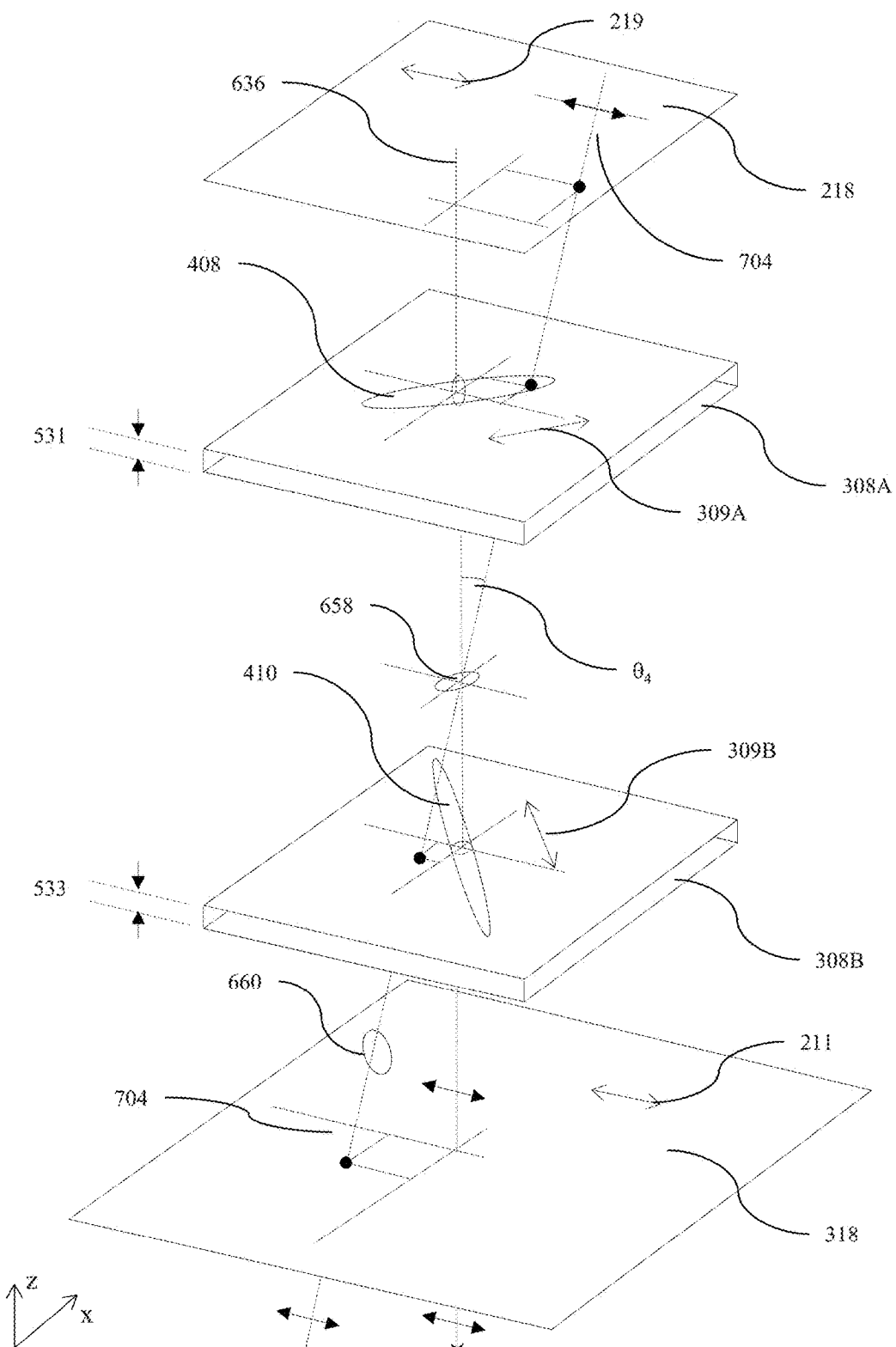
FIG. 35D is a schematic diagram illustrating in perspective view illumination of crossed A-plate retarder layers by off-axis polarised light with a positive elevation and positive lateral angle.

FIG. 35D is a schematic diagram illustrating in perspective view illumination of crossed A-plate retarder layers by off-axis polarised light with a positive elevation and positive lateral angle. Polarisation components 658 and 660 are provided by first and second A-plates 308A, 308B as net retardance of first and second retarders does not provide compensation.

Thus luminance is reduced for light rays that have non-zero lateral angle and non-zero elevation components. Advantageously display privacy can be increased for snoopers that are arranged in viewing quadrants while luminous efficiency for primary display users is not substantially reduced.

Figure 35E:
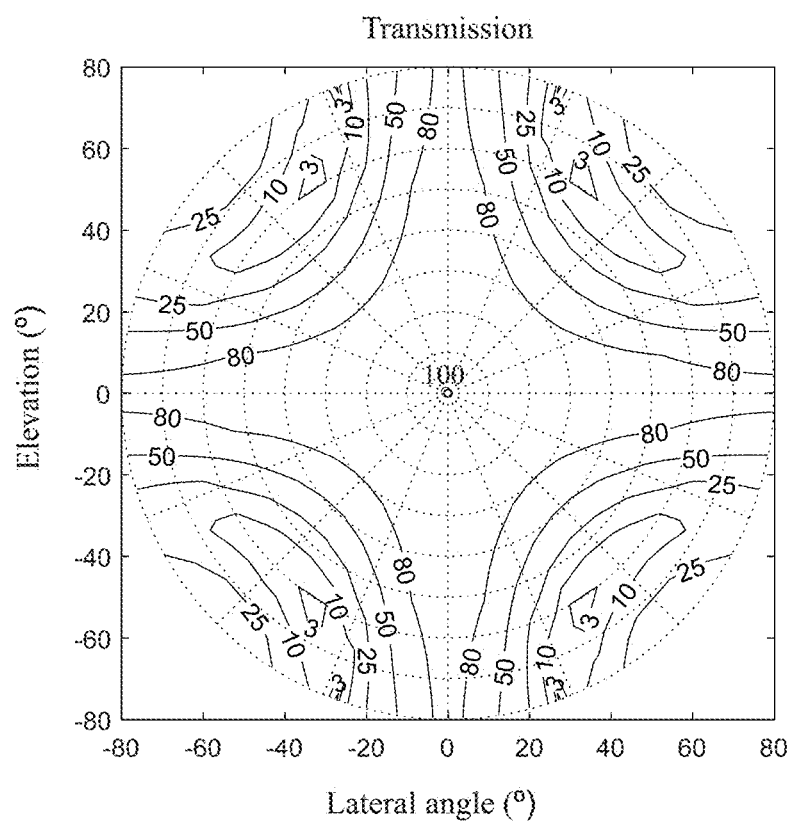
FIG. 35E is a schematic graph illustrating the variation of output transmission with polar direction for transmitted light rays in FIGS. 35A-D.

FIG. 35E is a schematic graph illustrating the variation of output transmission with polar direction for transmitted light rays in FIGS. 35A-D. In comparison to the arrangement of FIG. 34E, the area of luminance reduction is increased for off-axis viewing. However, the switchable liquid crystal retarder layer 301 may provide reduced uniformity in comparison to the C-plate arrangements for off-axis viewing in the first wide mode state of operation.

As may be used herein, the terms "substantially" and "approximately" provide an industry-accepted tolerance for its corresponding term and/or relativity between items. Such an industry-accepted tolerance ranges from zero percent to ten percent and corresponds to, but is not limited to, component values, angles, et cetera. Such relativity between items ranges between approximately zero percent to ten percent.

While various embodiments in accordance with the principles disclosed herein have been described above, it should be understood that they have been presented by way of example only, and not limitation. Thus, the breadth and scope of this disclosure should not be limited by any of the above-described exemplary embodiments, but should be defined only in accordance with any claims and their equivalents issuing from this disclosure. Furthermore, the above advantages and features are provided in described embodiments, but shall not limit the application of such issued claims to processes and structures accomplishing any or all of the above advantages.

Additionally, the section headings herein are provided for consistency with the suggestions under 37 CFR 1.77 or otherwise to provide organizational cues. These headings shall not limit or characterize the embodiment(s) set out in any claims that may issue from this disclosure. Specifically and by way of example, although the headings refer to a "Technical Field," the claims should not be limited by the language chosen under this heading to describe the so-called field. Further, a description of a technology in the "Background" is not to be construed as an admission that certain technology is prior art to any embodiment(s) in this disclosure. Neither is the "Summary" to be considered as a characterization of the embodiment(s) set forth in issued claims. Furthermore, any reference in this disclosure to "invention" in the singular should not be used to argue that there is only a single point of novelty in this disclosure. Multiple embodiments may be set forth according to the limitations of the multiple claims issuing from this disclosure, and such claims accordingly define the embodiment(s), and their equivalents, that are protected thereby. In all instances, the scope of such claims shall be considered on their own merits in light of this disclosure, but should not be constrained by the headings set forth herein.

The invention claimed is:

1. A switchable display device for use in ambient illumination comprising:
   a spatial light modulator arranged to output light;
   wherein the spatial light modulator comprises a display polariser arranged on the output side of the spatial light modulator;
   an additional polariser arranged on the output side of the display polariser;
   a reflective polariser arranged between the display polariser and the additional polariser; and
   plural retarders arranged between the additional polariser and the reflective polariser,
   wherein the plural retarders comprise:
   a switchable liquid crystal retarder comprising: a layer of liquid crystal material having a positive dielectric anisotropy and having a retardance for light of a wavelength of 550 nm in a range from 500 nm to 1000 nm; and two surface alignment layers disposed adjacent to the layer of liquid crystal material and on opposite sides thereof, each of the surface alignment layers being arranged to provide homogeneous alignment in the adjacent liquid crystal material and each of the surface alignment layers having a pretilt having a pretilt direction with a component in the plane of the layer of liquid crystal material that is parallel or anti-parallel or orthogonal to an electric vector transmission direction of the reflective polariser; and
   at least one passive compensation retarder that comprises either:
   a passive uniaxial retarder having its optical axis perpendicular to the plane of the retarder and having a retardance for light of a wavelength of 550 nm in a range from −300 nm to −700 nm; or
   a pair of passive uniaxial retarders having optical axes in the plane of the retarders that are crossed and having a retardance for light of a wavelength of 550 nm in a range from +300 nm to +800 nm.

2. A switchable display device according to claim 1, wherein the display polariser and the additional polariser have electric vector transmission directions that are parallel.

3. A switchable display device according to claim 1, wherein the electric vector transmission direction of the reflective polariser is parallel to the electric vector transmission direction of the additional polariser.

4. A switchable display device according to claim 1, wherein the electric vector transmission direction of the reflective polariser is parallel to the electric vector transmission direction of the display polariser.

5. A switchable display device according to claim 1, wherein the layer of liquid crystal material has a retardance for light of a wavelength of 550 nm in a range from 600 nm to 850 nm.

6. A switchable display device according to claim 1, wherein the layer of liquid crystal material has a retardance for light of a wavelength of 550 nm in a range from 700 nm to 800 nm.

7. A switchable display device according to claim 1, wherein the at least one passive compensation retarder comprises a passive retarder having its optical axis perpendicular to the plane of the retarder and having a retardance for light of a wavelength of 550 nm in a range in a range from −350 nm to −600 nm.

8. A switchable display device according to claim 1, wherein the at least one passive compensation retarder comprises a passive retarder having its optical axis perpendicular to the plane of the retarder and having a retardance for light of a wavelength of 550 nm in a range in a range from −400 nm to −500 nm.

9. A switchable display device according to claim 1, wherein the at least one passive compensation retarder comprises a pair of retarders which have optical axes in the plane of the retarders that are crossed, each retarder of the pair of retarders having a retardance for light of a wavelength of 550 nm in a range from 350 nm to 650 nm.

10. A switchable display device according to claim 1, wherein the at least one passive compensation retarder comprises a pair of retarders which have optical axes in the plane of the retarders that are crossed, each retarder of the pair of retarders having a retardance for light of a wavelength of 550 nm in a range from in a range from 450 nm to 500 nm.

11. A switchable display device according to claim 1 wherein the spatial light modulator comprises an emissive spatial light modulator.

12. A switchable display device according to claim 1 wherein the spatial light modulator comprises a transmissive spatial light modulator and a backlight arranged to output light.

13. A switchable display device according to claim 1, wherein the spatial light modulator provides a luminance at polar angles to the normal to the spatial light modulator greater than 45 degrees that is at most 33% of the luminance along the normal to the spatial light modulator.

14. A switchable display device according to claim 1, wherein the spatial light modulator provides a luminance at polar angles to the normal to the spatial light modulator greater than 45 degrees that is at most 20% of the luminance along the normal to the spatial light modulator.

15. A switchable display device according to claim 1, wherein the spatial light modulator provides a luminance at polar angles to the normal to the spatial light modulator greater than 45 degrees that is at most 10% of the luminance along the normal to the spatial light modulator.

16. A switchable display device according to claim 1, wherein the at least one passive compensation retarder comprises a pair of passive retarders have optical axes that are crossed and extend at 45° and at 135°, respectively, with respect to an electric vector transmission direction that is parallel to the electric vector transmission of the reflective polariser.

17. A switchable display device according to claim 1, wherein the retardance of the at least one passive compensation retarder is equal and opposite to the retardance of the switchable liquid crystal retarder in its undriven state.

18. A switchable display device according to claim 1, wherein the components of the pretilt direction of the pretilts of each of the surface alignment layers are anti-parallel to each other.

19. A switchable display device according to claim 1, wherein the switchable liquid crystal retarder further comprises electrodes arranged to apply a voltage for controlling the layer of liquid crystal material.

20. A switchable display device according to claim 19, wherein the electrodes are on opposite sides of the layer of liquid crystal material.

21. A switchable display device according to claim 19, further comprising a control system arranged to control the voltage applied across the electrodes of the at least one switchable liquid crystal retarder.

22. A switchable display device according to claim 1, wherein the backlight comprises:

an array of light sources;
a directional waveguide comprising:
an input end extending in a lateral direction along a side of the directional waveguide, the light sources being disposed along the input end and arranged to input light into the waveguide; and
opposed first and second guide surfaces extending across the directional waveguide from the input end for guiding light input at the input end along the waveguide, the waveguide being arranged to deflect input light guided through the directional waveguide to exit through the first guide surface.

23. A switchable display device according to claim 22, wherein the backlight further comprises a light turning film and the directional waveguide is a collimating waveguide.

24. A switchable display device according to claim 23, wherein the collimating waveguide comprises
 (i) a plurality of elongate lenticular elements; and
 (ii) a plurality of inclined light extraction features,
 wherein the plurality of elongate lenticular elements and the plurality of inclined light extraction features are oriented to deflect input light guided through the directional waveguide to exit through the first guide surface.

* * * * *